United States Patent
Wang et al.

(10) Patent No.: US 10,672,728 B2
(45) Date of Patent: Jun. 2, 2020

(54) INTEGRATED FAN-OUT PACKAGE

(71) Applicant: Taiwan Semiconductor Manufacturing Co., Ltd., Hsinchu (TW)

(72) Inventors: Chuei-Tang Wang, Taichung (TW); Tzu-Chun Tang, Kaohsiung (TW); Chieh-Yen Chen, Taipei (TW); Che-Wei Hsu, Kaohsiung (TW)

(73) Assignee: Taiwan Semiconductor Manufacturing Co., Ltd., Hsinchu (TW)

( * ) Notice: Subject to any disclaimer, the term of this patent is extended or adjusted under 35 U.S.C. 154(b) by 6 days.

(21) Appl. No.: 16/198,857

(22) Filed: Nov. 22, 2018

(65) Prior Publication Data

US 2020/0105687 A1    Apr. 2, 2020

Related U.S. Application Data

(60) Provisional application No. 62/737,880, filed on Sep. 27, 2018.

(51) Int. Cl.
| | |
|---|---|
| *H01L 27/14* | (2006.01) |
| *H01L 31/00* | (2006.01) |
| *H01L 23/66* | (2006.01) |
| *H01L 23/538* | (2006.01) |
| *H01L 23/00* | (2006.01) |

(Continued)

(52) U.S. Cl.
CPC .......... *H01L 23/66* (2013.01); *H01L 21/4853* (2013.01); *H01L 21/4857* (2013.01); *H01L 21/565* (2013.01); *H01L 23/3107* (2013.01); *H01L 23/5383* (2013.01); *H01L 23/5386* (2013.01); *H01L 23/5389* (2013.01); *H01L 24/19* (2013.01); *H01L 24/20* (2013.01); *H01Q 1/2283* (2013.01); *H01Q 1/243* (2013.01);

(Continued)

(58) Field of Classification Search
CPC . H01L 23/66; H01L 2223/6677; H01L 24/16; H01L 23/48; H01L 23/3128; H01L 23/053; H01L 25/0657; H01L 21/4853; H01L 21/56; H01L 21/78; H01L 23/051; H01L 23/3121; H01L 23/3157; H01L 23/535; H01L 24/06; H01L 31/02016
USPC ......................................................... 257/428
See application file for complete search history.

(56) References Cited

U.S. PATENT DOCUMENTS

| | | |
|---|---|---|
| 9,000,584 B2 | 4/2015 | Lin et al. |
| 9,048,222 B2 | 6/2015 | Hung et al. |

(Continued)

*Primary Examiner* — Theresa T Doan
(74) *Attorney, Agent, or Firm* — JCIPRNET

(57) ABSTRACT

An integrated fan-out (InFO) package includes a first redistribution structure, a plurality of dies, a plurality of first conductive structures, an encapsulant, a second redistribution structure, and insulating layer, a plurality of second conductive structures, an antenna confinement structure, and a slot antenna. The dies and the first conductive structures are disposed on the first redistribution structure. The first conductive structures surround the dies. The encapsulant encapsulates the dies and the first conductive structures. The second redistribution structure is disposed on the dies, the first conductive structures, and the encapsulant. The insulating layer is over the second redistribution structure. The second conductive structures and the antenna confinement structure are embedded in the insulating layer. The slot antenna is disposed on the insulating layer.

20 Claims, 58 Drawing Sheets

(51) Int. Cl.
*H01L 21/48* (2006.01)
*H01L 21/56* (2006.01)
*H01Q 1/22* (2006.01)
*H01Q 13/10* (2006.01)
*H01Q 1/24* (2006.01)
*H01L 23/31* (2006.01)

(52) U.S. Cl.
CPC ..... *H01Q 13/10* (2013.01); *H01L 2223/6677* (2013.01); *H01L 2224/214* (2013.01)

(56) References Cited

U.S. PATENT DOCUMENTS

| | | |
|---|---|---|
| 9,048,233 B2 * | 6/2015 | Wu .................... H01L 24/11 |
| 9,064,879 B2 | 6/2015 | Hung et al. |
| 9,111,949 B2 * | 8/2015 | Yu .................... H01L 21/561 |
| 9,263,511 B2 | 2/2016 | Yu et al. |
| 9,281,254 B2 | 3/2016 | Yu et al. |
| 9,368,460 B2 | 6/2016 | Yu et al. |
| 9,372,206 B2 | 6/2016 | Wu et al. |
| 9,496,189 B2 | 11/2016 | Yu et al. |

* cited by examiner

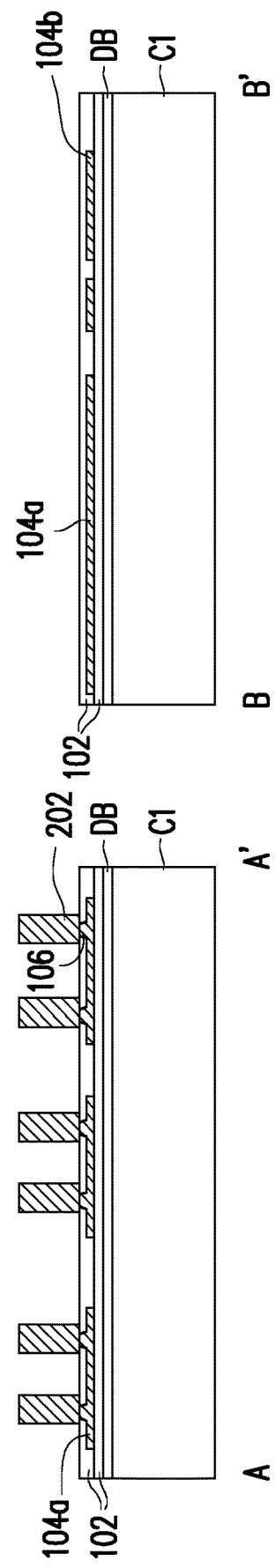

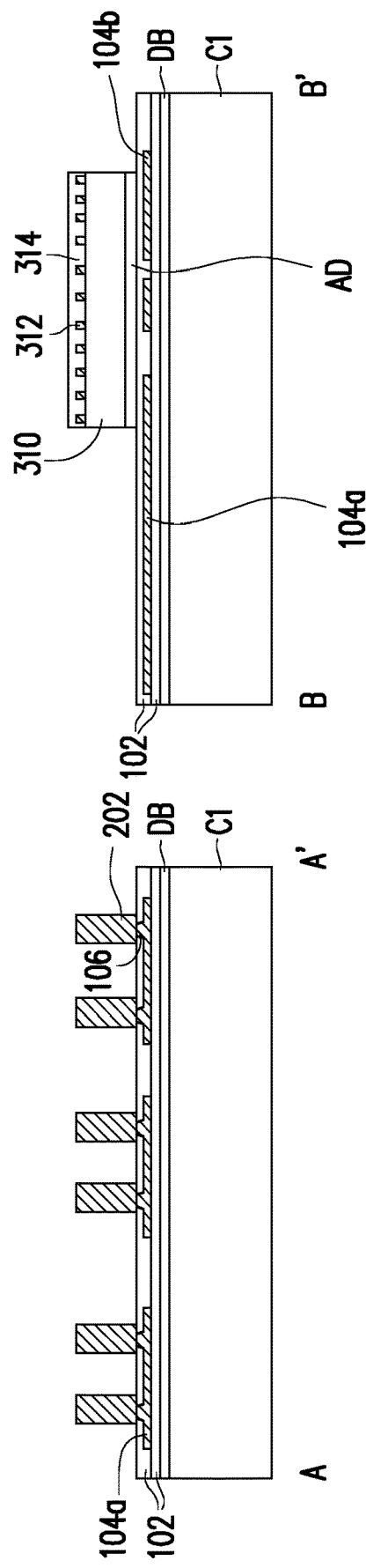

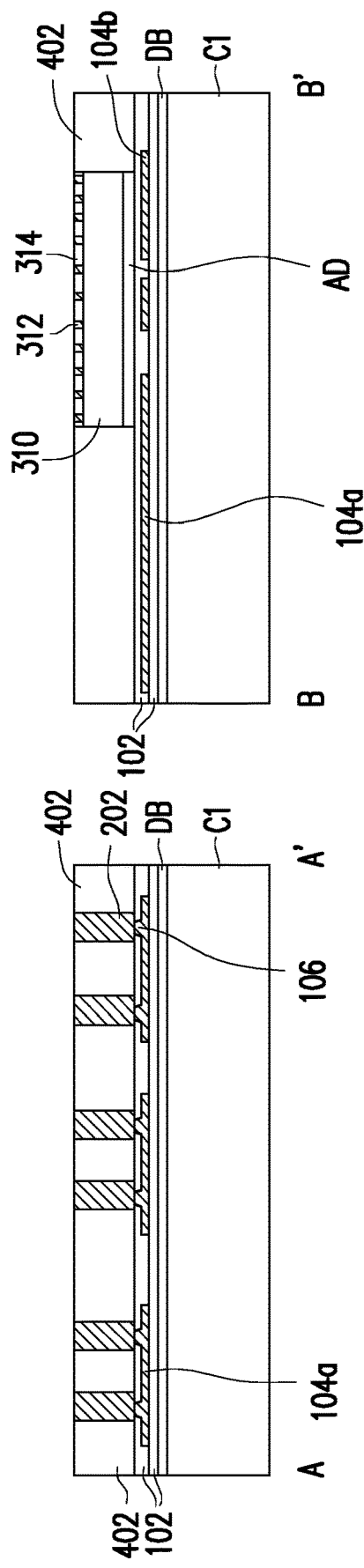

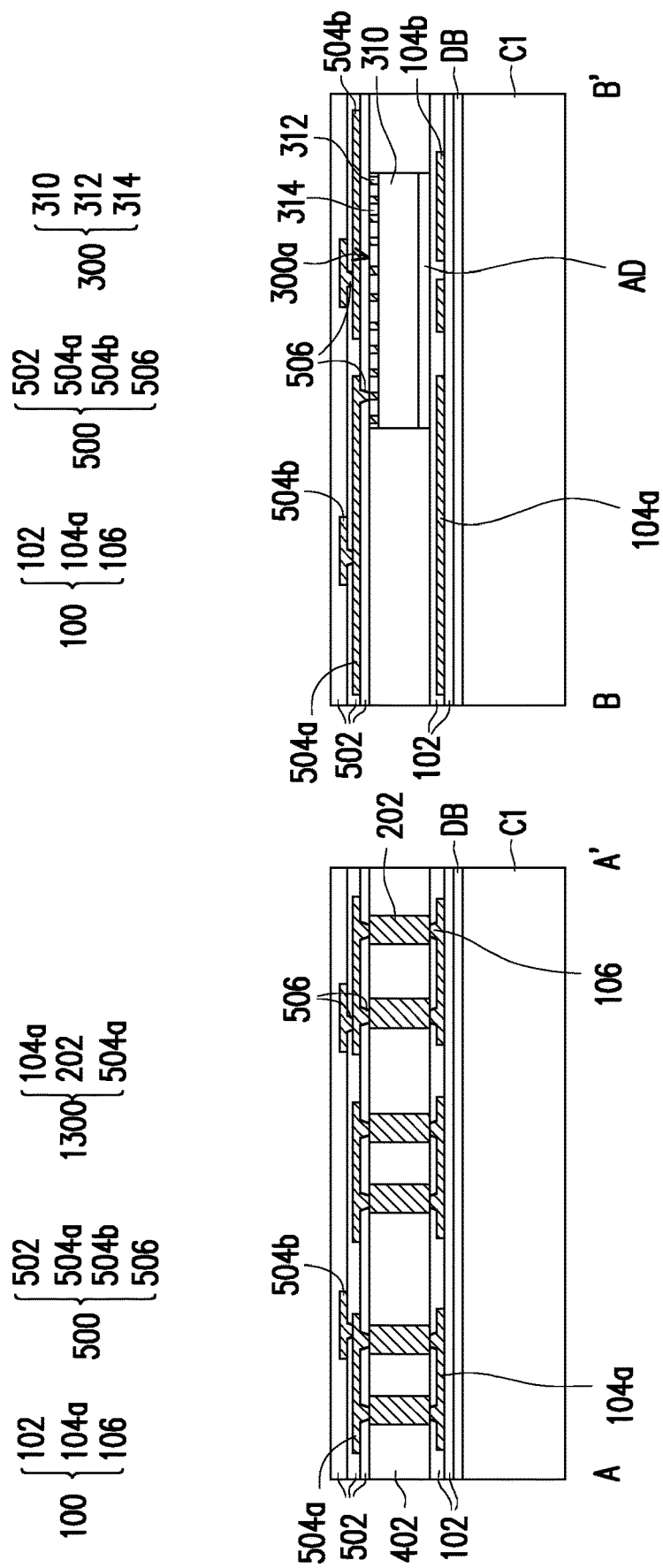

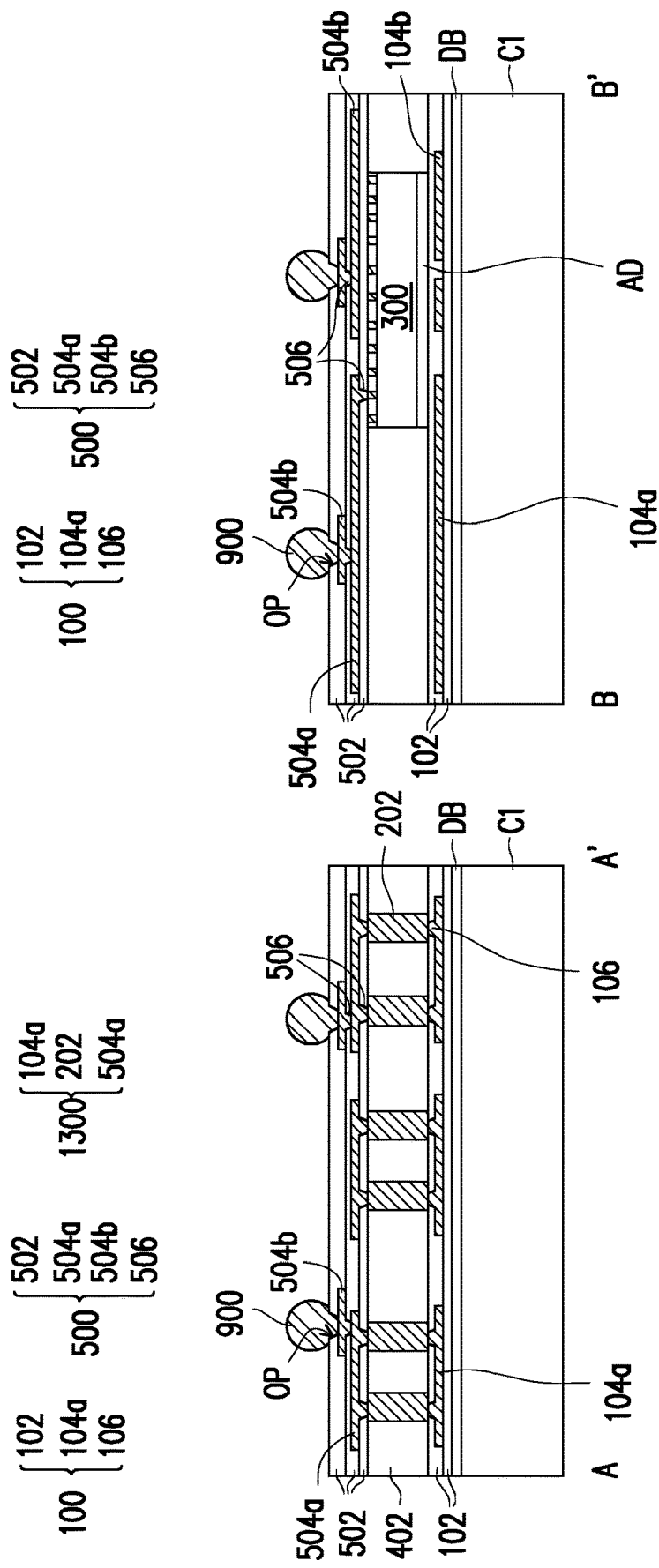

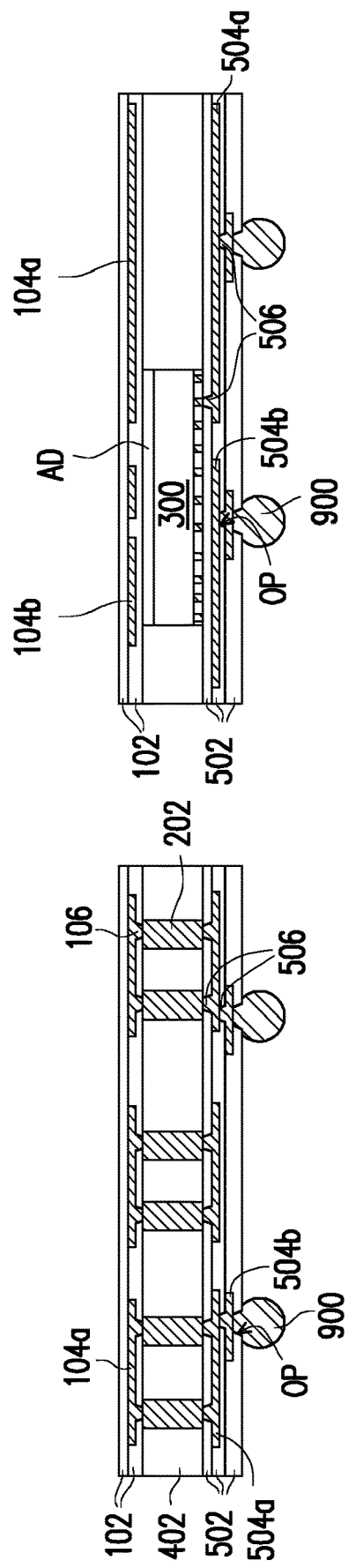

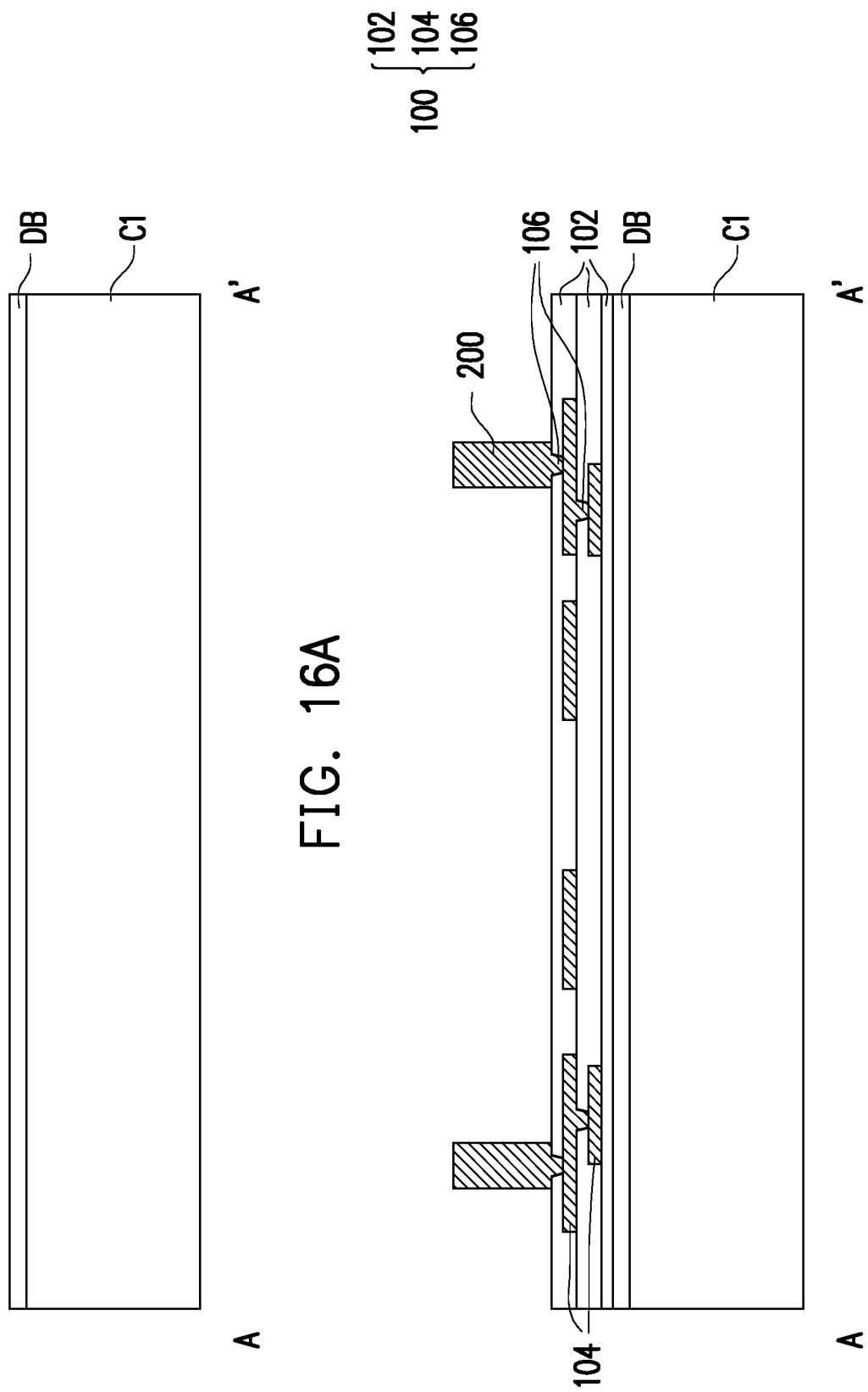

US 10,672,728 B2

INTEGRATED FAN-OUT PACKAGE

CROSS-REFERENCE TO RELATED APPLICATION

This application claims the priority benefits of U.S. provisional application Ser. No. 62/737,880, filed on Sep. 27, 2018. The entirety of the above-mentioned patent application is hereby incorporated by reference herein and made a part of this specification.

BACKGROUND

Semiconductor devices and integrated circuits used in a variety of electronic apparatus, such as cell phones and other mobile electronic equipment, are typically manufactured on a single semiconductor wafer. The dies of the wafer may be processed and packaged with other semiconductor devices (e.g. antenna) or dies at the wafer level, and various technologies have been developed for the wafer level packaging.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIG. 13A to FIG. 13G are schematic cross-sectional views illustrating a manufacturing process of the InFO package in FIG. 12 along line A-A'.

FIG. 14A to FIG. 14G are schematic cross-sectional views illustrating a manufacturing process of the InFO package in FIG. 12 along line B-B'.

FIG. 16A to FIG. 16I are schematic cross-sectional views illustrating a manufacturing process of the InFO package in FIG. 15 along line A-A'.

DETAILED DESCRIPTION

Figure 1:
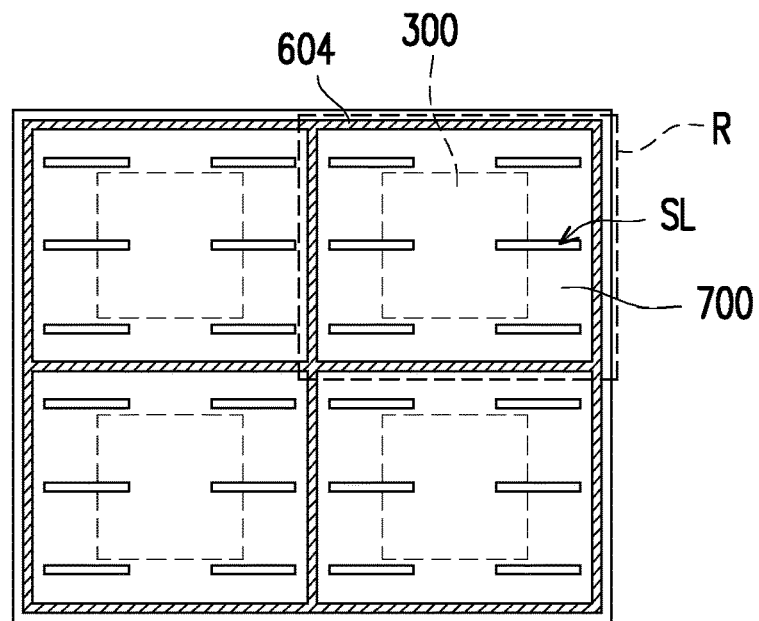
FIG. 1 is a schematic top view illustrating an integrated fan-out (InFO) package in accordance with some embodiments of the disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Other features and processes may also be included. For example, testing structures may be included to aid in the verification testing of the 3D packaging or 3DIC devices. The testing structures may include, for example, test pads formed in a redistribution layer or on a substrate that allows the testing of the 3D packaging or 3DIC, the use of probes and/or probe cards, and the like. The verification testing may be performed on intermediate structures as well as the final structure. Additionally, the structures and methods disclosed herein may be used in conjunction with testing methodologies that incorporate intermediate verification of known good dies to increase the yield and decrease costs.

Figure 2:
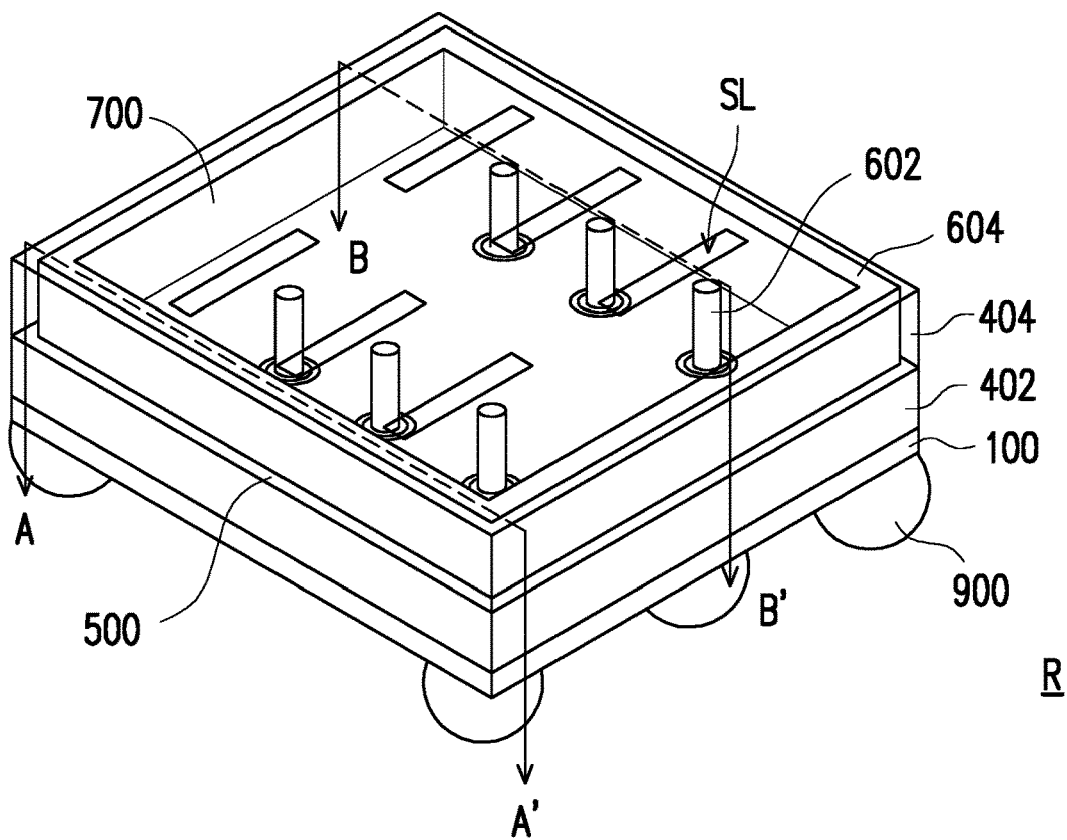
FIG. 2 is a schematic perspective view of a region in the InFO package in FIG. 1 in accordance with some embodiments of the disclosure.

FIG. 1 is a schematic top view illustrating an integrated fan-out (InFO) package 10 in accordance with some embodiments of the disclosure. FIG. 2 is a schematic perspective view of a region R in the InFO package 10 in FIG. 1 in accordance with some embodiments of the disclosure. Referring to FIG. 1 and FIG. 2, the InFO package 10 includes a redistribution structure 100, a plurality of dies 300, a plurality of first conductive structures 200 (shown in FIG. 3N), an encapsulant 404, a redistribution structure 500, an insulating layer 404, a plurality of second conductive structures 602, an antenna confinement structure 604, a slot antenna 700, and a plurality of conductive terminals 900. In some embodiments, the dies 300 and the first conductive structures 200 are disposed on the redistribution structure 100, and the first conductive structures 200 surround the dies 300. The encapsulant 402 encapsulates the dies 300 and the first conductive structures 200. The redistribution structure 500 is disposed on the die 300, the first conductive structures 200, and the encapsulant 402. The insulating layer 404 is disposed over the redistribution structure 500. The second conductive structures 602 and the antenna structure 604 are embedded in the insulating layer 404. The slot antenna 700 is disposed on the insulating layer 404. The conductive terminals 900 are disposed on the redistribution structure 100. In some embodiments, the slot antenna 700 has a plurality of slots SL. The relative configurations of these elements and the manufacturing process of the InFO package 10 will be discussed in detail below in conjunction with FIG. 3A to FIG. 3N and FIG. 4.

Figure 3A:
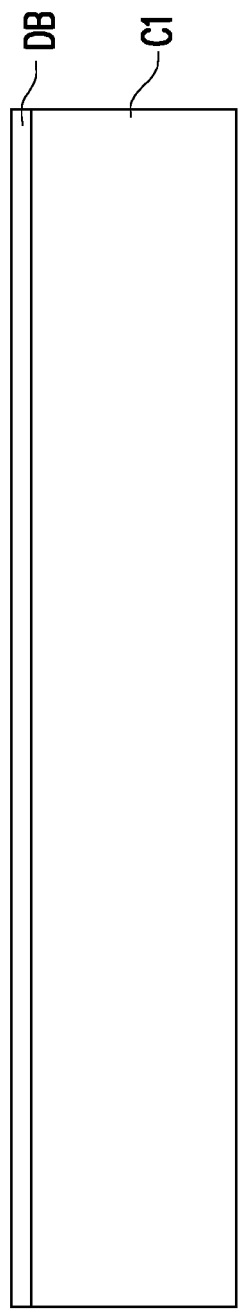
FIG. 3A to FIG. 3N are schematic cross-sectional views illustrating a manufacturing process of the region in FIG. 2 along line B-B'.
Figure 3B:
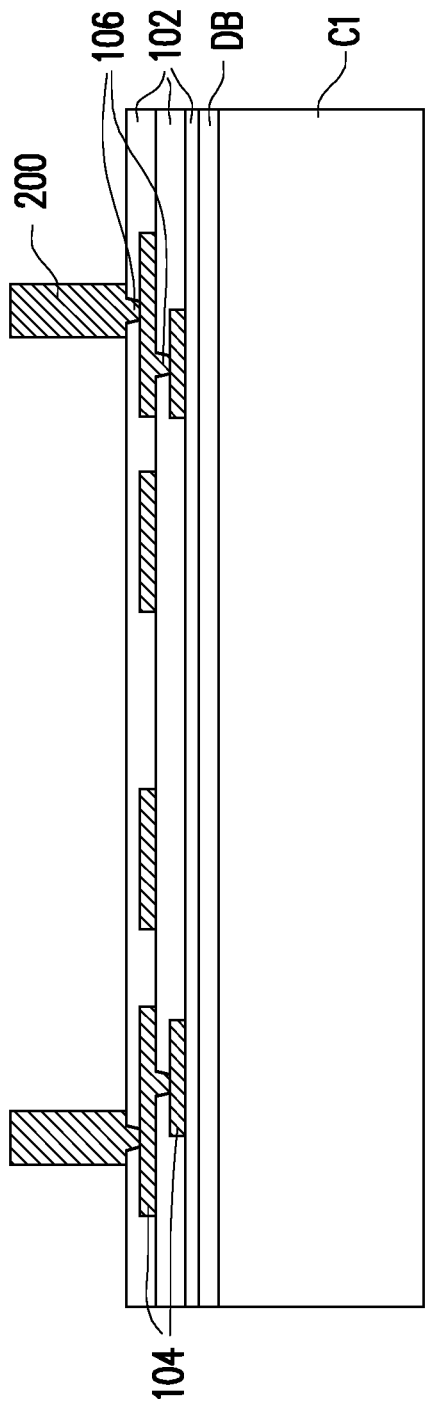
Figure 3C:
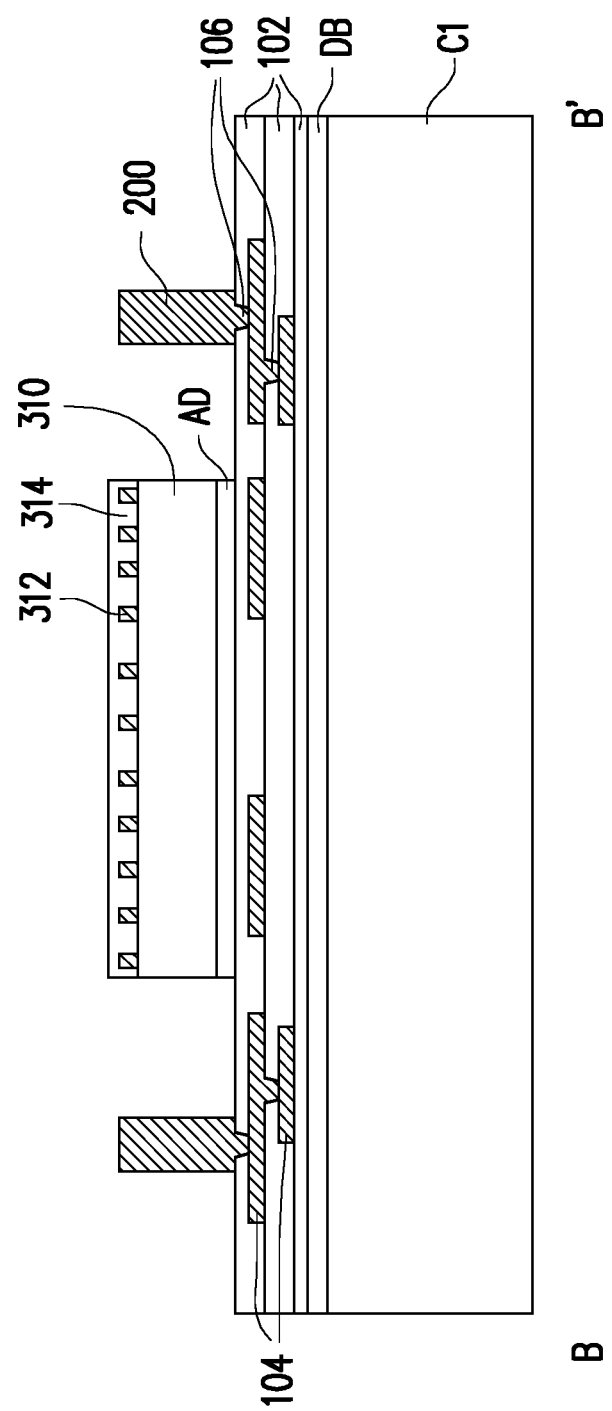
Figure 3D:
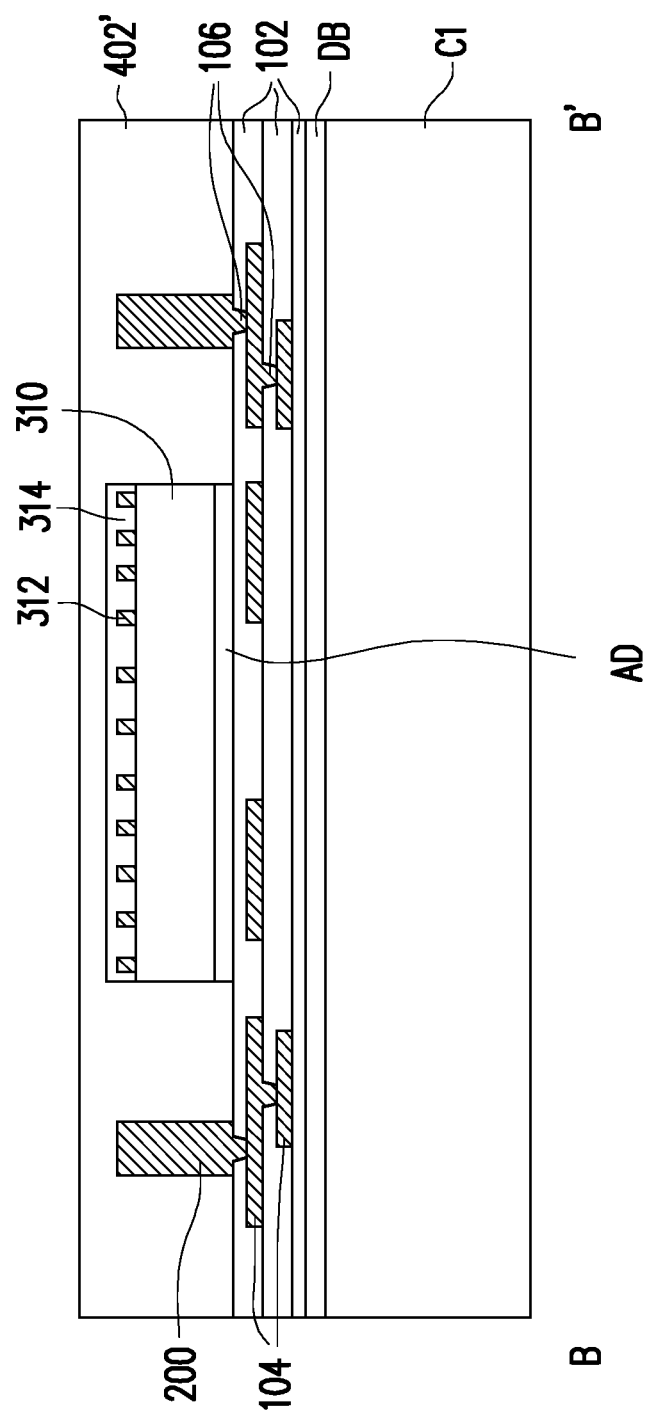
Figure 3E:
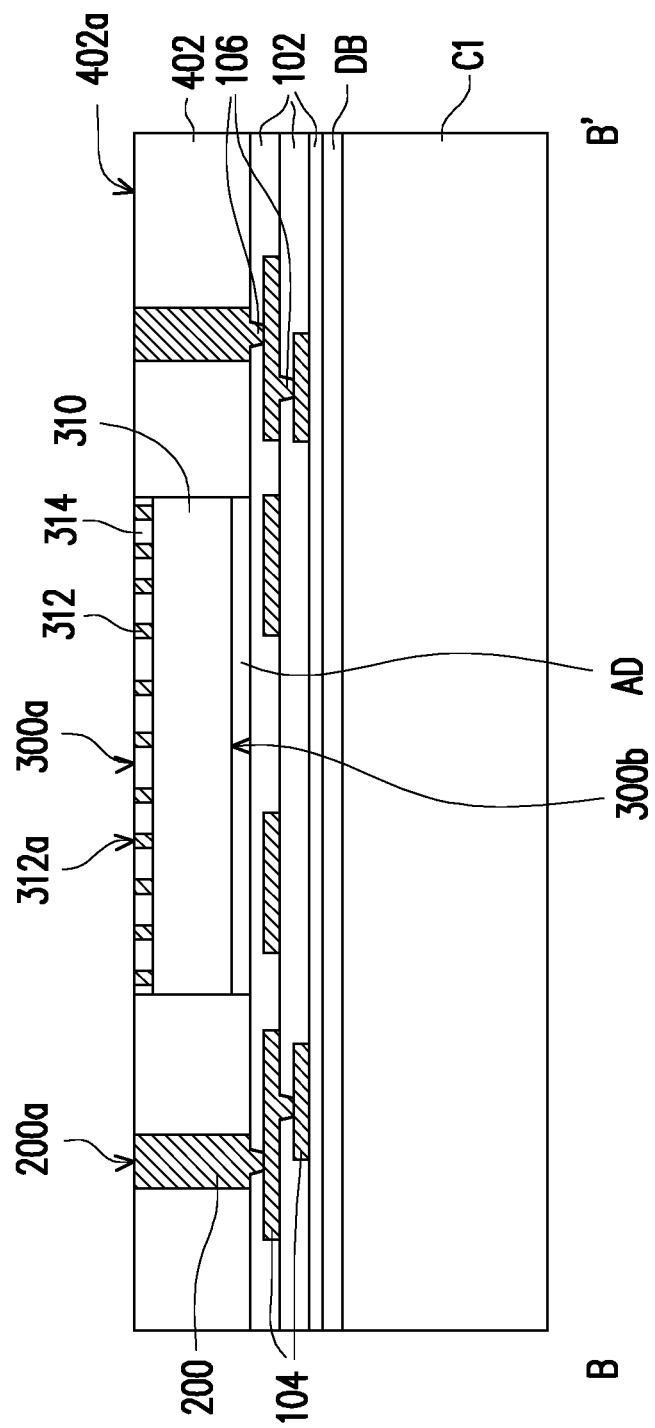
Figure 3F:
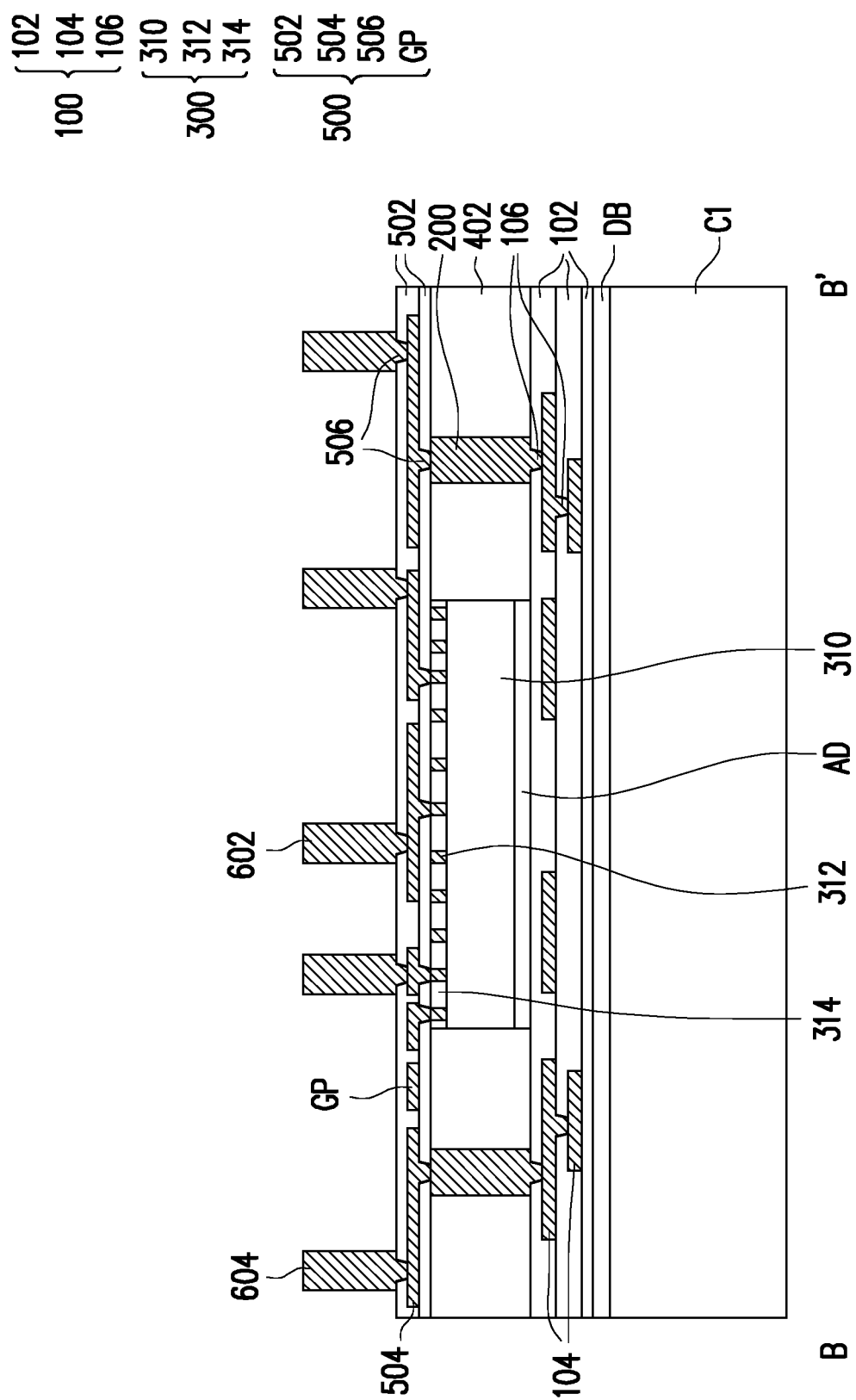
Figure 3G:
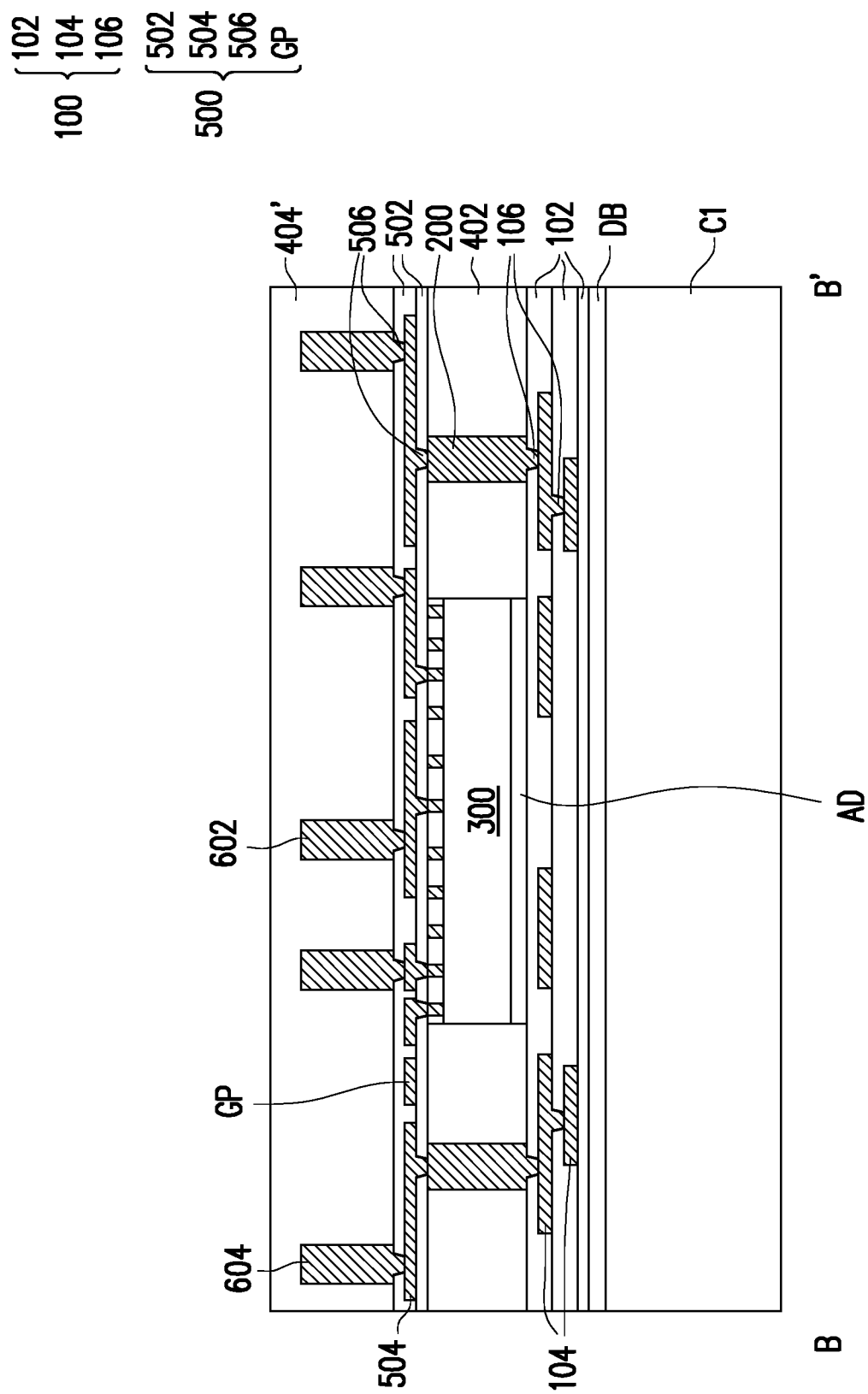
Figure 3H:
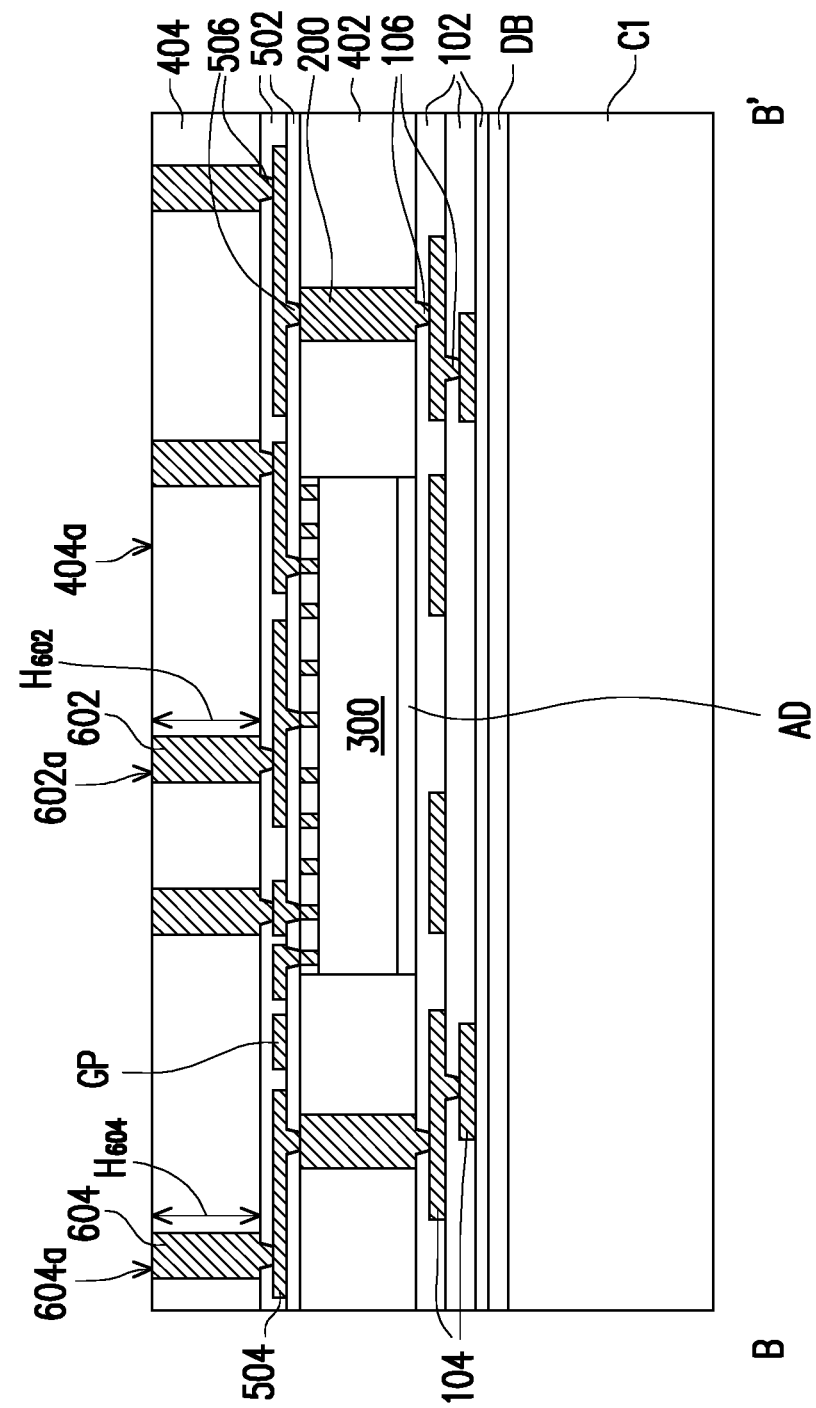
Figure 3I:
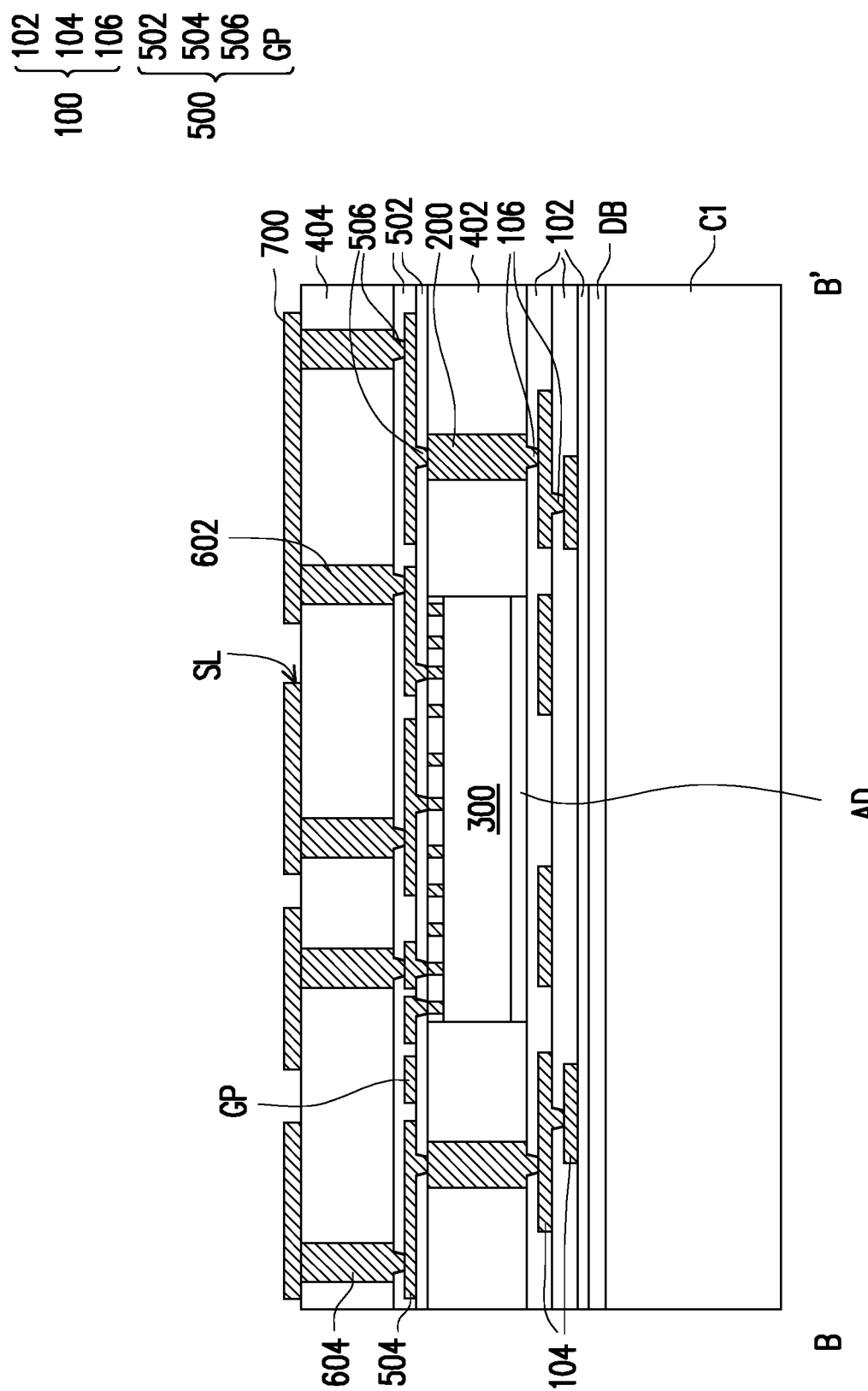
Figure 3J:
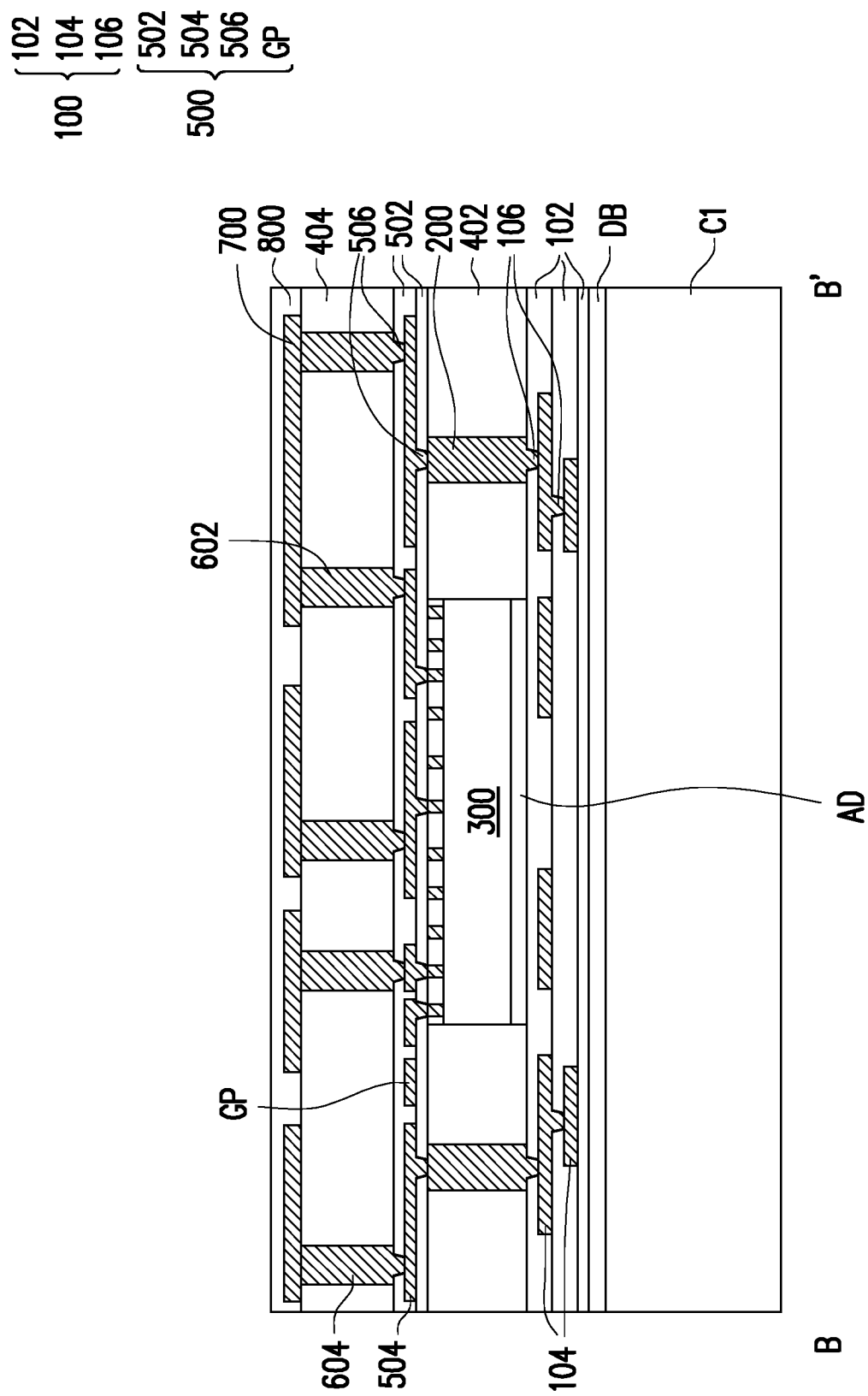
Figure 3K:
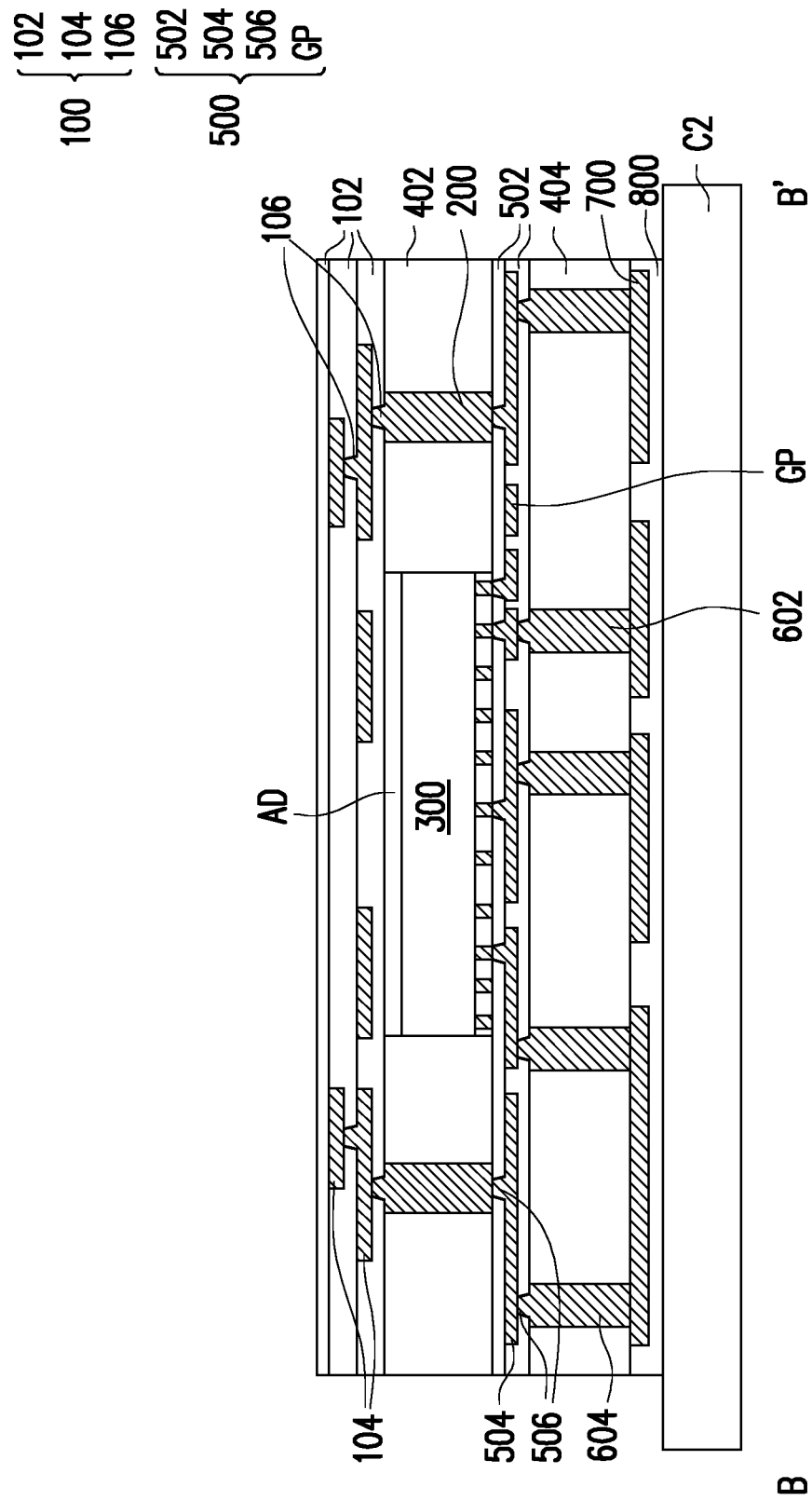
Figure 3L:
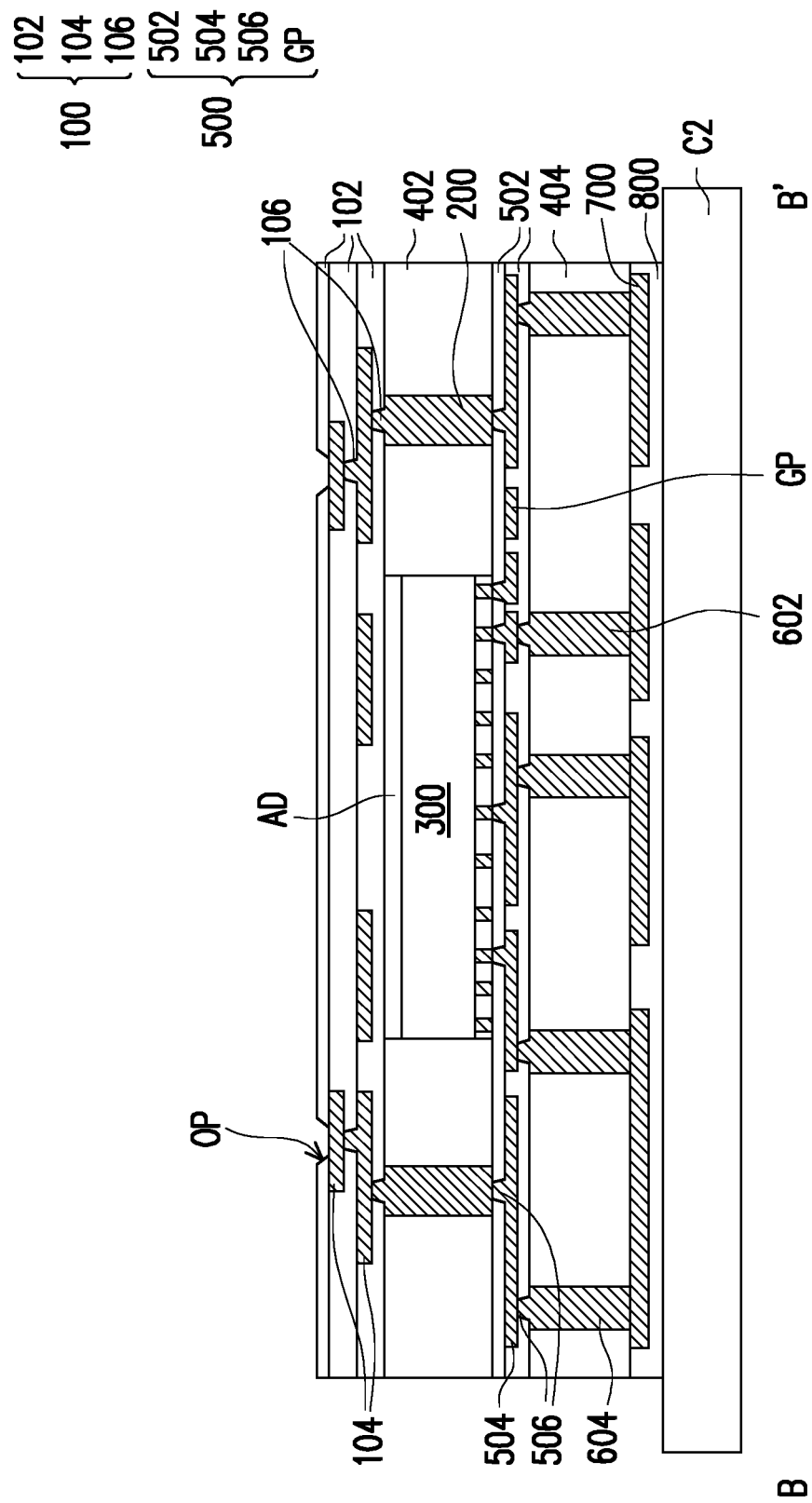
Figure 3M:
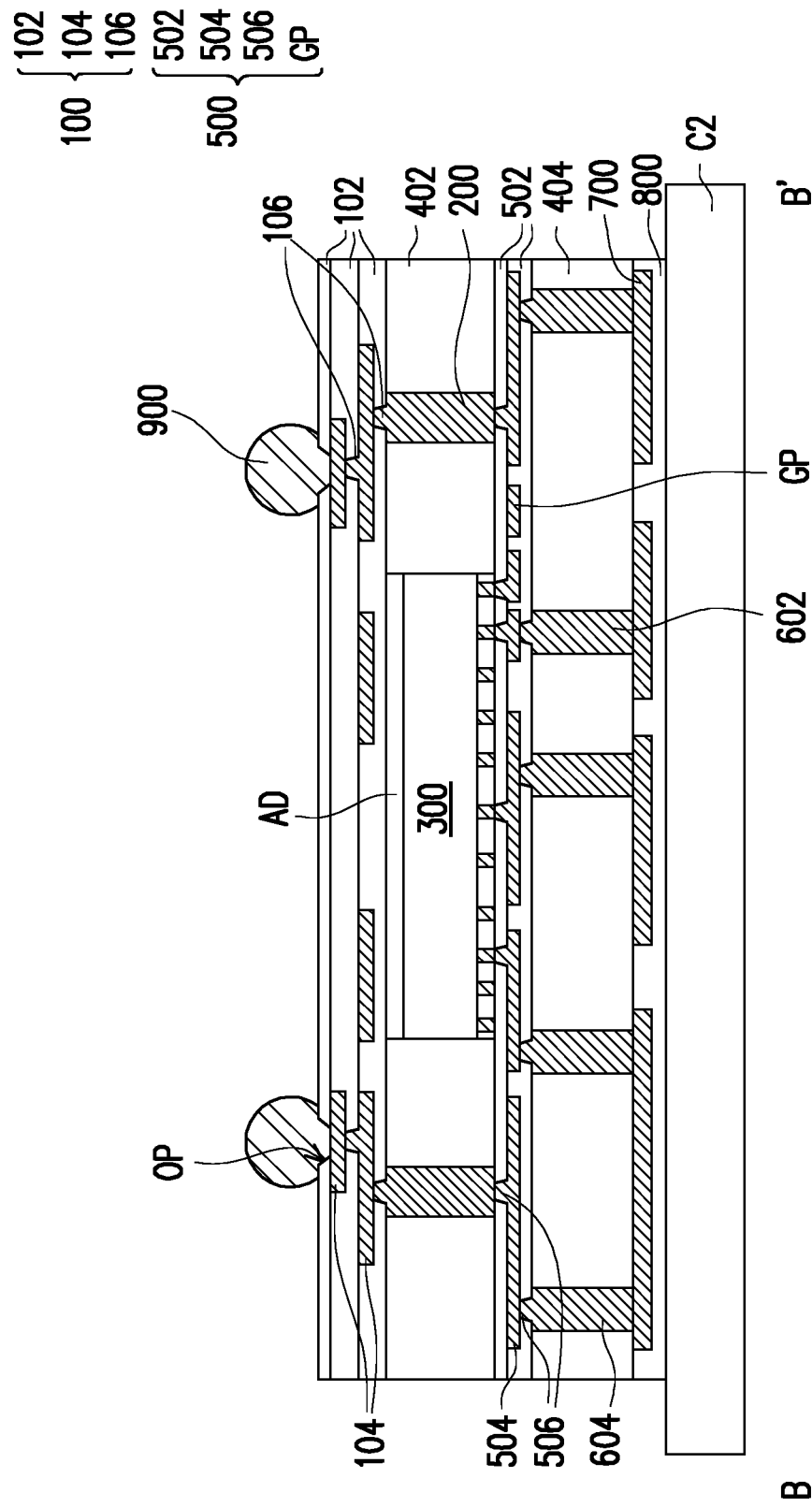
Figure 3N:
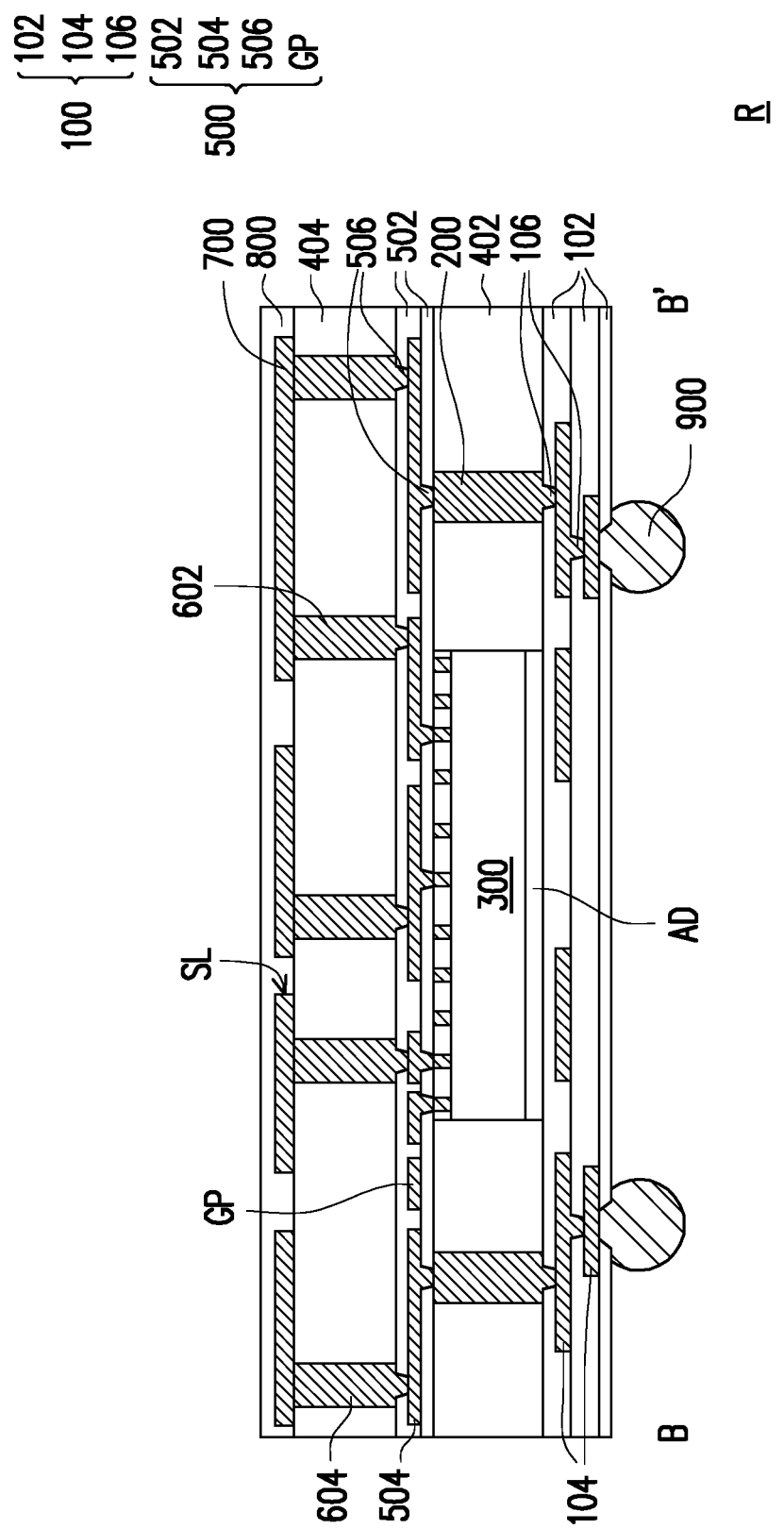
Figure 4:
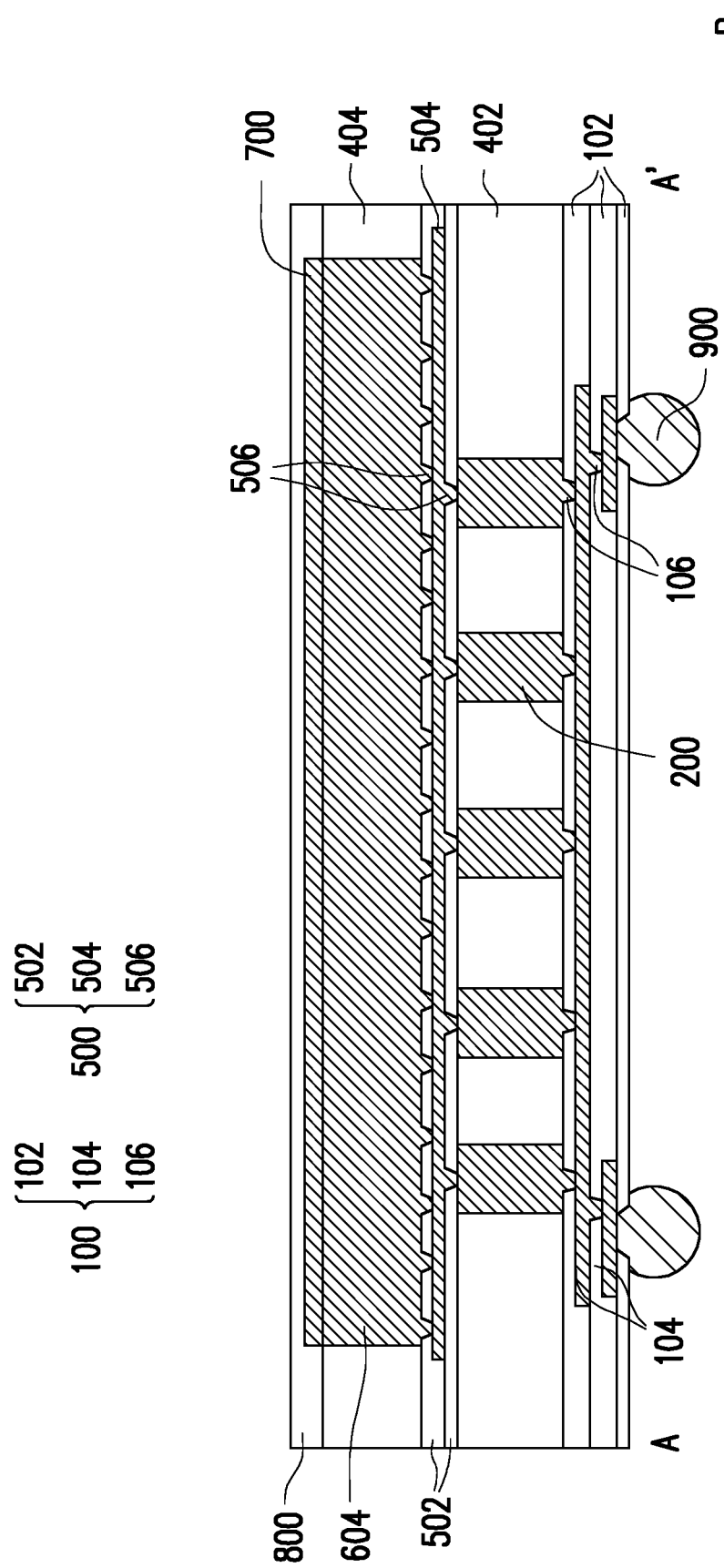
FIG. 4 is a schematic cross-sectional view of the region in FIG. 2 along line A-A'.

FIG. 3A to FIG. 3N are schematic cross-sectional views illustrating a manufacturing process of the region R in FIG. 2 along line B-B'. FIG. 4 is a schematic cross-sectional view of the region R in FIG. 2 along line A-A'. Referring to FIG. 3A, a carrier C1 having a de-bonding layer DB formed thereon is provided. In some embodiments, the carrier C1 is a glass substrate. However, other suitable materials may be adapted as a material of the carrier C1 as long as the material is able to withstand the subsequent processes while carrying the package structure formed thereon. In some embodiments, the de-bonding layer DB is a light-to-heat conversion (LTHC) release layer formed on the glass substrate. The de-bonding layer DB may allow the structure formed on the carrier C1 in the subsequent processes to be peeled off from the carrier C1.

Referring to FIG. 3B, a redistribution structure 100 and a plurality of first conductive structures 200 are formed over the de-bonding layer DB. In some embodiments, the redistribution structure 100 includes a plurality of dielectric layers 102 and a plurality of redistribution circuit patterns 104 stacked alternately. In some embodiments, the redistribution structure 100 further includes a plurality of conductive vias 106 embedded in the dielectric layers 102. In some embodiments, the redistribution circuit patterns 104 are interconnected with one another through the conductive vias 106.

The method of forming the redistribution structure 100 may include the following steps. First, the bottommost dielectric layer 102 may be formed on the de-bonding layer DB. In some embodiments, a material of the dielectric layer 102 includes polyimide, epoxy resin, acrylic resin, phenol resin, benzocyclobutene (BCB), polybenzooxazole (PBO), or any other suitable polymer-based dielectric material. The dielectric layer 102, for example, may be formed by suitable fabrication techniques such as spin-on coating, chemical vapor deposition (CVD), plasma-enhanced chemical vapor deposition (PECVD), or the like. Thereafter, a seed material layer (not shown) is blanketly formed over the bottommost dielectric layer 102. In some embodiments, the seed material layer includes a titanium/copper composite layer and is formed by a sputtering process. Then, a mask pattern (not shown) having openings is formed on the seed material layer. The openings of the mask pattern expose the intended location for the subsequently formed redistribution circuit patterns 104. Afterwards, a plating process is performed to form a conductive material layer on the seed material layer exposed by the openings of the mask pattern. In some embodiments, a material of the conductive material layer includes aluminum, titanium, copper, nickel, tungsten, and/or alloys thereof. The mask pattern and the underlying seed material layer are then removed by a stripping process and an etching process. The remaining seed material layer and the remaining conductive material layer then constitute the bottommost redistribution circuit patterns 104. After forming the bottommost dielectric layer 102 and the bottommost redistribution circuit patterns 104, another dielectric layer 102 may be formed over the bottommost dielectric layer 102 and the bottommost redistribution circuit patterns 104. Subsequently, a plurality of contact openings may be formed in such dielectric layer 102 to expose the bottommost redistribution circuit patterns 104. Then, the step of forming the seed material layer and the conductive material layer presented above may be repeated to render the redistribution circuit patterns 104 and the conductive vias 106 located above the bottommost redistribution circuit patterns 104. The foregoing step then may be repeated several times to obtain the redistribution structure 100 having multiple layers.

It should be noted that although two layers of the redistribution circuit patterns 104 and three layers of the dielectric layers 102 are illustrated in FIG. 3B, the number of these layers is not limited in this disclosure. In some alternative embodiments, the redistribution structure 100 may be constituted by more or less layers of the dielectric layer 102 and the redistribution circuit patterns 104 depending on the circuit design.

The first conductive structures 200 are formed over the redistribution structure 100. In some embodiments, the first conductive structures 200 are electrically connected to the redistribution structure 100. In some embodiments, the first conductive structures 200 may be formed simultaneously with the topmost conductive vias 106 during the same stage. For example, the topmost dielectric layer 102 of the redistribution structure 100 may be patterned to form a plurality of contact openings exposing at least a portion of the topmost redistribution circuit patterns 104. Subsequently, a seed material layer (not shown) is formed over the topmost dielectric layer 102 and over the topmost redistribution circuit pattern 104 exposed by the contact openings. In some embodiments, the seed material layer includes a titanium/copper composite layer and is formed by a sputtering process. Thereafter, a mask pattern (not shown) with openings is formed on the seed material layer. The openings of the mask pattern expose the intended locations for the subsequently formed first conductive structures 200. Afterwards, a plating process is performed to form a metal material layer (e.g., a copper layer) on the seed material layer exposed by the openings of the mask pattern. The mask pattern and the underlying seed material layer are then removed to form the first conductive structures 200 and the topmost conductive vias 106. However, the disclosure is not limited thereto. In some alternative embodiments, other suitable methods may be utilized to form the first conductive structures 200 and the topmost conductive vias 106. For example, pre-fabricated first conductive structures 200 may be picked and placed onto the redistribution structure 100 such that the first conductive structures 200 and the topmost conductive vias 106 are formed separately.

Referring to FIG. 3C, a die 300 is picked and placed onto the redistribution structure 100. The die 300 is placed such that the first conductive structures 200 surround the die 300. In some embodiments, the die 300 includes a semiconductor substrate 310, a plurality of conductive posts 312, and a protection layer 314. The semiconductor substrate 310 may be a silicon substrate including active components (e.g., transistors or the like) and passive components (e.g., resistors, capacitors, inductors, or the like) formed therein. In some embodiments, the die 300 may further include a plurality of conductive pads (not shown) and a passivation layer (not shown). The conductive pads are located on the semiconductor substrate 310. The passivation layer may partially cover the conductive pads. The conductive pads may be aluminum pads, copper pads, or other suitable metal pads. The passivation layer may be a silicon oxide layer, a silicon nitride layer, a silicon oxy-nitride layer, or a dielectric layer formed by other suitable dielectric materials. The conducive posts 312 may be formed on the exposed conductive pads such that the conductive posts 312 are electrically connected to the conductive pads. In some embodiments, the conductive posts 312 are made of conductive materials and are plated on the conductive pads. For example, a material of conductive posts 312 may include copper, copper alloys, or the like. The protection layer 314 covers the conductive posts 312. For example, the conductive posts 312 may be well protected and not revealed by the protection layer 314. In some embodiments, the protection layer 314 may be formed by dielectric materials. For example, the protection layer 314 may be a polyimide layer, a PBO layer, or a dielectric layer formed by other suitable polymers.

In some embodiments, the die 300 is attached (or adhered) on the redistribution structure 100 through an adhesive layer AD. In some embodiments, the adhesive layer AD may include a die attach film (DAF) or other materials having adhesion property. Although FIG. 3B and FIG. 3C illustrated that the first conductive structures 200 are formed prior to the placement of the die 300, the disclosure is not limited thereto. In some alternative embodiments, the die 300 may be placed before the first conductive structures 200 are formed on the redistribution structure 100.

Referring to FIG. 3D, an encapsulation material 402' is formed over the redistribution structure 100 to encapsulate the first conductive structures 200 and the die 300. For example, the first conductive structures 200 and the protection layer 314 of the die 300 are encapsulated by the encapsulation material 402'. In other words, the first conductive structures 200 and the protection layer 314 of the die 300 are not revealed and are well protected by the encapsulation material 402'. In some embodiments, the encapsulation material 402' is a molding compound, a molding underfill, a resin (such as epoxy), or the like. In some embodiments, the encapsulation material 402' may include fillers. In some embodiments, the encapsulation material 402' may be formed by a molding process. For example, the encapsulation material 402' may be formed by a compression molding process.

Referring to FIG. 3D and FIG. 3E, the encapsulation material 402' and the protection layer 314 of the die 300 are grinded until top surfaces 312a of the conductive posts 312 and top surfaces 200a of the first conductive structure 200 are exposed. After the encapsulation material 402' is grinded, an encapsulant 402 is formed over the redistribution structure 100 to encapsulate the first conductive structures 200 and the die 300. In some embodiments, the encapsulation material 402' is grinded by a mechanical grinding process and/or a chemical mechanical polishing (CMP) process. In some embodiments, during the grinding process of the encapsulation material 402', the protection layer 314 is grinded to reveal the conductive posts 312. In some embodiments, portions of the conductive posts 312 and portions of the first conductive structures 200 are slightly grinded as well. After grinding, the die 300 has an active surface 300a and a rear surface 300b opposite to the active surface 300a. The exposed portion of the conductive posts 312 is located on the active surface 300a of the die 300. The encapsulant 402 encapsulates sidewalls of the die 300. In some embodiments, the encapsulant 402 is penetrated by the first conductive structures 200. In other words, the die 300 and the first conductive structures 200 are embedded in the encapsulant 402. In some embodiments, the top surfaces 200a of the first conductive structures 200 and the top surfaces 312a of the conductive posts 312 are substantially coplanar with a top surface 402a of the encapsulant 402. It is noted that since the redistribution structure 100 is located on the rear surface 300b of the die 300, the redistribution structure 100 may be referred to as a backside redistribution structure.

Referring to FIG. 3F, a redistribution structure 500, a plurality of second conductive structures 602, and an antenna confinement structure 604 are formed on the first conductive structures 200, the die 300, and the encapsulant 402. The redistribution structure 500 is disposed on the active surface 300a of the die 300. In some embodiments, the redistribution structure 500 is electrically connected to the conductive posts 312 of the die 300 and the first conductive structures 200. It is noted that since the redistribution structure 500 is located on the active surface 300a of the die 300, the redistribution structure 500 may be referred to as a front-side redistribution structure. In some embodiments, the redistribution structure 500 includes a plurality of dielectric layers 502, a plurality of redistribution circuit patterns 504, a ground plane GP, and a plurality of conductive vias 506. In some embodiments, the dielectric layers 502 and the redistribution circuit patterns 504 are stacked alternately. On the other hand, the conductive vias 506 are embedded in the dielectric layer 502. In some embodiments, the redistribution circuit patterns 504 are interconnected with one another through the conductive vias 506. In some embodiments, the ground plane GP is sandwiched between two adjacent dielectric layers 502. That is, the ground plane GP may be considered as being embedded in the dielectric layers 502.

The method of forming the redistribution structure 500 may include the following steps. First, the bottommost dielectric layer 502 may be formed on the first conductive structures 200, the die 300, and the encapsulant 402. In some embodiments, a material of the dielectric layer 502 includes polyimide, epoxy resin, acrylic resin, phenol resin, BCB, PBO, or any other suitable polymer-based dielectric material. The dielectric layer 502, for example, may be formed by suitable fabrication techniques such as spin-on coating, CVD, PECVD, or the like. Thereafter, a plurality of contact openings may be formed in the bottommost dielectric layer 502. The contact openings at least partially exposes each conductive post 312 of the die 300 and each first conductive structure 200. Then, a seed material layer (not shown) is formed over the bottommost dielectric layer 502 and in the contact openings. The seed material layer extends into the contact openings to be in contact with the conductive posts 312 and the first conductive structures 200. In some embodiments, the seed material layer includes a titanium/copper composite layer and is formed by a sputtering process. Then, a mask pattern (not shown) having openings is formed on the seed material layer. The openings of the mask pattern expose the intended location for the subsequently formed redistribution circuit patterns 504 and ground plane GP. For example, the openings of the mask pattern may expose the seed material layer located inside of the contact openings and the seed material layer in proximity of the contact openings. Afterwards, a plating process is performed to form a conductive material layer on the seed material layer exposed by the openings of the mask pattern. In some embodiments, a material of the conductive material layer includes aluminum, titanium, copper, nickel, tungsten, and/or alloys thereof. The mask pattern and the underlying seed material layer are then removed by a stripping process and an etching process. The remaining seed material layer and the remaining conductive material layer then constitute the bottommost conductive vias 506, the bottommost redistribution circuit patterns 504, and the ground plane GP. In other words, the ground plane GP and the redistribution circuit patterns 504 may be formed by a same photolithography and etching process at the same time. The foregoing step may be repeated several times to obtain the redistribution structure 500 having multiple layers.

In some embodiments, the ground plane GP is electrically connected to a ground. On the other hand, at least some of the redistribution circuit patterns 504 may be electrically connected to other subsequently formed conductive elements for signal transmission. In some embodiments, these redistribution circuit patterns 504 may be electrically connected to the conductive posts 312 of the die 300 to constitute a portion of a feed line.

It should be noted that although one layer of the redistribution circuit patterns 504 and two layers of the dielectric layers 502 are illustrated in FIG. 3F, the number of these layers is not limited in this disclosure. In some alternative embodiments, the redistribution structure 500 may be constituted by more layers of the dielectric layer 502 and the redistribution circuit patterns 504 depending on the circuit design.

The second conductive structures 602 and the antenna confinement structure 604 are formed over the redistribution structure 500. In some embodiments, the second conductive structures 602 are electrically connected to the redistribution structure 500. In some embodiments, the second conductive structures 602 and the antenna confinement structure 604 may be formed at the same time during the same step. In some embodiments, the second conductive structures 602 and the antenna confinement structure 604 may be formed simultaneously with the topmost conductive vias 506 during the same stage. In some embodiments, the method of forming the second conductive structures 602 and the antenna confinement structure 604 may be similar to that of the first conductive structures 200, so the detailed descriptions thereof are omitted herein. In some embodiments, the second conductive structures 602 and the antenna confinement structure 604 are made of copper, copper alloys, or the like.

Referring to FIG. 3G, an insulating material 404' is formed over the redistribution structure 500 to encapsulate the second conductive structures 602 and the antenna confinement structure 604. In other words, the second conductive structures 602 and the antenna confinement structure 604 are not revealed and are well protected by the insulating material 404'. In some embodiments, a material of the insulating material 404' has a low dissipation factor (Df) and/or a low permittivity (Dk). Depending on the frequency range of high-speed applications, suitable insulating material 404' may be selected based on the required electrical properties of the subsequently formed InFO package 10. For example, the insulating material 404' may include polymer, epoxy, the like, or a combination thereof. The insulating material 404' is formed by a suitable fabrication technique, such as spin-coating, lamination, deposition, molding, or the like. For example, as illustrated in FIG. 3G, the insulating material 404' is formed on the redistribution structure 500 through an over-molding process.

Referring to FIG. 3G and FIG. 3H, the insulating material 404' is planarized until top surfaces 602a of the second conductive structures 602 and a top surface 604a of the antenna confinement structure 604 are exposed. After the insulating material 404' is planarized, an insulating layer 404 is formed over the redistribution structure 500 to encapsulate the second conductive structures 602 and the antenna confinement structure 604. That is, the second conductive structures 602 and the antenna confinement structure 604 are embedded in the insulating layer 404. In some embodiments, the second conductive structures 602 and the antenna confinement structure 604 penetrate through the insulating layer 404.

In some embodiments, the insulating material 404' is planarized through a grinding process. The grinding process includes, for example, a mechanical grinding process and/or a chemical mechanical polishing (CMP) process. In some alternative embodiments, the insulating material 404' may be planarized through a fly cutting process. In some embodiments, during the planarization process of the insulating material 404', portions of the second conductive structures 602 and portions of the antenna confinement structure 604 are slightly grinded as well. In some embodiments, after the planarization process, the second conductive structures 602 and the antenna confinement structure 604 have substantially the same height. For example, a height H602 of the second conductive structures 602 and a height H604 of the antenna confinement structure 604 may range between 30 μm and 50 μm. In some embodiments, the top surfaces 602a of the second conductive structures 602 and the top surface 604a of the antenna confinement structure 604 are substantially coplanar with a top surface 404a of the insulating layer 404.

As mentioned above, the insulating layer 404 may adapt low Df and/or Dk material for reducing the signal transmission loss. Therefore, in some embodiments, the material of the insulating layer 404 may be different from the material of the dielectric layers 502 in the redistribution structure 500. However, the disclosure is not limited thereto. In some alternative embodiments which will be discussed later, the material of the insulating layer 404 may be the same as the material of the dielectric layers 502 in the redistribution structure 500.

Referring to FIG. 3I, a slot antenna 700 is formed on the insulating layer 404, the second conductive structures 602, and the antenna confinement structure 604. In some embodiments, the slot antenna 700 may be electrically connected to the second conductive structures 602 and the antenna confinement structure 604. In other words, the signals originated from the die 300 may be transmitted to the slot antenna 700 sequentially through the conductive vias 506, the redistribution circuit patterns 504, and the second conductive structures 602. Therefore, the redistribution circuit patterns 504 connecting to the die 300 and the second conductive structures 602 may be collectively referred to as a feed line. In some embodiments, the slot antenna 700 may include a plurality of slots SL arranged in an array (shown in FIG. 1 and FIG. 2). In some embodiments, the slot antenna 700 may be formed by a conductive material. For example, the material of the slot antenna 700 may include aluminum, titanium, copper, nickel, tungsten, and/or alloys thereof. In some embodiments, the slot antenna 700 is formed by the following steps. First, a metallization layer (not shown) is formed over the insulating layer 404 through electroplating or deposition. Then, the metallization layer is patterned by photolithography and etching processes to render the slot antenna 700 having the slots SL.

Referring to FIG. 3J, a protection layer 800 is formed on the insulating layer 404 to cover the slot antenna 700. In other words, the slot antenna 700 is embedded in the protection layer 800. In some embodiments, the protection layer 800 may be selected from low Df and/or Dk materials to ensure the signal transmission quality. For example, the material of the protection layer 800 may include polymer, epoxy, the like, or a combination thereof. In some embodiments, the material of the protection layer 800 may be identical to the insulating layer 404. However, the disclosure is not limited thereto. In some alternative embodiments, the material of the protection layer 800 may be different from the insulating layer 404. It is noted that the formation of the protection layer 800 is optional. That is, in some alternative embodiments, the step illustrated in FIG. 3J may be skipped in the manufacturing process of the InFO package 10.

Referring to FIG. 3J and FIG. 3K, the structure illustrated in FIG. 3J is flipped upside down and is placed on a carrier C2. The de-bonding layer DB and the carrier C1 are removed from the redistribution structure 100. In some embodiments, the de-bonding layer DB (e.g., the LTHC release layer) may be irradiated by an UV laser such that the carrier C1 and the de-bonding layer DB may be peeled off from the dielectric layer 102 of the redistribution structure 100. However, the de-bonding process is not limited thereto. Other suitable de-carrier methods may be used in some alternative embodiments.

Referring to FIG. 3L, a plurality of openings OP is formed in the outermost dielectric layer 102 of the redistribution structure 100. In some embodiments, the openings OP are formed by a laser drilling process, a mechanical drilling process, a photolithography process and an etching process, or other suitable processes. As illustrated in FIG. 3L, the openings OP expose the outermost redistribution circuit patterns 104 of the redistribution structure 100.

Referring to FIG. 3M, a plurality of conductive terminals 900 is formed over the redistribution structure 100 opposite to the die 300. In some embodiments, the conductive terminals 900 extend into the openings OP to electrically connect with the outermost redistribution circuit pattern 104. In some embodiments, a plurality of under bump metallization (UBM) patterns (not shown) may be formed on the outermost dielectric layer 102 and in the openings OP. The conductive terminals 900 may be disposed over the UBM patterns. In some embodiments, the conductive terminals 900 are attached to the UBM patterns through a solder flux. In some embodiments, the conductive terminals 900 are, for example, solder balls. In some embodiments, the conductive terminals 900 may be disposed on the redistribution structure 100 through a ball placement process and/or a reflowing process.

Referring to FIG. 3M and FIG. 3N, the structure illustrated in FIG. 3M is flipped upside down and the carrier C2 is removed. At this stage, the manufacturing process of the InFO package 10 is substantially completed. It is noted that other regions of the InFO package 10 shown in FIG. 1 may be manufactured by adapting similar processes as that of the region R, so the detailed descriptions thereof are omitted herein. Although FIG. 3N illustrated that the die 300 faces upward to be electrically connected with the redistribution structure 500, the disclosure is not limited thereto. In some alternative embodiments, the die 300 may be arranged to face downward. Under this scenario, the die 300 is electrically connected to the redistribution structure 100. In other words, the signals originated from the die 300 may be transmitted to the slot antenna 700 through the redistribution circuit patterns 104 of the redistribution structure 100, the conductive vias 106 of the redistribution structure 100, the first conductive structures 100, the conductive vias 506 of the redistribution structure 500, the redistribution circuit patterns 504 of the redistribution structure 500, and the second conductive structures 602.

As illustrated in FIG. 3N, the slot antenna 700 is being integrated at the package level rather than the chip level. As such, ultra-large size array configuration for terahertz (THz) operation (for example, at a frequency range of 0.3 to 3 THz) may be realized. Moreover, a narrower radiation beam width may be achieved, which is advantageous for beam steering. Furthermore, the issue in which the signal radiation is absorbed by the silicon substrate of the chip seen in chip level integration may be sufficiently resolved, thereby reducing the signal loss and enhancing the device performance.

Referring to FIG. 1, FIG. 2, and FIG. 4, the antenna confinement structure 604 is shown as a ring structure surrounding the second conductive structure 602. In other words, the antenna confinement structure 604 may be a continuous structure forming an enclosure together with the slot antenna 700 and the redistribution structure 500. The enclosure may be a resonant cavity which is able to sufficiently enhance the signal gain of the slot antenna 700. As such, the device performance of the InFO package 10 may be enhanced.

Figure 5A:
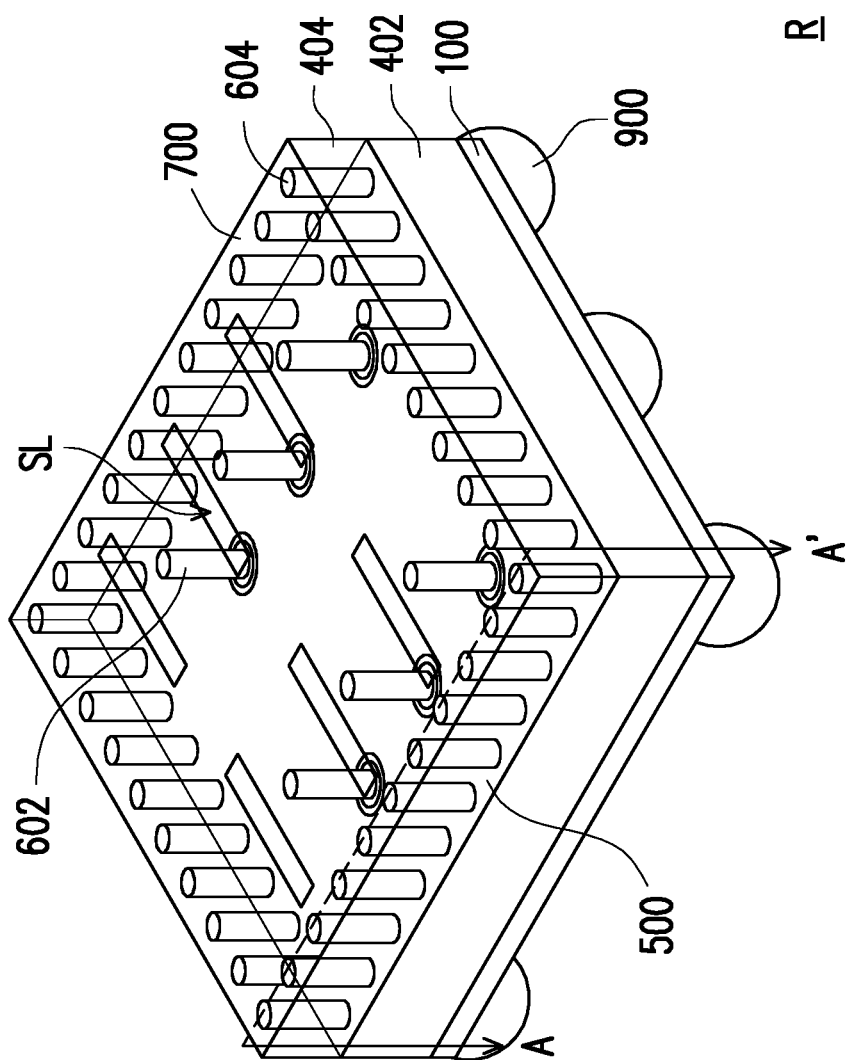
FIG. 5A is a schematic perspective view of a region in the InFO package in FIG. 1 in accordance with some alternative embodiments of the disclosure.
Figure 5B:
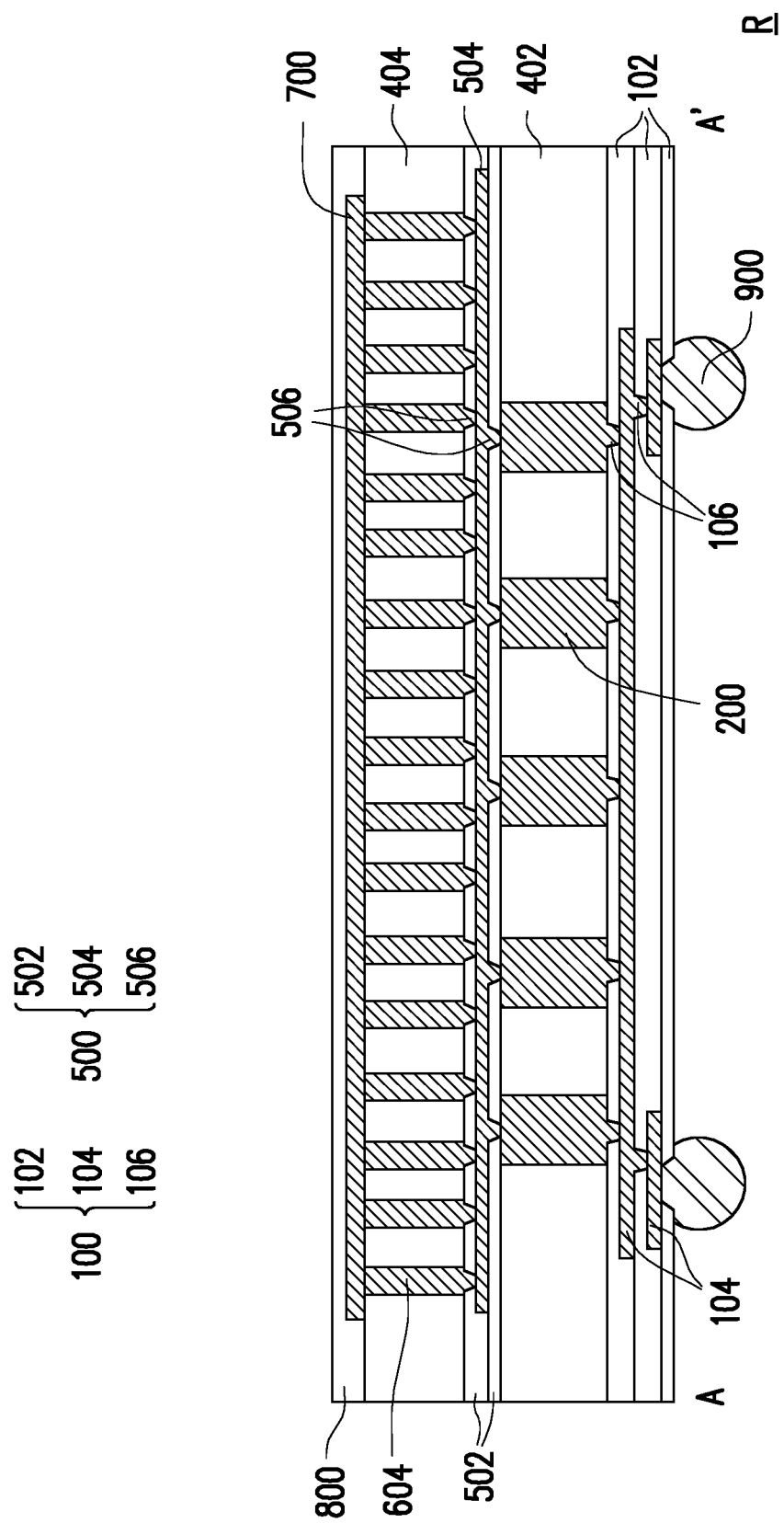
FIG. 5B is a schematic cross-sectional view of the region in FIG. 5A along line A-A'.

FIG. 5A is a schematic perspective view of a region R in the InFO package 10 in FIG. 1 in accordance with some alternative embodiments of the disclosure. FIG. 5B is a schematic cross-sectional view of the region R in FIG. 5A along line A-A'. Referring to FIG. 5A and FIG. 5B, the region R of the InFO package 10 illustrated in FIG. 5A and FIG. 5B is similar to the region R of the InFO package 10 illustrated in FIG. 2 and FIG. 4, so the detailed descriptions thereof are omitted herein. The difference between the region R of the InFO package 10 in FIG. 5A and FIG. 5B and the region R of the InFO package 10 in FIG. 2 and FIG. 4 lies in that in FIG. 5A and FIG. 5B, the antenna confinement structure 604 includes a plurality of antenna confinement patterns separate from each other. As illustrated in FIG. 5A and FIG. 5B, the antenna confinement patterns are arranged in a discrete manner to surround the second conductive structures 602. In some embodiments, a shape of the antenna confinement patterns may be similar to a shape of the second conductive structures 602. For example, each of the antenna confinement patterns may took the form of a post or a pillar. Similar to the continuous ring pattern of FIG. 2, the discrete antenna confinement structure 604 in FIG. 5A and FIG. 5B is able to provide a resonant cavity underneath the slot antenna 700, thereby enhancing the device performance of the InFO package 10.

Figure 6:
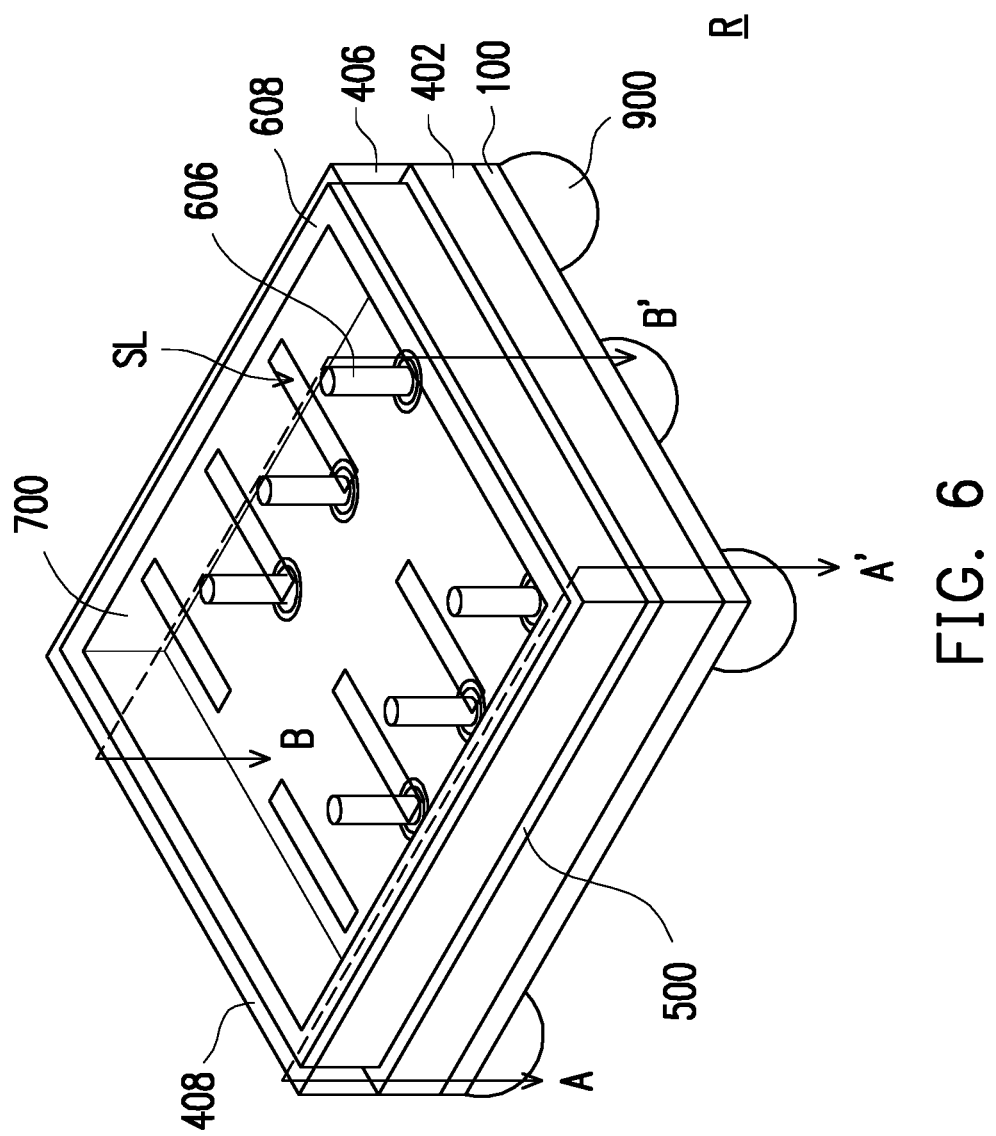
FIG. 6 is a schematic perspective view of a region in the InFO package in FIG. 1 in accordance with some alternative embodiments of the disclosure.

FIG. 6 is a schematic perspective view of a region R in the InFO package 10 in FIG. 1 in accordance with some alternative embodiments of the disclosure. Referring to FIG. 6, the manufacturing process of the region R of the InFO package 10 illustrated in FIG. 6 will be described below in conjunction with FIG. 7A to FIG. 7J and FIG. 8.

Figure 7A:
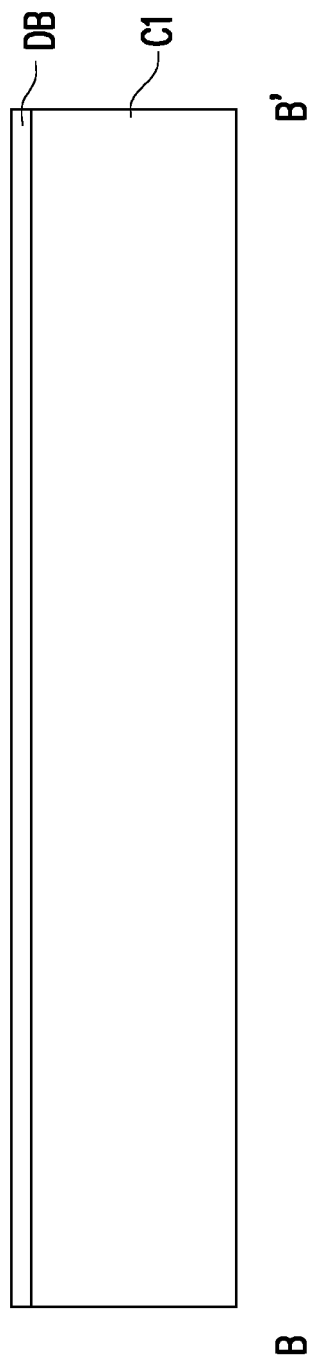
FIG. 7A to FIG. 7J are schematic cross-sectional views illustrating a manufacturing process of the region in FIG. 6 along line B-B'.
Figure 7B:
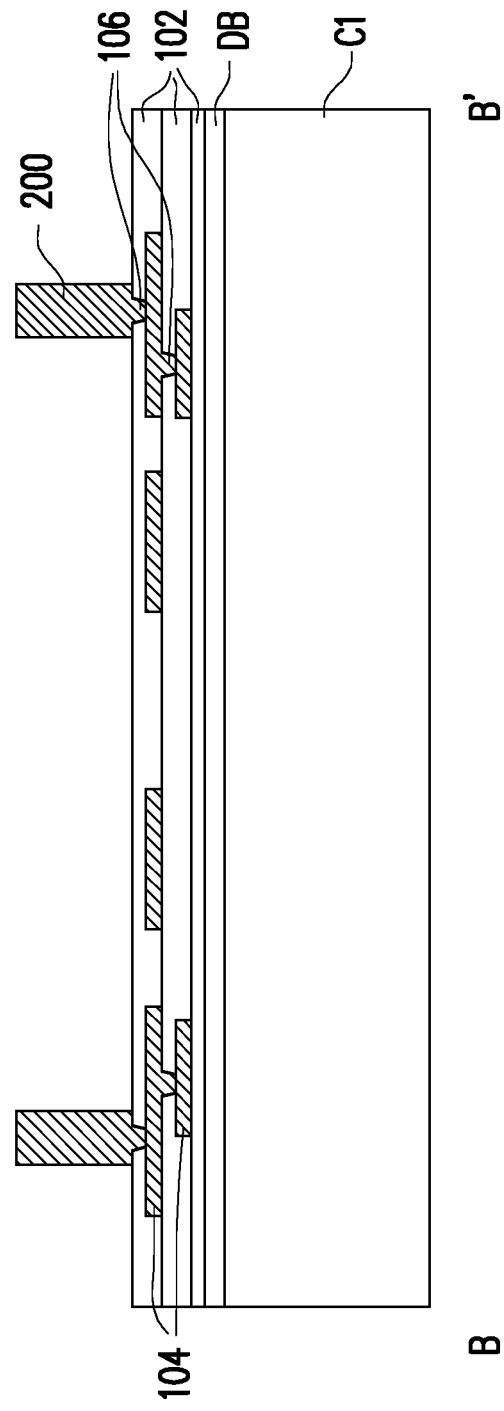
Figure 7C:
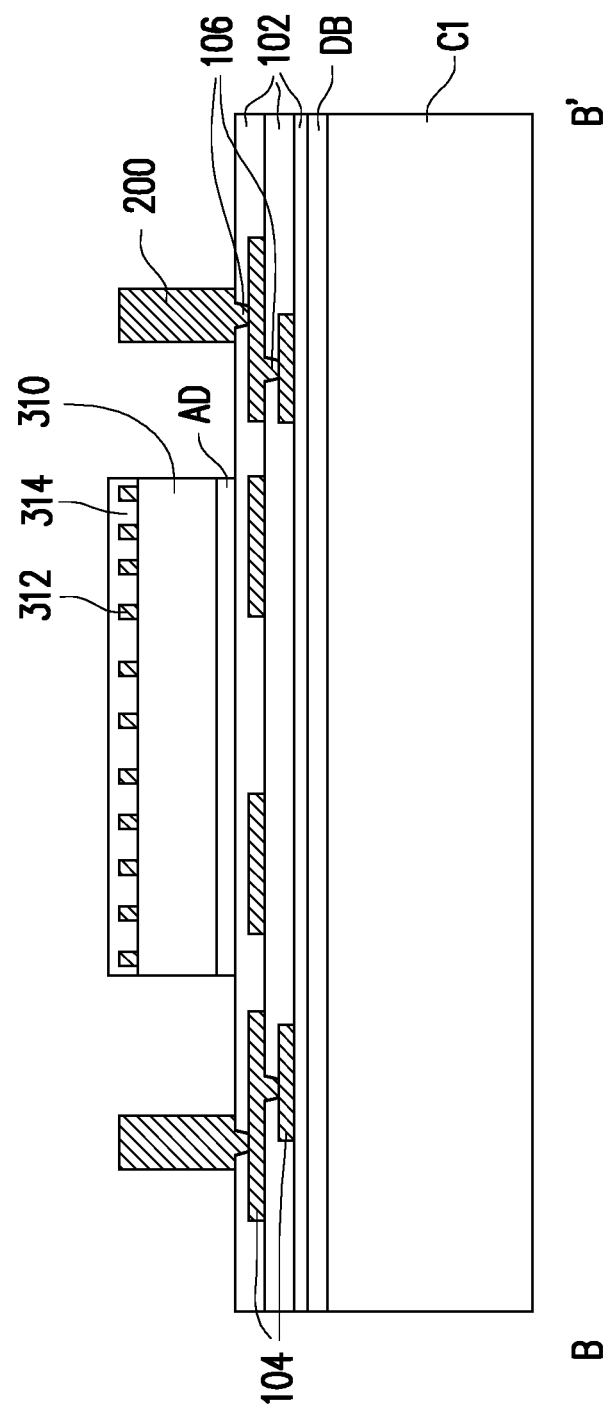
Figure 7D:
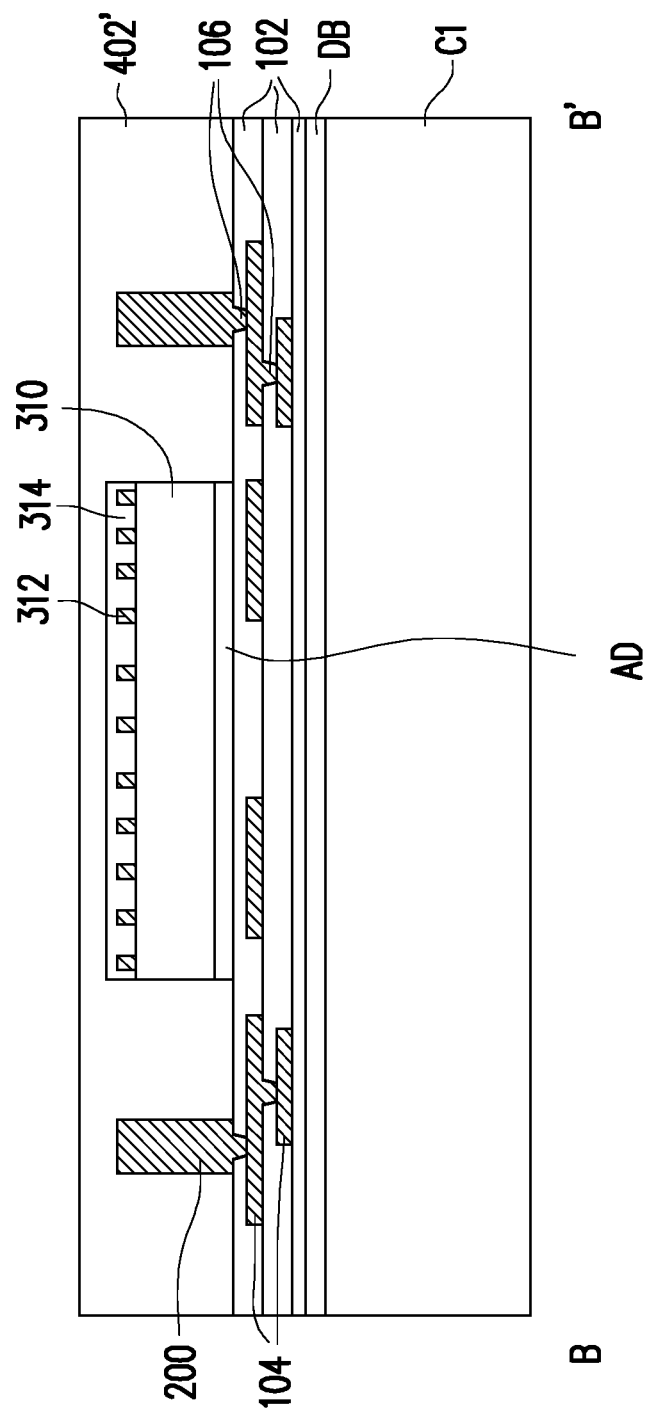
Figure 7E:
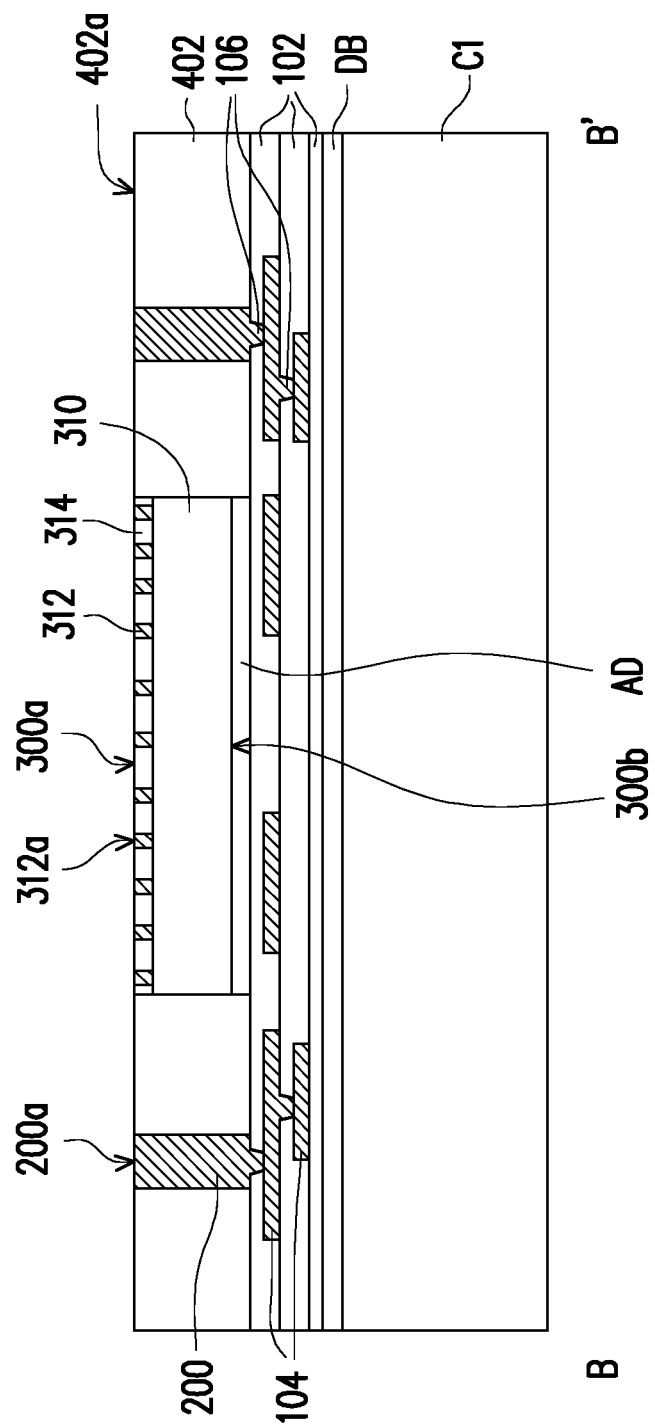
Figure 7F:
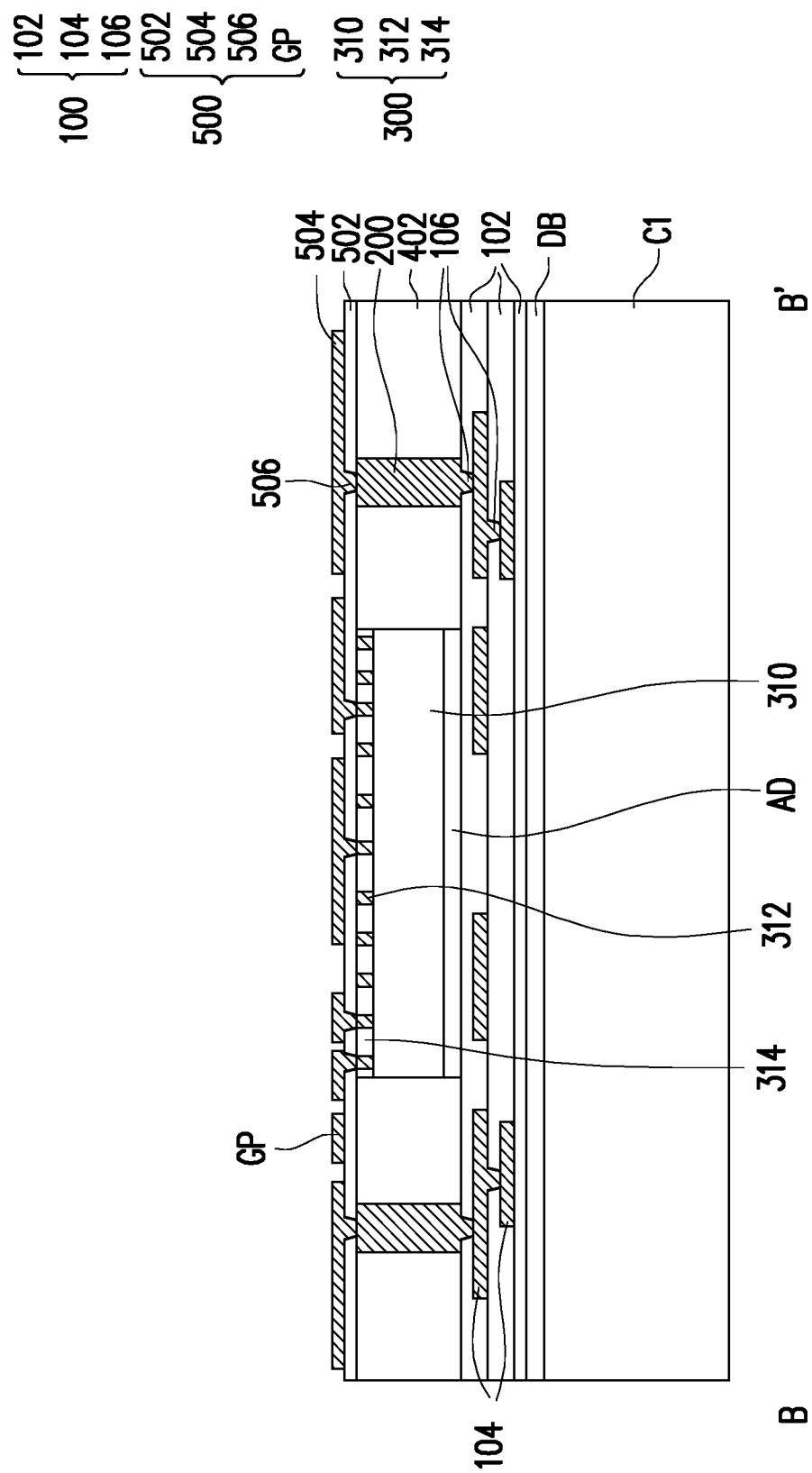

FIG. 7A to FIG. 7J are schematic cross-sectional views illustrating a manufacturing process of the region R in FIG. 6 along line B-B'. FIG. 8 is a schematic cross-sectional view of the region R in FIG. 6 along line A-A'. Referring to FIG. 7A to FIG. 7E, the steps illustrated in FIG. 7A to FIG. 7E are similar to the steps shown in FIG. 3A to FIG. 3E, so similar elements are denoted by the same reference numeral and the detailed descriptions thereof are omitted herein. Referring to FIG. 7F, a redistribution structure 500 is formed over the first conductive structures 200, the die 300, and the encapsulant 402. The redistribution structure 500 is disposed on the die 300 and is electrically connected to the conductive posts 312 of the die 300 and the first conductive structures 200. In some embodiments, the redistribution structure 500 includes a dielectric layer 502, a plurality of redistribution circuit patterns 504, a ground plane GP, and a plurality of conductive vias 506. In some embodiments, the redistribution circuit patterns 504 and the ground plane GP are stacked on the dielectric layer 502. On the other hand, the conductive vias 506 are embedded in the dielectric layer 502. In some embodiments, the redistribution circuit patterns 504 are interconnected with one another through the conductive vias 506.

The method of forming the redistribution structure 500 may include the following steps. First, the dielectric layer 502 may be formed on the first conductive structures 200, the die 300, and the encapsulant 402. In some embodiments, a material of the dielectric layer 502 includes polyimide, epoxy resin, acrylic resin, phenol resin, BCB, PBO, or any other suitable polymer-based dielectric material. The dielectric layer 502, for example, may be formed by suitable fabrication techniques, such as spin-on coating, CVD, PECVD, or the like. Thereafter, a plurality of contact openings may be formed in the dielectric layer 502. The contact openings at least partially exposes each conductive post 312 of the die and each first conductive structure 200. Then, a seed material layer (not shown) is formed over the dielectric layer 502 and in the contact openings. The seed material layer extends into the contact openings to be in contact with the conductive posts 312 and the first conductive structures 200. In some embodiments, the seed material layer includes a titanium/copper composite layer and is formed by a sputtering process. Then, a mask pattern (not shown) having openings is formed on the seed material layer. The openings of the mask pattern expose the intended location for the subsequently formed redistribution circuit patterns 504 and ground plane GP. For example, the openings of the mask pattern may expose the seed material layer located inside of the contact openings and the seed material layer in proximity of the contact openings. Afterwards, a plating process is performed to form a conductive material layer on the seed material layer exposed by the openings of the mask pattern. In some embodiments, a material of the conductive material layer includes aluminum, titanium, copper, nickel, tungsten, and/or alloys thereof. The mask pattern and the underlying seed material layer are then removed by a stripping process and an etching process. The remaining seed material layer and the remaining conductive material layer then constitute the conductive vias 506, the redistribution circuit patterns 504, and the ground plane GP. In other words, the ground plane GP and the redistribution circuit patterns 504 may be formed by a same photolithography and etching process at the same time.

It should be noted that although one layer of the redistribution circuit patterns 504 and one layer of the dielectric layers 502 are illustrated in FIG. 7F, the number of these layers is not limited in this disclosure. In some alternative embodiments, the foregoing formation method may be repeated several times to obtain the redistribution structure 500 having more layers of the dielectric layer 502 and more layers of the redistribution circuit patterns 504 depending on the circuit design.

Figure 7G:
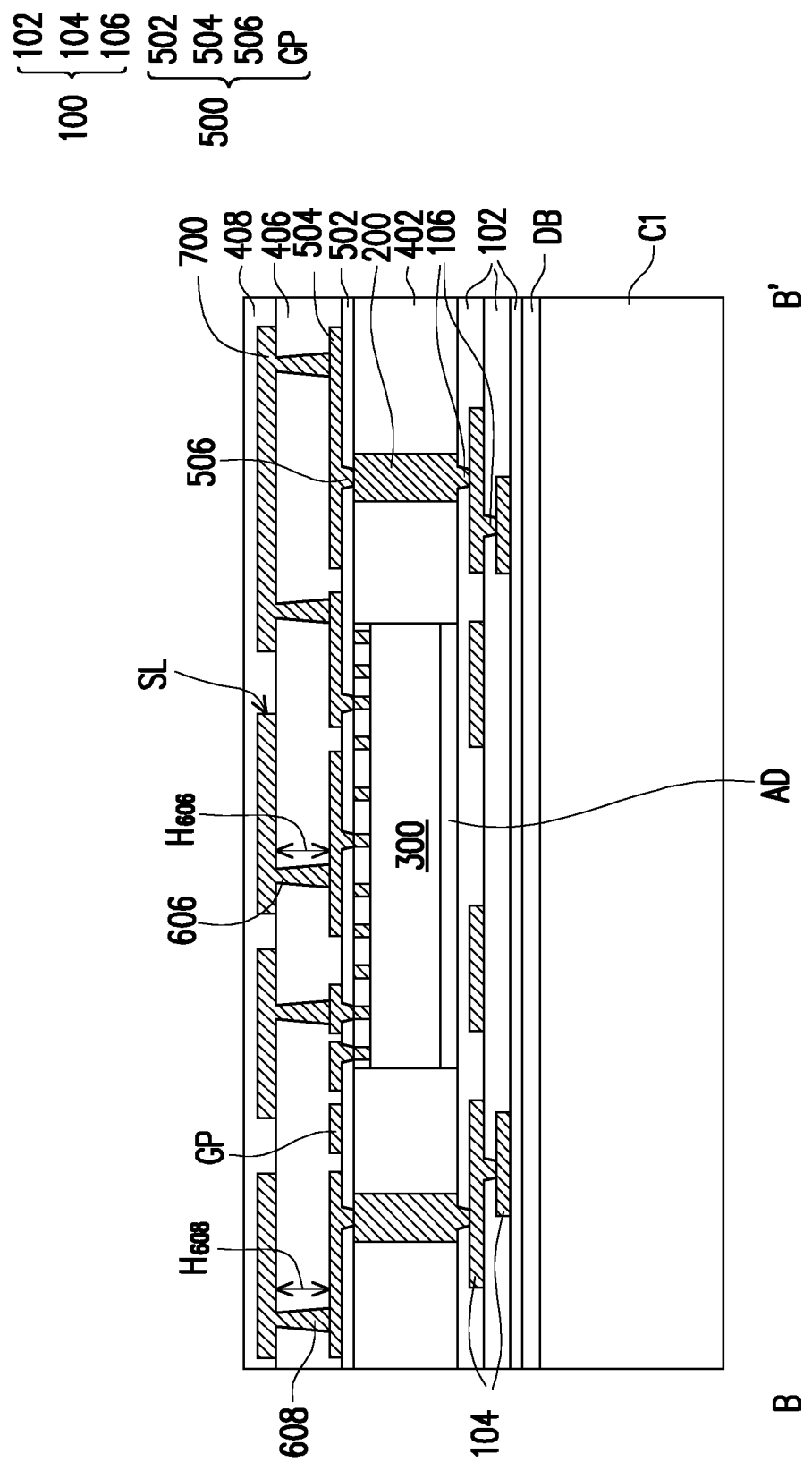
Figure 8:
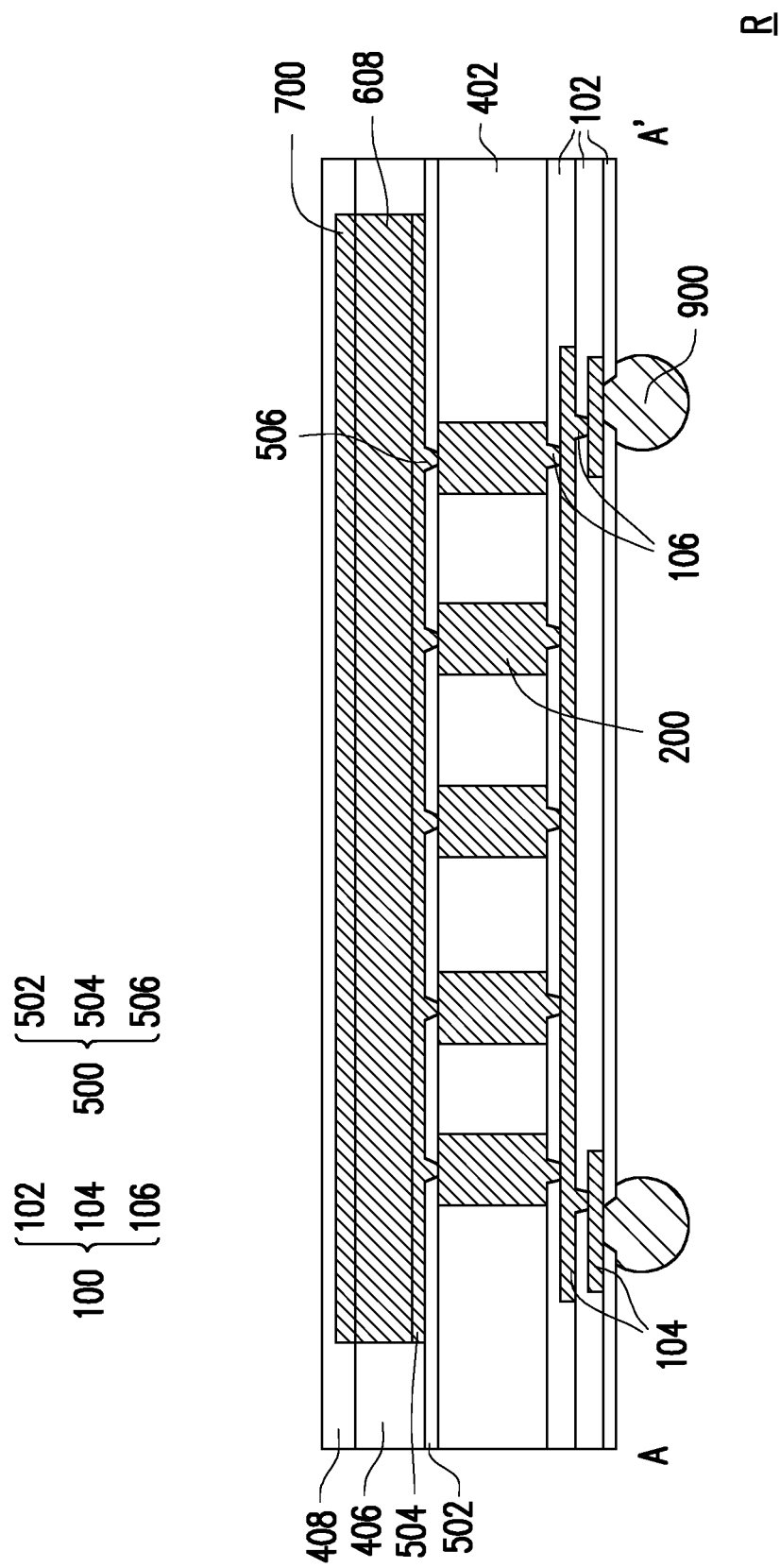
FIG. 8 is a schematic cross-sectional view of the region in FIG. 6 along line A-A'.

Referring to FIG. 7G, a plurality of second conductive structures 606, an antenna confinement structure 608, an insulating layer 406, a dielectric layer 408, and a slot antenna 700 are formed over the redistribution structure 500. In some embodiments, the methods of forming the second conductive structures 606 and the antenna confinement structure 608 may be similar to the method of forming the conductive vias 506. Similarly, the method of forming the slot antenna 700 is similar to the method of forming the redistribution circuit patterns 504 and the ground plane GP. Furthermore, the methods of forming the insulating layer 406 and the dielectric layer 408 are similar to the method of forming the dielectric layer 504. In other words, the second conductive structures 606, the antenna confinement structure 608, the insulating layer 406, the dielectric layer 408, and the slot antenna 700 may be formed by the same method as that of the redistribution structure 500 presented above. Therefore, from certain view points, the second conductive structures 606, the antenna confinement structure 608, the insulating layer 406, the dielectric layer 408, and the slot antenna 700 may be considered as part of a redistribution structure.

In some embodiments, the second conductive structures 606 are electrically connected to the redistribution structure 500. In some embodiments, the second conductive structures 606 and the antenna confinement structure 608 may be formed at the same time during the same step. In some embodiments, the second conductive structures 606 and the antenna confinement structure 608 may be considered as conductive vias. In some embodiments, the second conductive structures 606 and the antenna confinement structure 608 have substantially the same height. For example, a height $H_{606}$ of the second conductive structures 606 and a height $H_{608}$ of the antenna confinement structure 608 may range between 30 μm and 50 μm. In some embodiments, a ratio of a diameter to a height of the second conductive structures 606 may be approximately 1:1. Similarly, a ratio of a diameter to a height of the antenna confinement structure 608 may also be approximately 1:1. In some embodiments, the second conductive structures 606 and the antenna confinement structure 608 may be made of materials similar to that of the conductive vias 506. For example, the material of the second conductive structures 606 and the antenna confinement structure 608 includes aluminum, titanium, copper, nickel, tungsten, and/or alloys thereof. In some embodiments, the antenna confinement structure 608 may be electrically grounded.

In some embodiments, the slot antenna 700 is electrically connected to the second conductive structures 606 and the antenna confinement structure 608. In other words, the signals originated from the die 300 may be transmitted to the slot antenna 700 sequentially through the conductive vias 506, the redistribution circuit patterns 504, and the second conductive structures 602. Therefore, the redistribution circuit patterns 504 connecting to the die 300 and the second conductive structures 606 may be collectively referred to as a feed line. In some embodiments, the slot antenna 700 may include a plurality of slots SL arranged in an array. In some embodiments, the slot antenna 700 may be made of materials similar to that of the redistribution circuit patterns 504. For example, the material of the slot antenna 700 includes aluminum, titanium, copper, nickel, tungsten, and/or alloys thereof.

As illustrated in FIG. 7G, the insulating layer 406 wraps around the second conductive structures 606 and the antenna confinement structure 608. In some embodiments, the redistribution circuit patterns 504 are also encapsulated by the insulating layer 406. In other words, the redistribution circuit patterns 504, the second conductive structures 606, and the antenna confinement structure 608 are embedded in the insulating layer 406. In some embodiments, the dielectric layer 408 is formed over the insulating layer 406 to cover the slot antenna 700. In some embodiments, the insulating layer 406 and the dielectric layer 408 may be made of materials similar to or the same as that of the dielectric layer 504 of the redistribution structure 500. For example, the material of the insulating layer 406 and the dielectric layer 408 may include polyimide, epoxy resin, acrylic resin, phenol resin, BCB, PBO, or any other suitable polymer-based dielectric material.

Figure 7H:
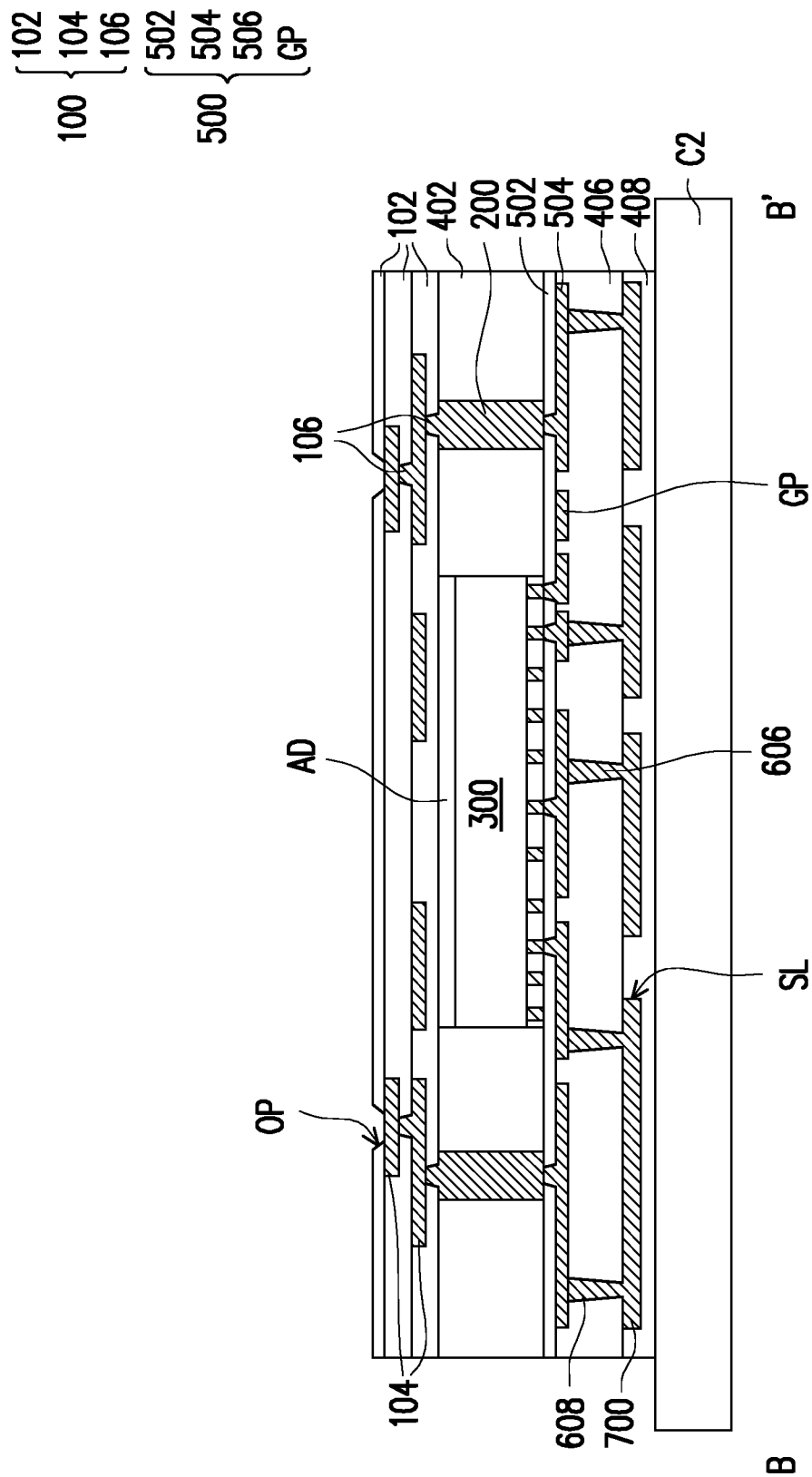
Figure 7I:
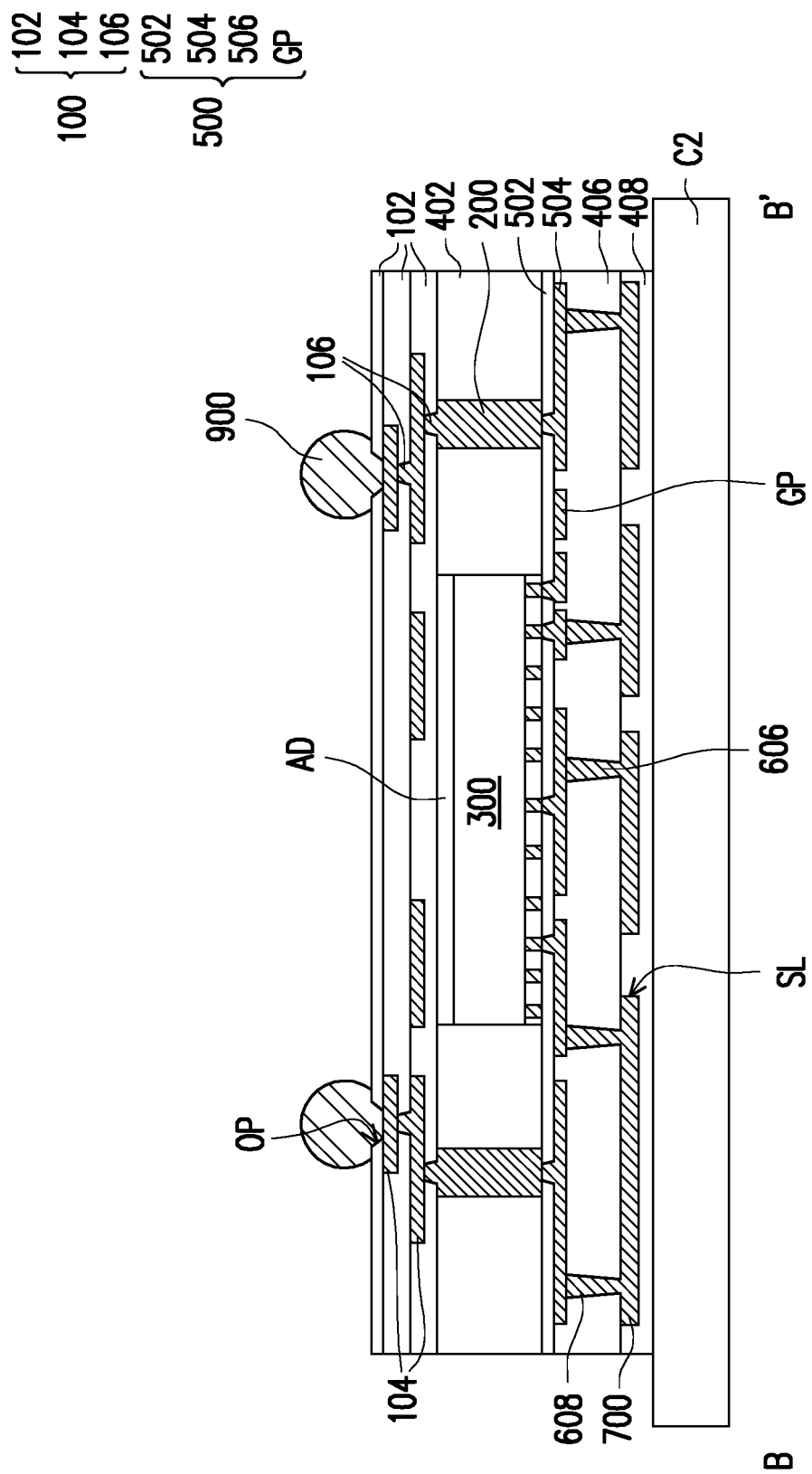
Figure 7J:
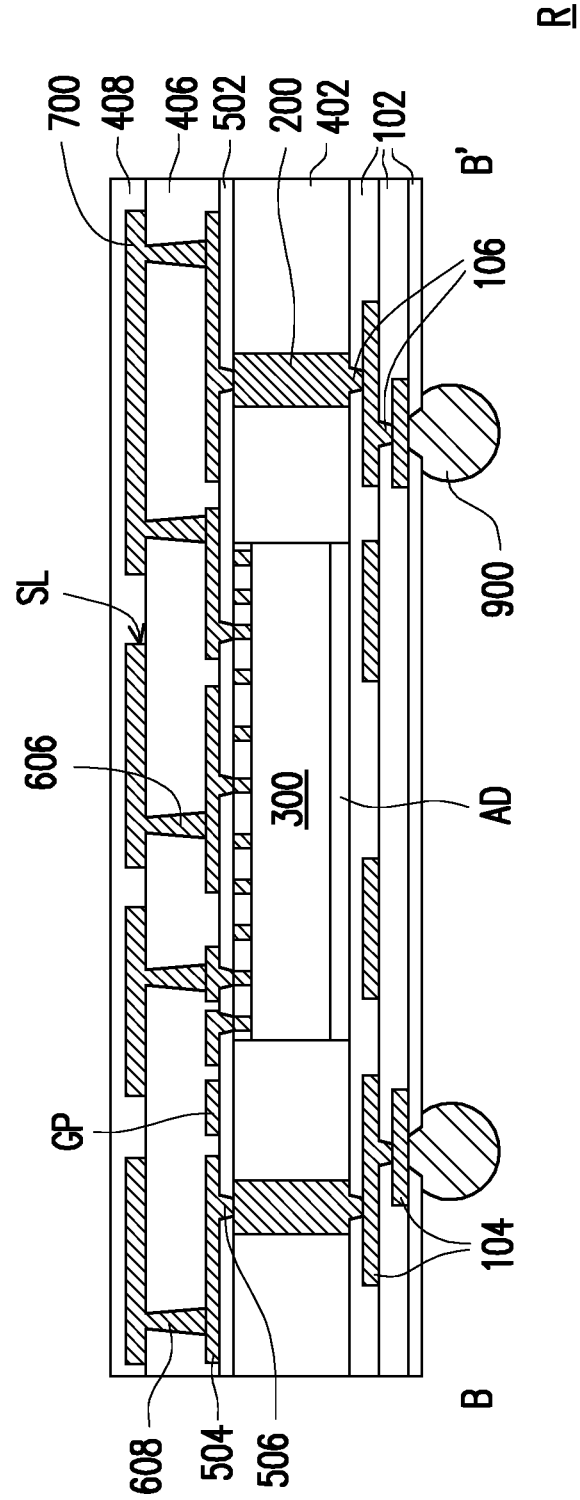

Referring to FIG. 7H to FIG. 7J, the steps illustrated in FIG. 7H to FIG. 7J are similar to the steps shown in FIG. 3L to FIG. 3N, so similar elements are denoted by the same reference numeral and the detailed descriptions thereof are omitted herein. At this stage, the manufacturing process of the InFO package 10 is substantially completed. It is noted that other regions of the InFO package 10 shown in FIG. 1 may be manufactured by adapting similar processes as that of the region R, so the detailed descriptions thereof are omitted herein. Although FIG. 7J illustrated that the die 300 faces upward to be electrically connected with the redistribution structure 500, the disclosure is not limited thereto. In some alternative embodiments, the die 300 may be arranged to face downward. Under this scenario, the die 300 is electrically connected to the redistribution structure 100. In other words, the signals originated from the die 300 may be transmitted to the slot antenna 700 through the redistribution circuit patterns 104 of the redistribution structure 100, the conductive vias 106 of the redistribution structure 100, the first conductive structures 200, the conductive vias 506 of the redistribution structure 500, the redistribution circuit patterns 504 of the redistribution structure 500, and the second conductive structures 606.

Referring to FIG. 6 and FIG. 8, the antenna confinement structure 608 is shown to be a ring structure surrounding the second conductive structure 606. In other words, the antenna confinement structure 608 may be a continuous structure forming an enclosure together with the slot antenna 700 and the redistribution structure 500. The enclosure may be a resonant cavity which is able to sufficiently enhance the signal gain of the slot antenna 700. As such, the device performance of the InFO package 10 may be enhanced.

Figure 9A:
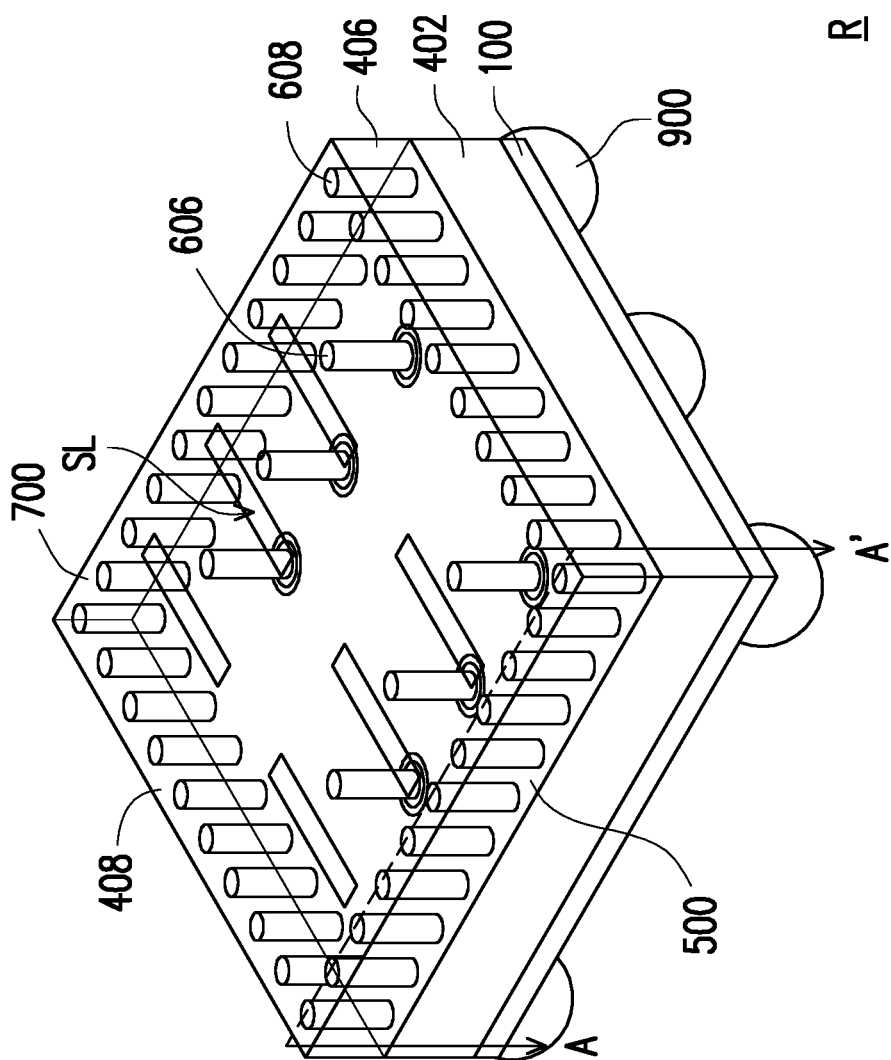
FIG. 9A is a schematic perspective view of a region in the InFO package in FIG. 1 in accordance with some alternative embodiments of the disclosure.
Figure 9B:
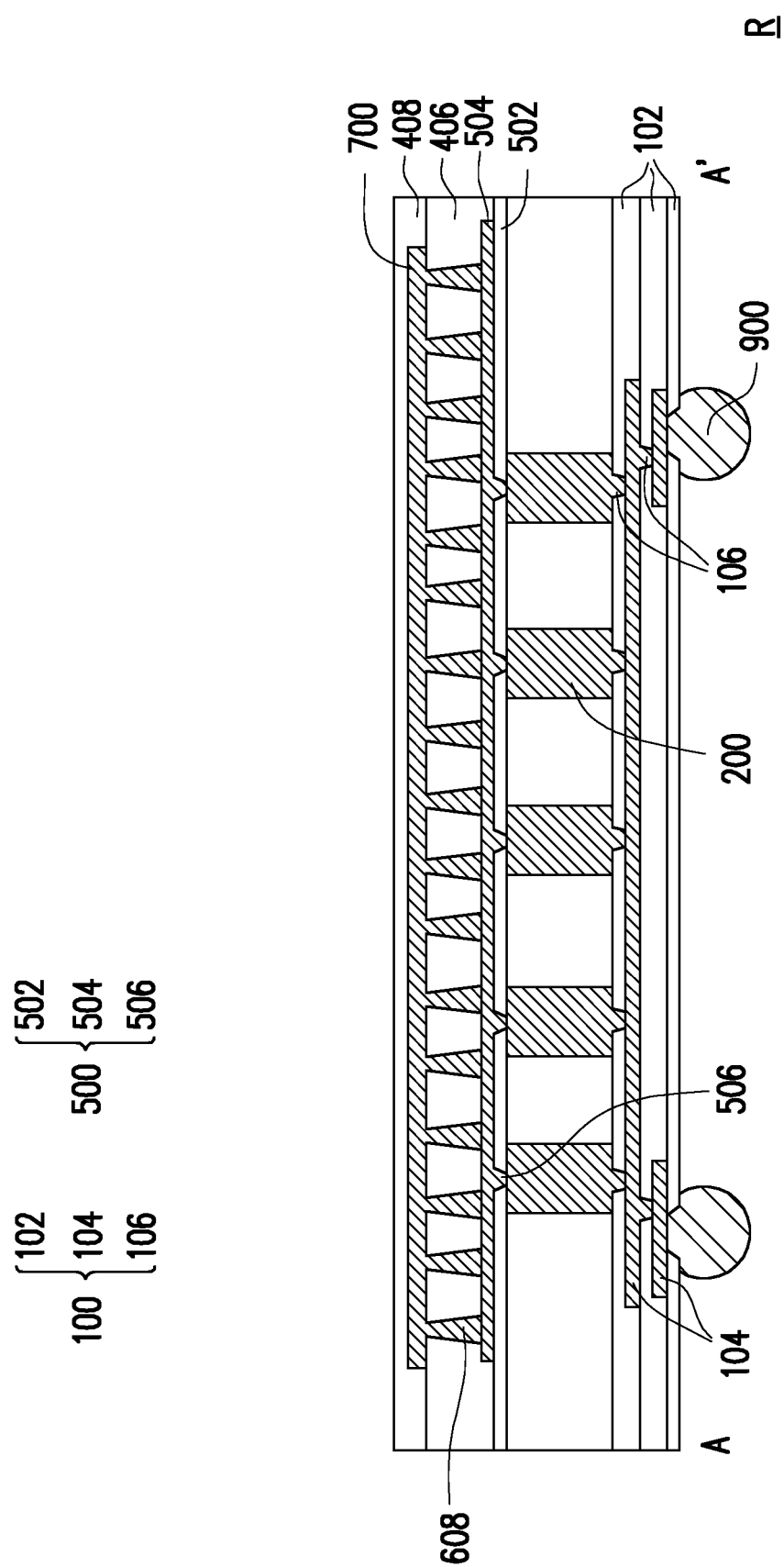
FIG. 9B is a schematic cross-sectional view of the region in FIG. 9A along line A-A'.

FIG. 9A is a schematic perspective view of a region R in the InFO package 10 in FIG. 1 in accordance with some alternative embodiments of the disclosure. FIG. 9B is a schematic cross-sectional view of the region R in FIG. 9A along line A-A'. Referring to FIG. 9A and FIG. 9B, the region R of the InFO package 10 illustrated in FIG. 9A and FIG. 9B is similar to the region R of the InFO package 10 illustrated in FIG. 6 and FIG. 8, so the detailed descriptions thereof are omitted herein. The difference between the region R of the InFO package 10 in FIG. 9A and FIG. 9B and the region R of the InFO package 10 in FIG. 6 and FIG. 8 lies in that in FIG. 9A and FIG. 9B, the antenna confinement structure 608 includes a plurality of antenna confinement patterns separate from each other. As illustrated in FIG. 9A and FIG. 9B, the antenna confinement patterns are arranged in a discrete manner to surround the second conductive structures 606. In some embodiments, a shape of the antenna confinement patterns may be similar to a shape of the second conductive structures 606. For example, each of the antenna confinement patterns may took the form of a via. Similar to the continuous ring pattern of FIG. 6, the discrete antenna confinement structure 608 in FIG. 9A and FIG. 9B is able to provide a resonant cavity underneath the slot antenna 700, thereby enhancing the device performance of the InFO package 10.

Figure 10:
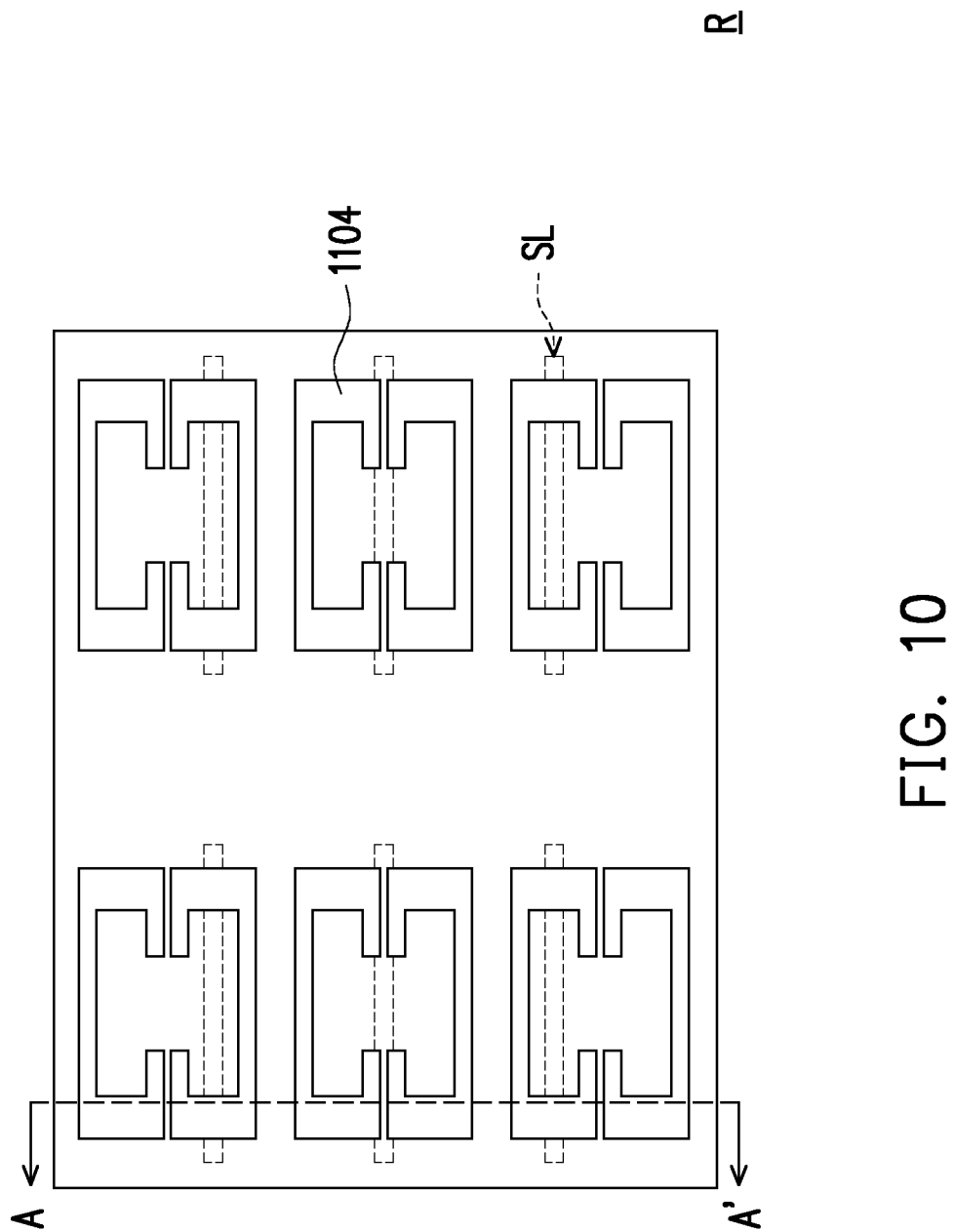
FIG. 10 is a schematic top view of a region in the InFO package in FIG. 1 in accordance with some embodiments of the disclosure.

FIG. 10 is a schematic top view of a region R in the InFO package 10 in FIG. 1 in accordance with some embodiments of the disclosure. Referring to FIG. 10, the manufacturing process of the region R of the InFO package 10 illustrated in FIG. 10 will be described below in conjunction with FIG. 11A to FIG. 11J.

Figure 11A:
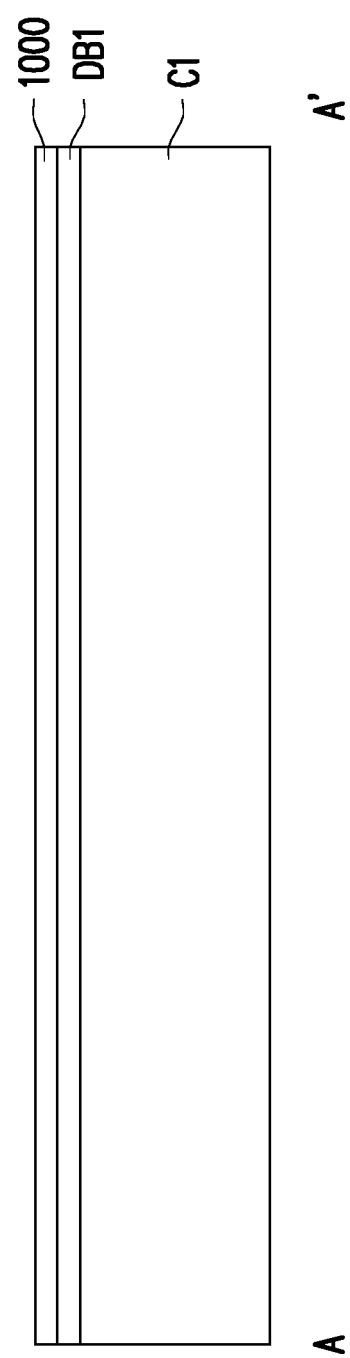
FIG. 11A to FIG. 11J are schematic cross-sectional views illustrating a manufacturing process of the region in FIG. 10 along line A-A'.

FIG. 11A to FIG. 11J are schematic cross-sectional views illustrating a manufacturing process of the region R in FIG. 10 along line A-A'. Referring to FIG. 11A, a carrier C1 having a de-bonding layer DB1 formed thereon is provided. The carrier C1 and the de-bonding layer DB1 in FIG. 11A may be similar to the carrier C1 and the de-bonding layer DB in FIG. 3A, so the detailed descriptions thereof are omitted herein. Subsequently, an auxiliary insulating layer 1000 is formed on the de-bonding layer DB1. In some embodiments, the auxiliary insulating layer 1000 may be made of low Df and/or Dk materials. For example, the auxiliary insulating layer 1000 may include polymer or the like. In some embodiments, the auxiliary insulating layer 1000 is formed on the de-bonding layer DB1 through spin-coating, lamination, deposition, or the like.

Figure 11B:
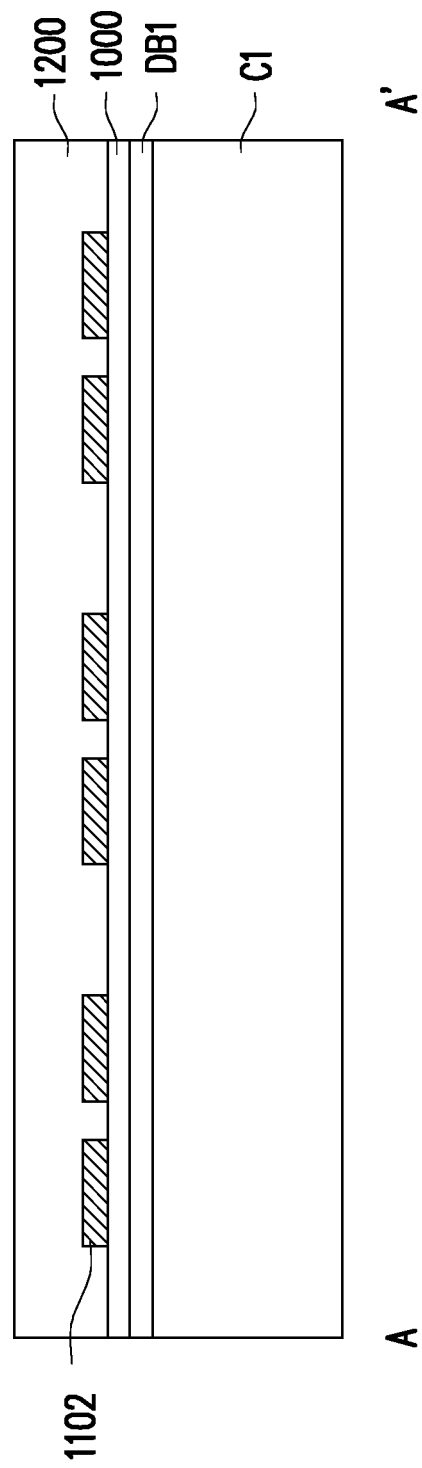

Referring to FIG. 11B, a plurality of first conductive patterns 1102 and an auxiliary insulating layer 1200 are sequentially formed on the auxiliary insulating layer 1000. In some embodiments, the first conductive patterns 1102 are arranged in an array. For example, the first conductive patterns 1102 may be arranged periodically. In some embodiments, a material of the first conductive patterns 1102 may include aluminum, titanium, copper, nickel, tungsten, and/or alloys thereof. In some embodiments, the first conductive patterns 1102 may be formed by the following steps. First, a metallization layer (not shown) is formed over the auxiliary insulating layer 1000 through electroplating or deposition. Subsequently, the metallization layer is patterned by photolithography and etching processes to form the first conductive patterns 1102. As illustrated in FIG. 11B, the auxiliary insulating layer 1200 is formed on the auxiliary insulating layer 1000 to cover the first conductive patterns 1102. In other words, the first conductive patterns 1102 are embedded in the auxiliary insulating layer 1200. In some embodiments, a material of the auxiliary insulating layer 1200 may be similar to the material of the auxiliary insulating layer 1000. That is, the auxiliary insulating layer 1200 may be made of low Df and/or Dk materials. For example, the auxiliary insulating layer 1200 may include polymer, epoxy, the like, or a combination thereof.

Figure 11C:
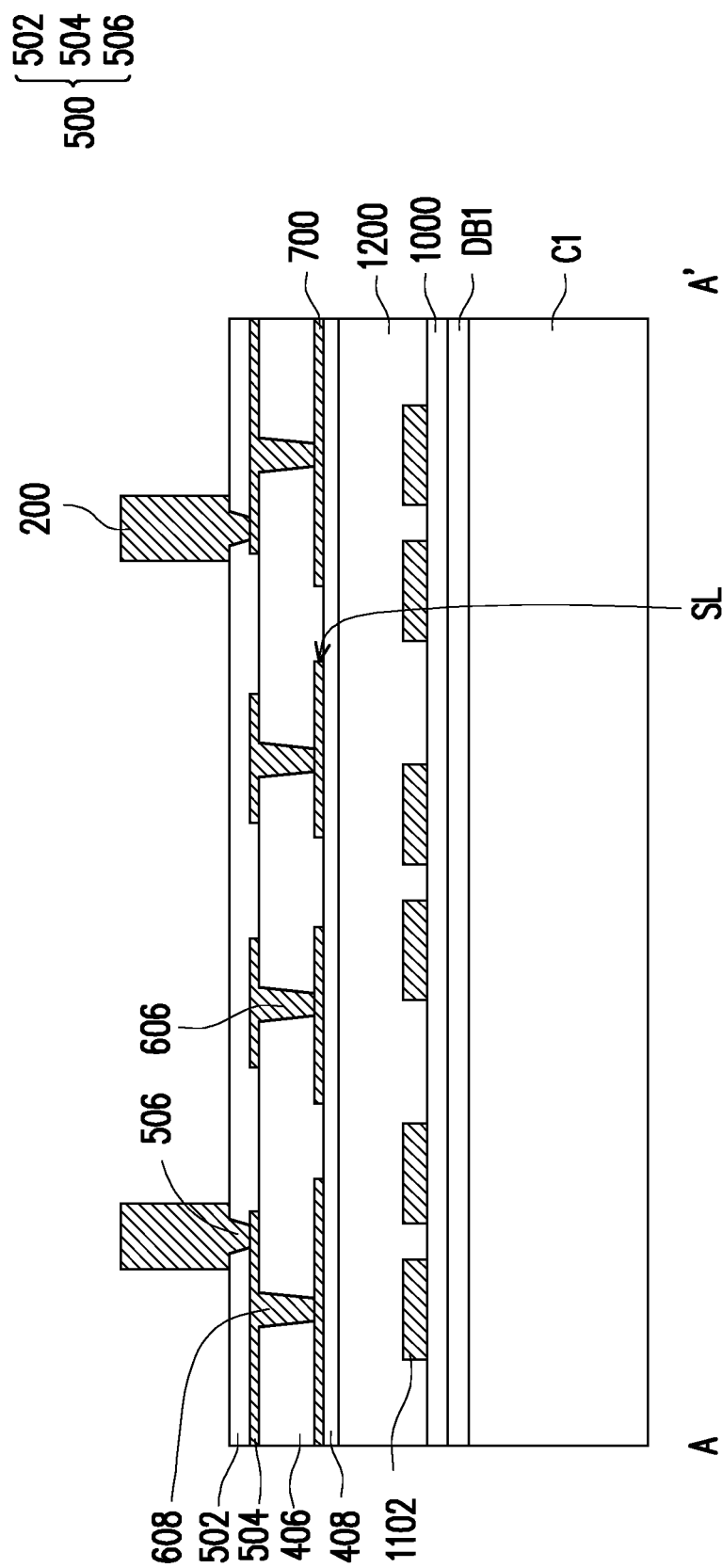

Referring to FIG. 11C, a plurality of first conductive structures 200, a redistribution structure 500, a plurality of second conductive structures 606, an antenna confinement structure 608, an insulating layer 406, a slot antenna 700, and a dielectric layer 408 are formed over the auxiliary insulating layer 1200. The first conductive structures 200, the redistribution structure 500, the second conductive structures 606, the antenna confinement structure 608, the insulating layer 406, the slot antenna 700, and the dielectric layer 408 in FIG. 11C may be similar to the first conductive structures 200, the redistribution structure 500, the second conductive structures 606, the antenna confinement structure 608, the insulating layer 406, the slot antenna 700, and the dielectric layer 408 shown in FIG. 7G, so the detailed descriptions thereof are omitted herein.

As illustrated in FIG. 11C, the dielectric layer 408 is formed on the auxiliary insulating layer 1200. In some embodiments, the dielectric layer 408 is in direct contact with the auxiliary insulating layer 1200. The slot antenna 700 is disposed on the dielectric layer 408. The insulating layer 406 is formed over the slot antenna 700 and the dielectric layer 408. The second conductive structures 606 and the antenna confinement structure 608 are embedded in the insulating layer 406. In some embodiments, the slot antenna 700 may be electrically connected to the second conductive structures 606 and the antenna confinement structure 608. The redistribution structure 500 is formed on the second conductive structures 606, the antenna confinement structure 608, and the insulating layer 406. The redistribution structure 500 includes a dielectric layer 502, a plurality of redistribution circuit patterns 504, and a plurality of conductive vias 506. The redistribution circuit patterns 504 are electrically connected to the second conductive structures 606 and the antenna confinement structure 608. The first conductive structures 200 are formed over the redistribution structure 500. The first conductive structures 200 are electrically connected to the redistribution structure 500. In some embodiments, the first conductive structures 200 and the conductive vias 506 of the redistribution structure 500 may be simultaneously formed.

Figure 11D:
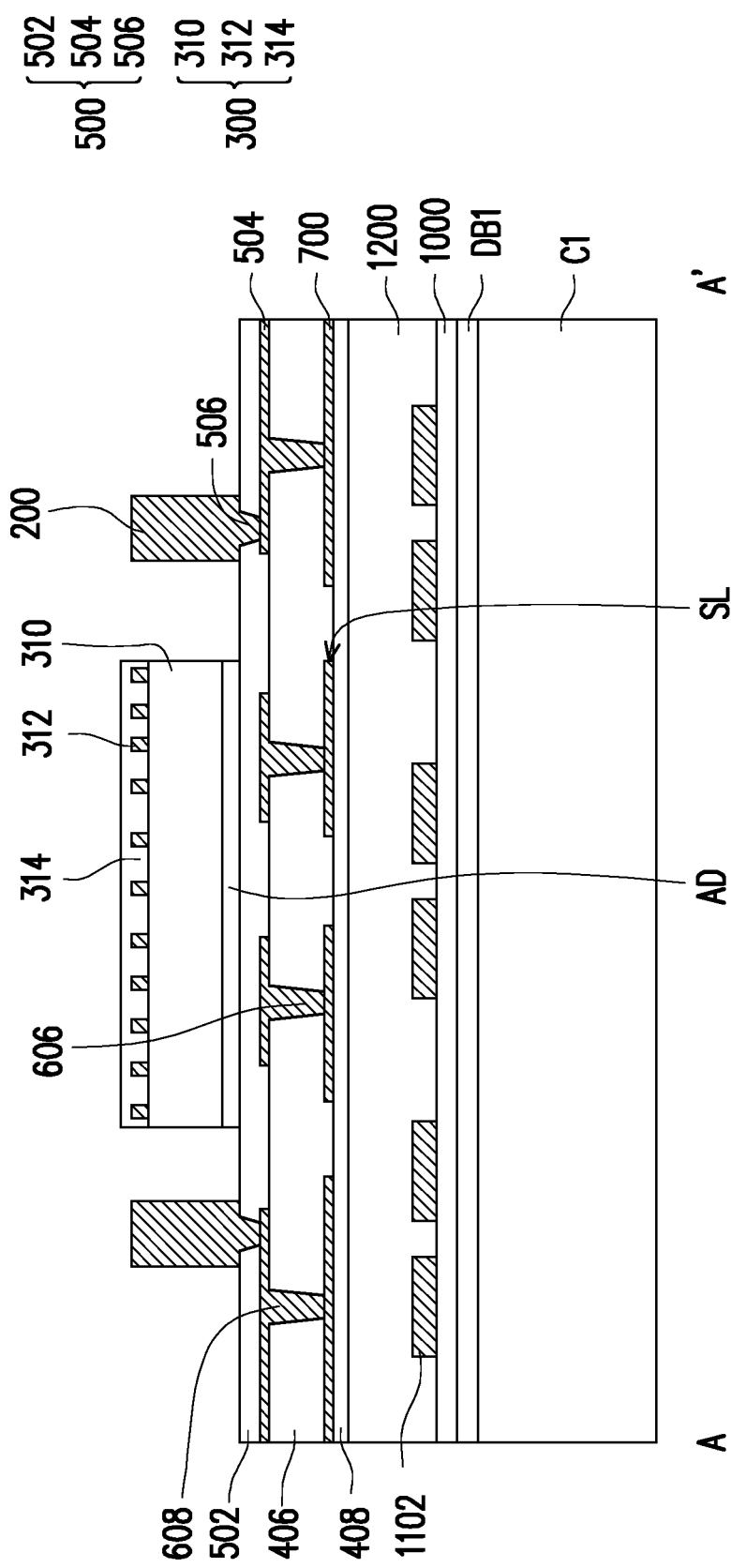
Figure 11E:
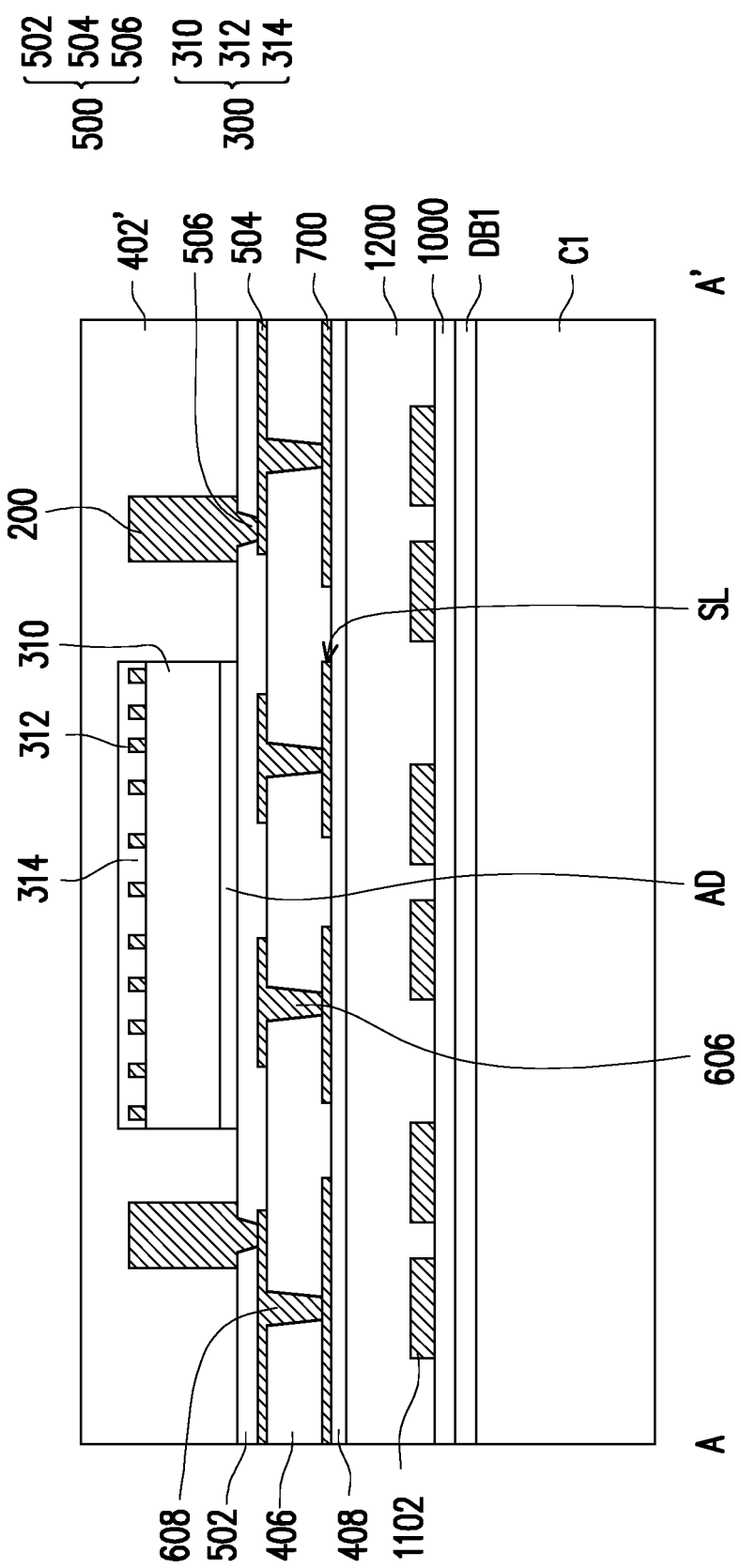
Figure 11F:
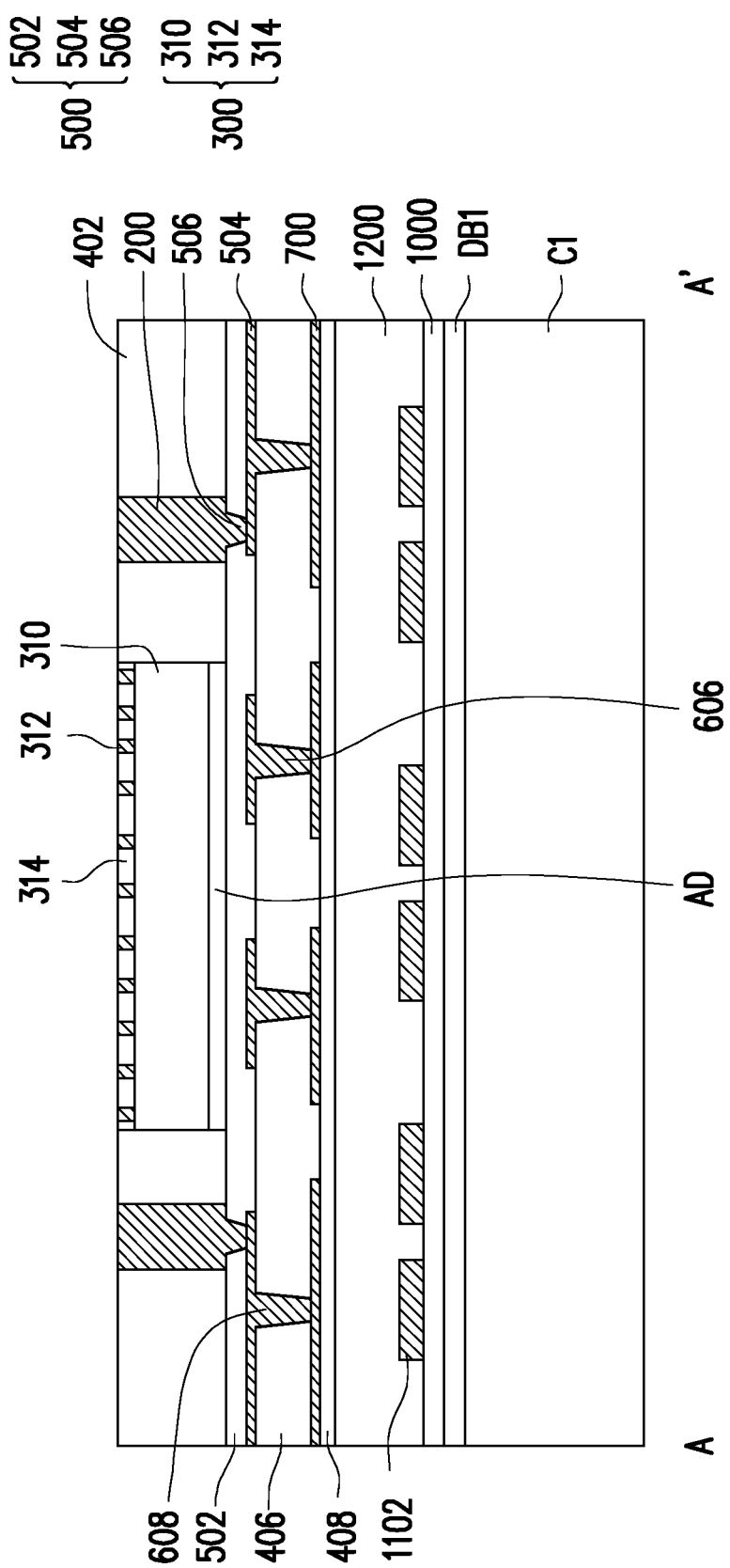

Referring to FIG. 11D to FIG. 11F, a die 300 and an encapsulant 402 are formed on the redistribution structure 500. The steps illustrated in FIG. 11D to FIG. 11F are similar to the steps shown in FIG. 7C to FIG. 7E, so similar elements are denoted by the same reference numeral and the detailed descriptions thereof are omitted herein.

Figure 11G:
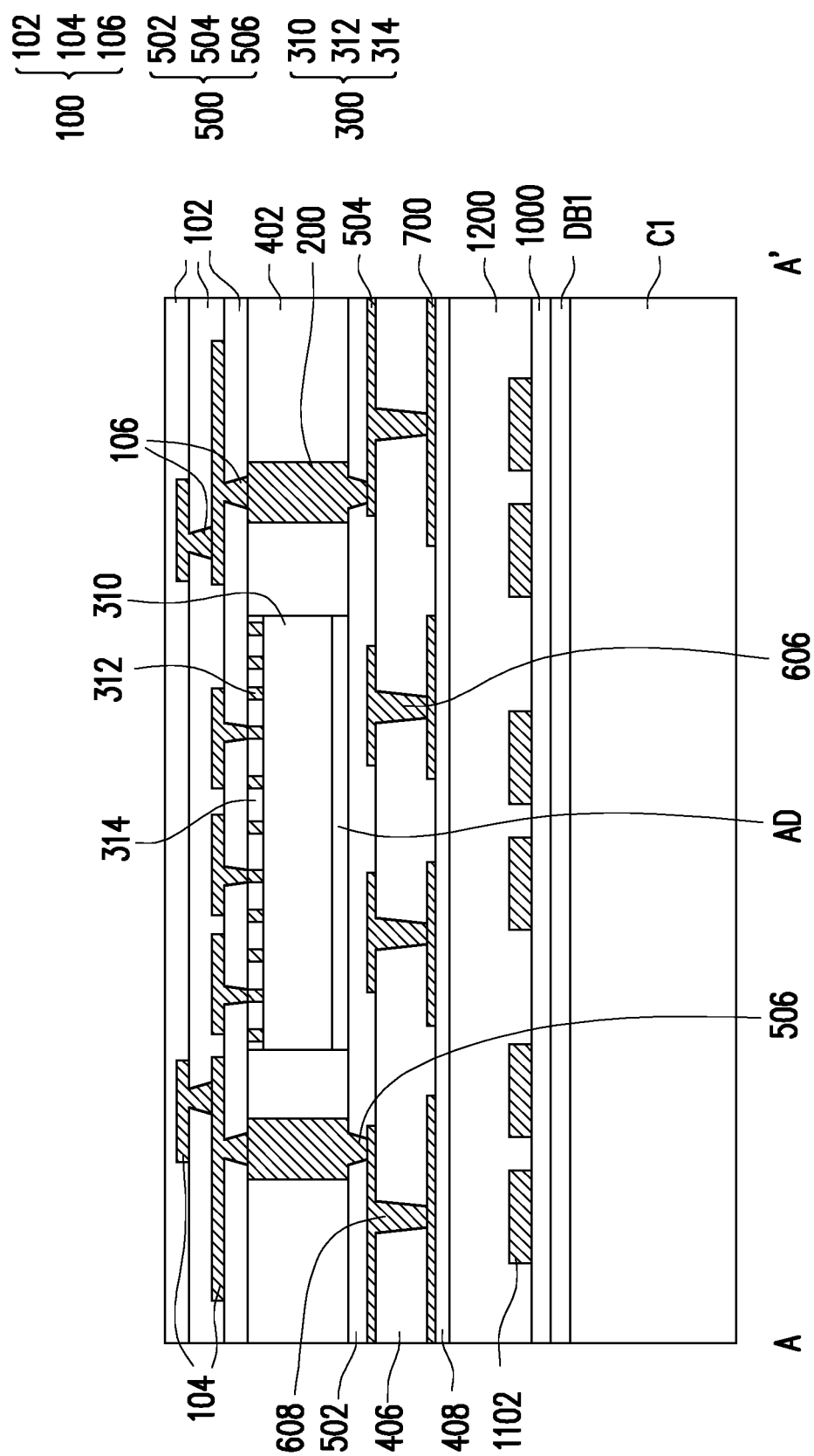

Referring to FIG. 11G, a redistribution structure 100 is formed on the first conductive structures 200, the die 300, and the encapsulant 400. The redistribution structure 100 in FIG. 11G may be similar to the redistribution structure 100 in FIG. 7B, so the detailed descriptions thereof are omitted herein. As illustrated in FIG. 11G, the redistribution structure 100 includes a plurality of dielectric layer 102, a plurality of redistribution circuit patterns 104, and a plurality of conductive vias 106. In some embodiments, the redistribution circuit patterns 104 are electrically connected to the conductive pots 312 of the die 300 and the first conductive structures 100 through the conductive vias 106. In some embodiments, the redistribution structure 100 or the redistribution structure 500 may further include a ground plane (not shown).

Figure 11H:
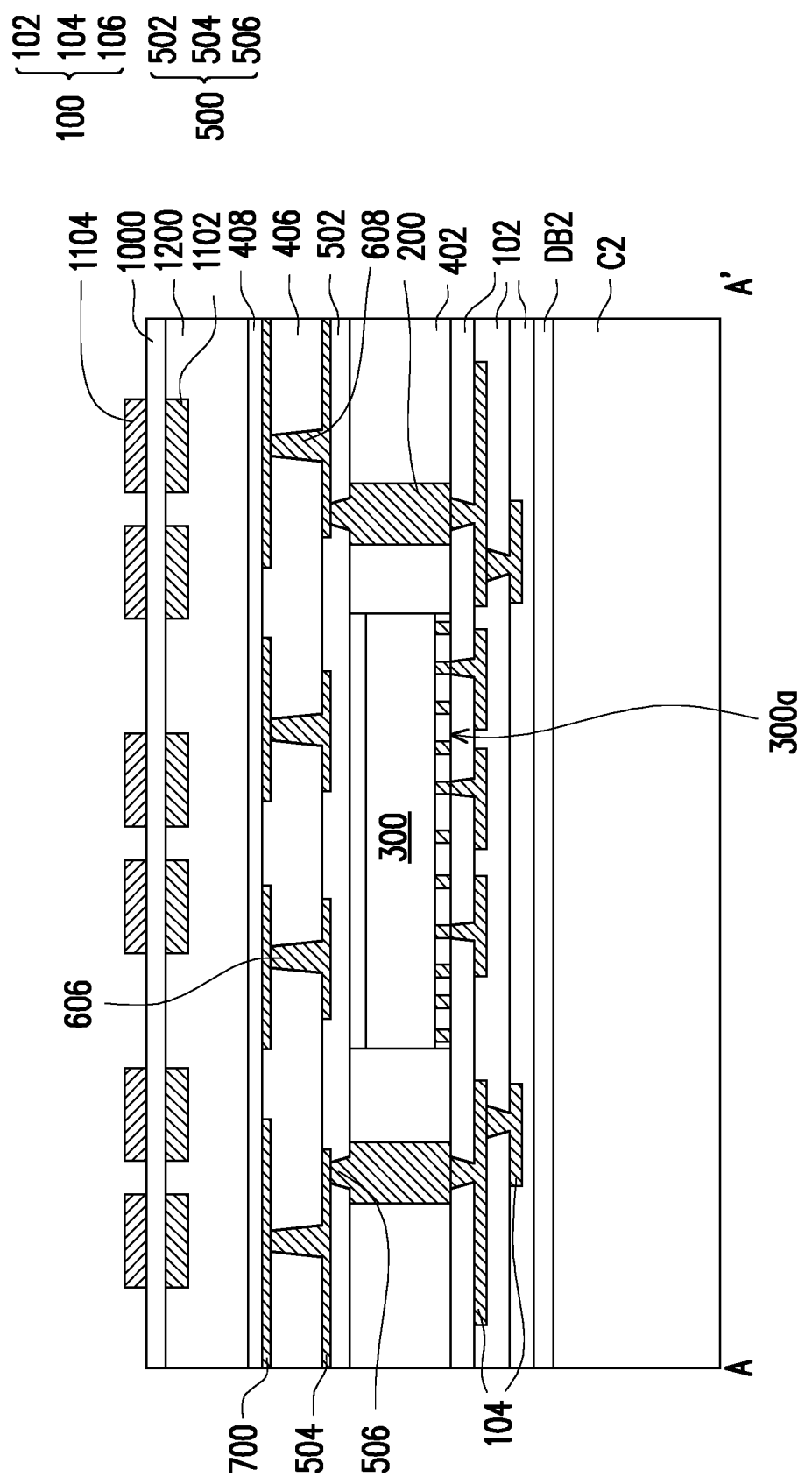

Referring to FIG. 11G and FIG. 11H, the structure illustrated in FIG. 11G is flipped upside down and is attached to a carrier C2 and a de-bonding layer DB2. The carrier C1 and the de-bonding layer DB1 are removed. In some embodiments, the de-bonding layer DB1 (e.g., the LTHC release layer) may be irradiated by an UV laser such that the carrier C1 and the de-bonding layer DB1 may be peeled off from the auxiliary insulating layer 1000. However, the de-bonding process is not limited thereto. Other suitable de-carrier methods may be used in some alternative embodiments. The carrier C2 and the de-bonding layer DB2 may be similar to the carrier C1 and the de-bonding layer DB1, so the detailed descriptions thereof are omitted herein. Thereafter, a plurality of second conductive patterns 1104 is formed on the auxiliary insulating layer 1000. In some embodiments, a material of the second conductive patterns 1104 may include aluminum, titanium, copper, nickel, tungsten, and/or alloys thereof. In some embodiments, the second conductive patterns 1104 may be formed by the following steps. First, a metallization layer (not shown) is formed over the auxiliary insulating layer 1000 through electroplating or deposition. Subsequently, the metallization layer is patterned by photolithography and etching processes to form the second conductive patterns 1104. In some embodiments, the second conductive patterns 1104 are arranged in an array. For example, as illustrated in FIG. 10 and FIG. 11H, the second conductive patterns 1104 are arranged periodically. In some embodiments, a shape of the first conductive patterns 1102 may be identical to a shape of the second conductive patterns 1104. Moreover, a location of the first conductive patterns 1102 may correspond to a location of the second conductive patterns 1104. For example, a vertical projection of the second conductive patterns 1104 along a direction perpendicular to the active surface 300a of the die 300 may completely overlap with the first conductive patterns 1102. In some embodiments, the first conductive patterns 1102 and the second conductive patterns 1104 may serve as antennas. For example, the signal originated from the die 300 may be sequentially transmitted to the slot antenna 700 through the redistribution structure 100, the first conductive structures 200, the redistribution structure 500, and the second conductive structures 606. The signal may then be electrically coupled to the first conductive patterns 1102 and the second conductive patterns 1104 from the slot antenna 700. In some embodiments, due to the periodic arrangement of the first conductive patterns 1102 and the second conductive patterns 1104, the first conductive patterns 1102 and the second conductive patterns 1104 may be collectively referred to as metamaterial lenses. That is, the properties of the elements around the first conductive patterns 1102 and the second conductive patterns 1104 may be altered such that the signal (in the form of energy) may be focused by the pairs of the first conductive patterns 1102 and the second conductive patterns 1104. By adapting the metamaterial lenses constituted by the first conductive patterns 1102 and the second conductive patterns 1104, the signal gain may be sufficiently increased and the device performance of the InFO package 10 may be effectively enhanced.

It should be noted that the shape of the second conductive patterns 1104 shown in FIG. 10 merely serves as an exemplary illustration, and the disclosure is not limited thereto. The first conductive patterns 1102 and the second conductive patterns 1104 may exhibit other shapes from the top view as long as the first conductive patterns 1102 and the second conductive patterns 1104 are arranged periodically.

Figure 11I:
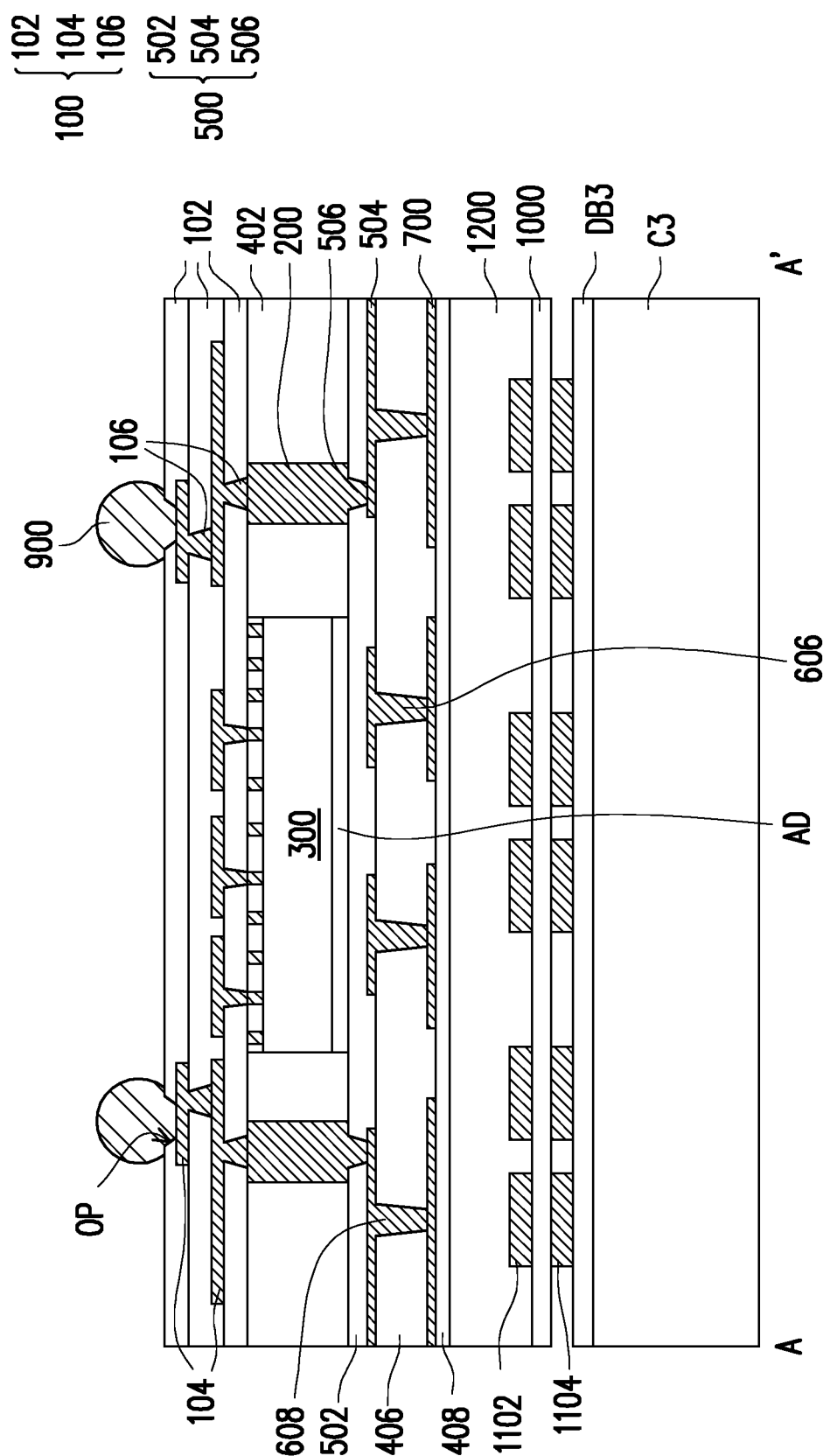

Referring to FIG. 11H and FIG. 11I, the structure illustrated in FIG. 11H is flipped upside down again and is attached to a carrier C3 and a de-bonding layer DB3. The carrier C2 and the de-bonding layer DB2 are removed. In some embodiments, the de-bonding layer DB2 (e.g., the LTHC release layer) may be irradiated by an UV laser such that the carrier C2 and the de-bonding layer DB2 may be peeled off from the dielectric layer 102 of the redistribution structure 100. However, the de-bonding process is not limited thereto. Other suitable de-carrier methods may be used in some alternative embodiments. The carrier C3 and the de-bonding layer DB3 may be similar to the carrier C1 and the de-bonding layer DB1, so the detailed descriptions thereof are omitted herein. Thereafter, a plurality of openings OP is formed in the outermost dielectric layer 102 of the redistribution structure 100. In some embodiments, the openings OP are formed by a laser drilling process, a mechanical drilling process, a photolithography process and an etching process, or other suitable processes. As illustrated in FIG. 11I, the openings OP expose the outermost redistribution circuit patterns 104 of the redistribution structure 100. Subsequently, a plurality of conductive terminals 900 is formed over the redistribution structure 100 opposite to the die 300. In some embodiments, the conductive terminals 900 extend into the openings OP to electrically connect with the outermost redistribution circuit pattern 104. In some embodiments, a plurality of UBM patterns (not shown) may be formed on the outermost dielectric layer 102 and in the openings OP. The conductive terminals 900 may be disposed over the UBM patterns. In some embodiments, the conductive terminals 900 are attached to the UBM patterns through a solder flux. In some embodiments, the conductive terminals 900 are, for example, solder balls. In some embodiments, the conductive terminals 900 may be disposed on the redistribution structure 100 through a ball placement process and/or a reflowing process.

Figure 11J:
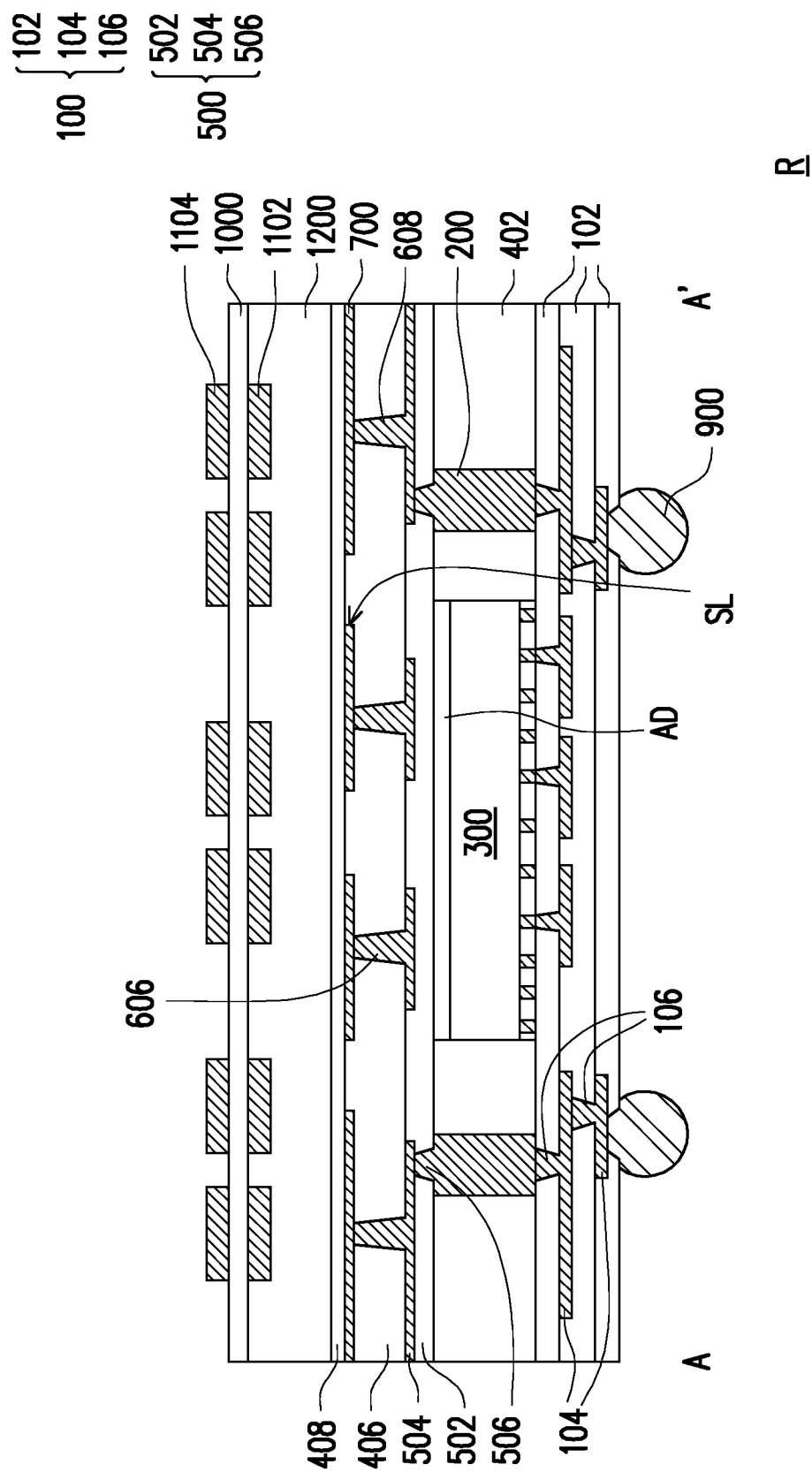

Referring to FIG. 11I and FIG. 11J, the structure illustrated in FIG. 11I is flipped upside down. The carrier C3 and the de-bonding layer DB3 are removed. In some embodiments, the de-bonding layer DB3 (e.g., the LTHC release layer) may be irradiated by an UV laser such that the carrier C3 and the de-bonding layer DB3 may be peeled off from the second conductive patterns 1104. However, the de-bonding process is not limited thereto. Other suitable de-carrier methods may be used in some alternative embodiments. At this stage, the manufacturing process of the InFO package 10 is substantially completed. It is noted that other regions of the InFO package 10 shown in FIG. 1 may be manufactured by adapting similar process as that of the region R, so the detailed descriptions thereof are omitted herein. Although FIG. 11J illustrated that the die 300 faces downward to be electrically connected with the redistribution structure 100, the disclosure is not limited thereto. In some alternative embodiments, the die 300 may be arranged to face upward. Under this scenario, the die 300 is electrically connected to the redistribution structure 500.

Figure 12:
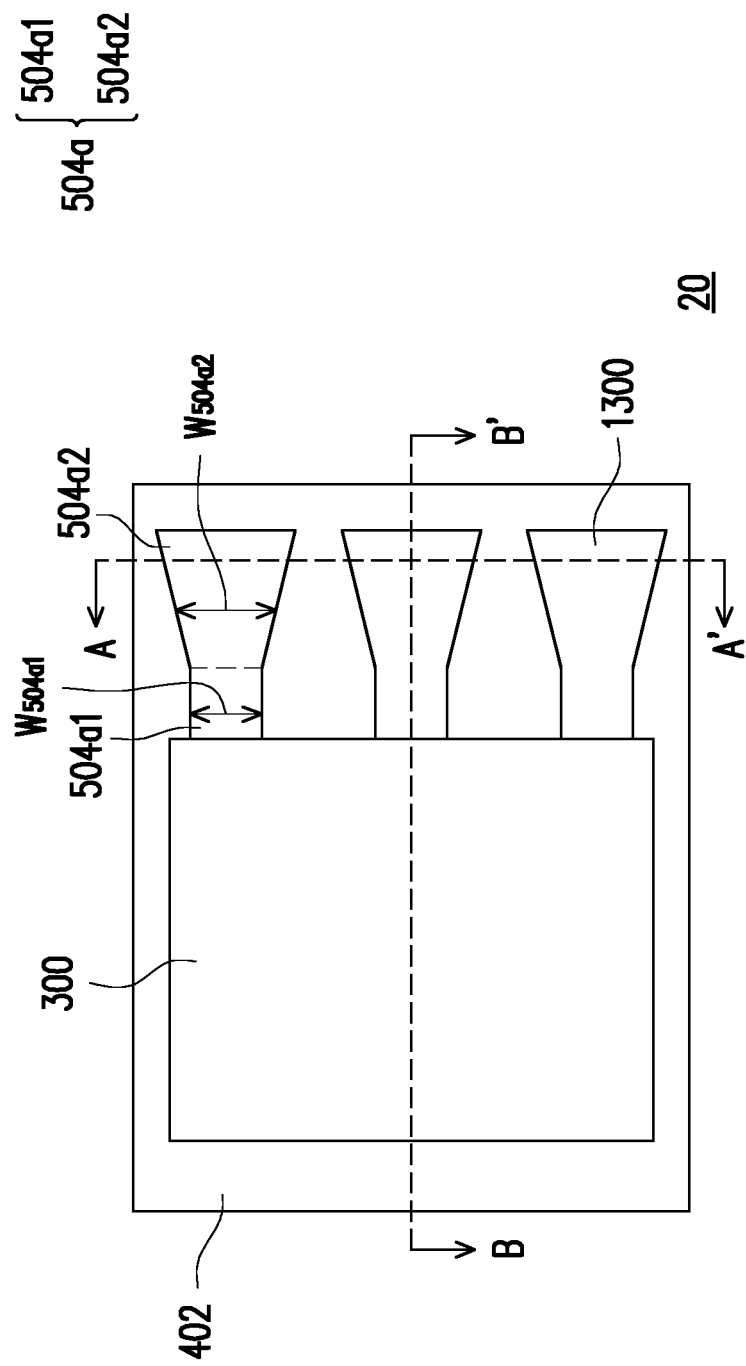
FIG. 12 is a schematic top view illustrating an InFO package in accordance with some alternative embodiments of the disclosure.
Figure 14A:
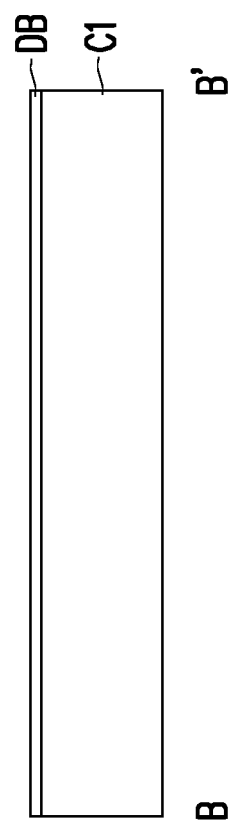

FIG. 12 is a schematic top view illustrating an InFO package 20 in accordance with some alternative embodiments of the disclosure. Referring to FIG. 12, the manufacturing process of the InFO package 20 will be described below in conjunction with FIG. 13A to FIG. 13G and FIG. 14A to FIG. 14G.

Figure 13A:
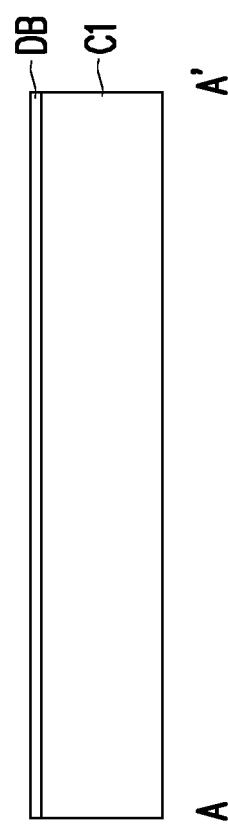

FIG. 13A to FIG. 13G are schematic cross-sectional views illustrating a manufacturing process of the InFO package 20 in FIG. 12 along line A-A'. FIG. 14A to FIG. 14G are schematic cross-sectional views illustrating a manufacturing process of the InFO package 20 in FIG. 12 along line B-B'. Referring to FIG. 13A and FIG. 13B, a carrier C1 having a de-bonding layer formed thereon is provided. The carrier C1 and the de-bonding layer DB in FIG. 13A and FIG. 14A may be similar to the carrier C1 and the de-bonding layer DB in FIG. 3A, so the detailed descriptions thereof is omitted herein.

Referring to FIG. 13B and FIG. 14B, a redistribution structure 100 and a plurality of conductive structures 202 are formed over the de-bonding layer DB. The method of forming the redistribution structure 100 in FIG. 13B and FIG. 14B may be similar to that of the redistribution structure 100 in FIG. 3B, so the detailed descriptions thereof are omitted herein. In some embodiments, the redistribution structure 100 includes a plurality of dielectric layers 102, a plurality of first redistribution circuit patterns 104a, a plurality of second redistribution circuit patterns 104b, and a plurality of conductive vias 106. In some embodiments, the first redistribution circuit patterns 104a and the second redistribution circuit patterns 104b are sandwiched between two adjacent dielectric layers 102. On the other hand, the conductive vias 106 are embedded in the dielectric layer 102. In some embodiments, a material of the dielectric layer 102 includes polyimide, epoxy resin, acrylic resin, phenol resin, BCB, PBO, or any other suitable polymer-based dielectric material. On the other hand, a material of the first redistribution circuit patterns 104a, the second redistribution circuit patterns 104b, and the conductive vias 106 includes aluminum, titanium, copper, nickel, tungsten, and/or alloys thereof.

It should be noted that the number of layers of the dielectric layer 102 and the second redistribution circuit patterns 104b are not limited in this disclosure. In some alternative embodiments, the redistribution structure 100 may be constituted by more layers of the dielectric layer 102 and the second redistribution circuit patterns 104b than the illustration shown in FIG. 13B and FIG. 14B depending on the circuit design.

The conductive structures 202 are formed over the redistribution structure 100. The conductive structures 202 in FIG. 13B and FIG. 14B may be similar to the first conductive structures 200 in FIG. 3B, so the detailed descriptions thereof are omitted herein. In some embodiments, the conductive structures 202 are electrically connected to the redistribution structure 100.

Referring to FIG. 13C and FIG. 14C, a die 300 is picked and placed onto the redistribution structure 100. The die 300 in FIG. 13C and FIG. 14C may be similar to the die 300 in FIG. 3C, so the detailed descriptions thereof are omitted herein. In some embodiments, the die 300 is placed such that the conductive structures 202 are located on one side of the die 300. In some embodiments, the die 300 is attached (or adhered) on the redistribution structure 100 through an adhesive layer AD. In some embodiments, the adhesive layer AD may include a die attach film (DAF) or other materials having adhesion property.

Referring to FIG. 13D and FIG. 14D, an encapsulant 402 is formed over the redistribution structure 100. The method of forming the encapsulant 402 in FIG. 13D and FIG. 14D may be similar to that of the encapsulant 402 in FIG. 3D and FIG. 3E, so the detailed descriptions thereof are omitted herein. In some embodiments, the encapsulant 402 encapsulates sidewalls of the conductive structures 202 and sidewalls of the die 300. In other words, the die 300 and the conductive structures 202 are embedded in the encapsulant 402. In some embodiments, the conductive structures 202 penetrate through the encapsulant 402.

Referring to FIG. 13E and FIG. 14E, a redistribution structure 500 is formed on the conductive structures 202, the die 300, and the encapsulant 402. The method of forming the redistribution structure 500 in FIG. 13E and FIG. 14E may be similar to that of the redistribution structure 500 in FIG. 3F, so the detailed descriptions thereof are omitted herein. In some embodiments, the redistribution structure 500 includes a plurality of dielectric layers 502, a plurality of first redistribution circuit patterns 504a, a plurality of second redistribution circuit patterns 504b, and a plurality of conductive vias 506. In some embodiments, the first redistribution circuit patterns 504a and the second redistribution circuit patterns 504b are sandwiched between two adjacent dielectric layers 502. On the other hand, the conductive vias 506 are embedded in the dielectric layer 502. In some embodiments, a material of the dielectric layer 502 includes polyimide, epoxy resin, acrylic resin, phenol resin, BCB, PBO, or any other suitable polymer-based dielectric material. On the other hand, a material of the first redistribution circuit patterns 504a, the second redistribution circuit patterns 504b, and the conductive vias 506 includes aluminum, titanium, copper, nickel, tungsten, and/or alloys thereof. In some embodiments, the redistribution structure 100 or the redistribution structure 500 may further include a ground plane (not shown).

It should be noted that the number of layers of the dielectric layer 102 and the second redistribution circuit patterns 504b are not limited in this disclosure. In some alternative embodiments, the redistribution structure 500 may be constituted by more layers of the dielectric layer 102 and the second redistribution circuit patterns 504b than the illustration shown in FIG. 13E and FIG. 14E depending on the circuit design.

In some embodiments, the conductive structures 202 are electrically connected to the first redistribution circuit patterns 104a and the first redistribution circuit patterns 504a respectively through the conductive vias 106 and the conductive vias 506. For example, as illustrated in FIG. 13E, a pair of conductive structures 202 are connected to a same first redistribution circuit pattern 104a directly underneath the pair of conductive structures 202. Similarly, the pair of conductive structures 202 are connected to a same second redistribution circuit pattern 504a directly above the pair of conductive structures 202. In some embodiments, the pair of conductive structures 202 and the corresponding first redistribution circuit patterns 104a, 504a are connected to each other to form an enclosure, thereby constituting a horn antenna 1300. In some embodiments, the first redistribution circuit patterns 504a may be referred to as a top wall of the horn antenna 1300, the first redistribution circuit patterns 104a may be referred to as a bottom wall of the horn antenna 1300, and the pair of conductive structures 202 may be referred to as sidewalls of the horn antenna 1300. In other words, the top wall of the horn antenna 1300 is embedded in the redistribution structure 500, the bottom wall of the horn antenna 1300 is embedded in the redistribution structure 100, and the sidewalls of the horn antenna 1300 penetrate through the encapsulant 402 to connect the top wall and the bottom wall.

Referring to FIGS. 12, 13E, and 14E, the horn antenna 1300 is formed adjacent to the die 300. In some embodiments, the horn antenna 1300 are disposed on one side of the die 300. However, the disclosure is not limited thereto. In some alternative embodiments, the horn antenna 1300 may be disposed on two sides, three sides, or all four sides of the die 300. In some embodiments, the first redistribution circuit pattern 504a extends over the active surface 300a of the die to electrically connect the horn antenna 1300 and the die 300. For example, the first redistribution circuit patterns 504a (top wall of the horn antenna 1300) may extend over the active surface 300a of the die 300 to be electrically connected with the conductive posts 312 of the die 300. In some embodiments, the signal originated from the die 300 may be transmitted to the horn antenna 1300 through the first redistribution circuit patterns 504a. Therefore, the first redistribution circuit patterns 504a may be referred to as a feed line in some embodiments. It should be noted that although FIG. 14E illustrated that the die 300 is placed in a face up manner, the disclosure is not limited thereto. In some alternative embodiments, the die 300 may be placed in a face down manner. Under this scenario, the first redistribution circuit patterns 104a (bottom wall of the horn antenna 1300) may extend over the active surface 300a of the die 300 to electrically connect the horn antenna 1300 and the die 300.

In some embodiments, a shape of the top wall (the first redistribution circuit patterns 504a) may be identical to a shape of the bottom wall (the first redistribution circuit patterns 104a). In some embodiments, the top wall (the first redistribution circuit patterns 504a) may be parallel to the bottom wall (the first redistribution circuit patterns 104a). For example, an extending direction of the top wall and an extending direction of the bottom wall may both parallel to the active surface 300a of the die. Moreover, as illustrated in FIG. 13E and FIG. 14E, the location of the top wall (the first redistribution circuit patterns 504a) corresponds to the location of the bottom wall (the first redistribution circuit patterns 104a). For example, a vertical projection of the first redistribution circuit patterns 504a along a direction perpendicular to the active surface 300a of the die 300 may completely overlap with the first redistribution circuit patterns 104a.

As illustrated in FIG. 12, the sidewalls (the conductive structures 202) of the horn antenna 1300 are not parallel to each other to form a horn-shaped enclosure with the paralleled top and bottom walls. For example, the first redistribution circuit patterns 504a (the top wall of the horn antenna 1300) may include a first portion 504a1 and a second portion 504a2. The first portion 504a1 is closer to the die 300 than the second portion 504a2. In some embodiments, a width $W_{504a1}$ of the first portion 504a1 is smaller than a width $W_{504a2}$ of the second portion 504a2. In some embodiments, the first portion 504a1 may have a uniform width $W_{540a1}$ while the second portion 504a2 may have a non-uniform width $W_{504a2}$. As mentioned above, the shape of the first redistribution circuit patterns 504a and the shape of the first redistribution circuit patterns 104a may be identical. As such, it is understood that the width relationship of the first redistribution circuit patterns 504a presented above may also apply to the first redistribution circuit patterns 104a.

Referring to FIG. 13F and FIG. 14F, a plurality of openings OP is formed in the outermost dielectric layer 502 of the redistribution structure 500. In some embodiments, the openings OP are formed by a laser drilling process, a mechanical drilling process, a photolithography process and an etching process, or other suitable processes. As illustrated in FIG. 13F and FIG. 14F, the openings OP expose the outermost second redistribution circuit patterns 504b of the redistribution structure 500. Subsequently, a plurality of conductive terminals 900 is formed over the redistribution structure 500 opposite to the die 300. In some embodiments, the conductive terminals 900 extend into the openings OP to electrically connect with the outermost second redistribution circuit pattern 504b. In some embodiments, a plurality of UBM patterns (not shown) may be formed on the outermost dielectric layer 502 and in the openings OP. The conductive terminals 900 may be disposed over the UBM patterns. In some embodiments, the conductive terminals 900 are attached to the UBM patterns through a solder flux. In some embodiments, the conductive terminals 900 are, for example, solder balls. In some embodiments, the conductive terminals 900 may be disposed on the redistribution structure 500 through a ball placement process and/or a reflowing process.

Referring to FIG. 13G and FIG. 14G, the structure illustrated in FIG. 13F and FIG. 14F are flipped upside down. The carrier C1 and the de-bonding layer DB are removed to obtain the InFO package 20. In some embodiments, the de-bonding layer DB (e.g., the LTHC release layer) may be irradiated by an UV laser such that the carrier C1 and the de-bonding layer DB may be peeled off from the dielectric layer 102 of the redistribution structure 100. However, the de-bonding process is not limited thereto. Other suitable de-carrier methods may be used in some alternative embodiments.

Figure 15:
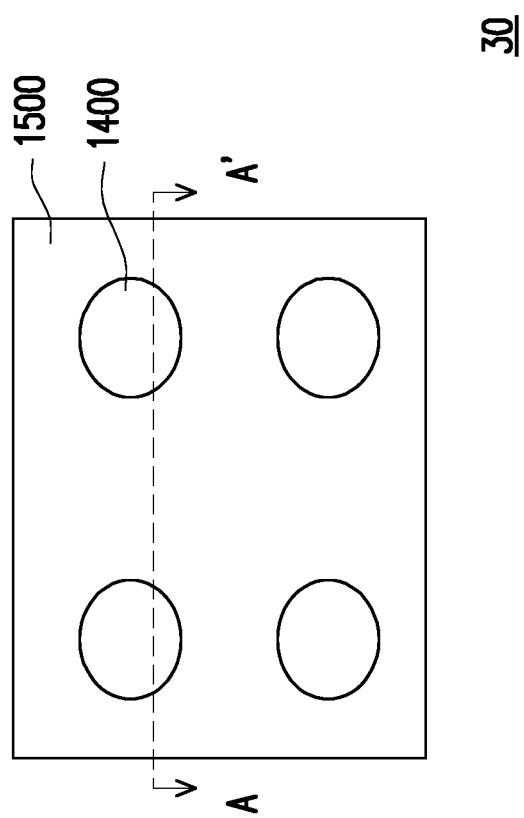
FIG. 15 is a schematic top view illustrating an InFO package in accordance with some alternative embodiments of the disclosure.

FIG. 15 is a schematic top view illustrating an InFO package 30 in accordance with some alternative embodiments of the disclosure. Referring to FIG. 15, the manufacturing process of the InFO package 30 will be described below in conjunction with FIG. 16A to FIG. 16I.

Figure 16C:
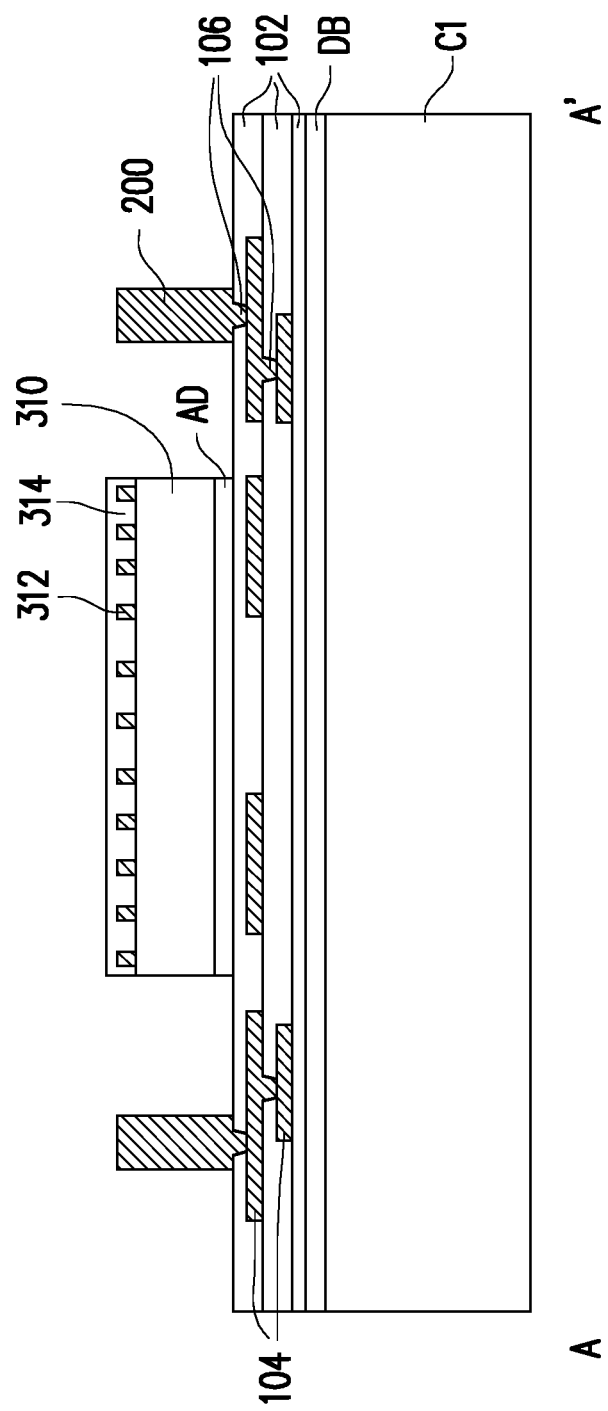
Figure 16D:
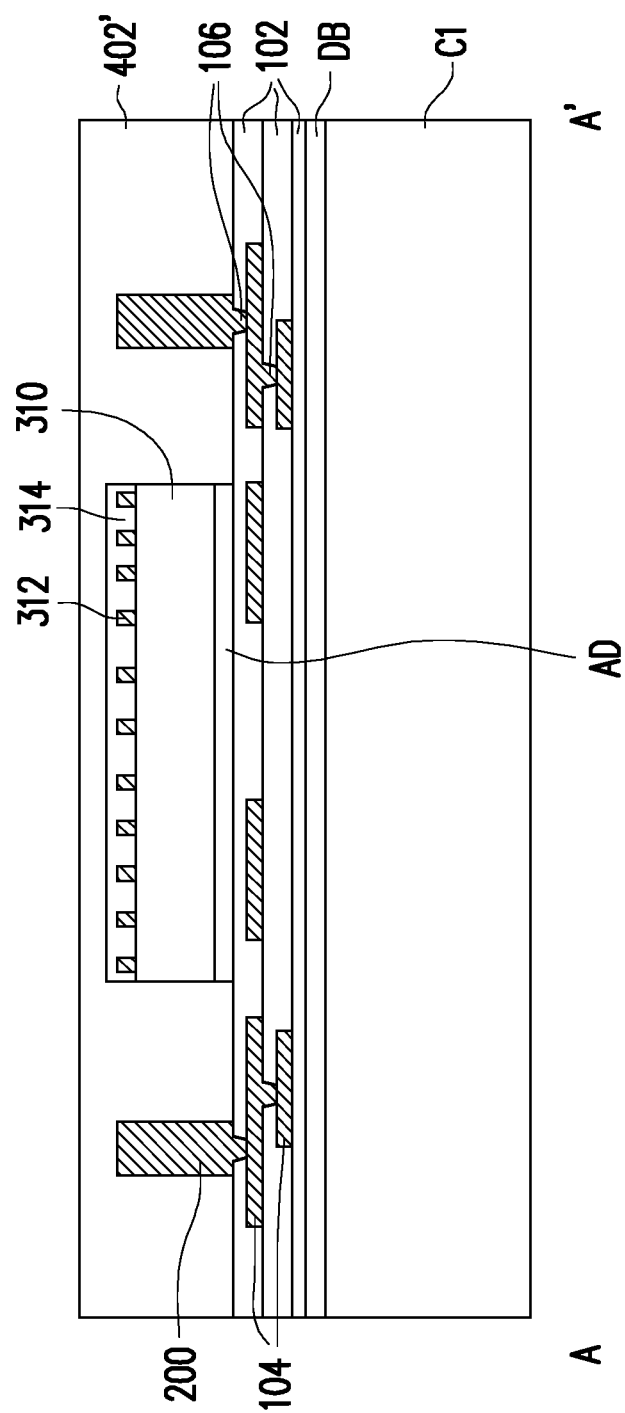
Figure 16E:
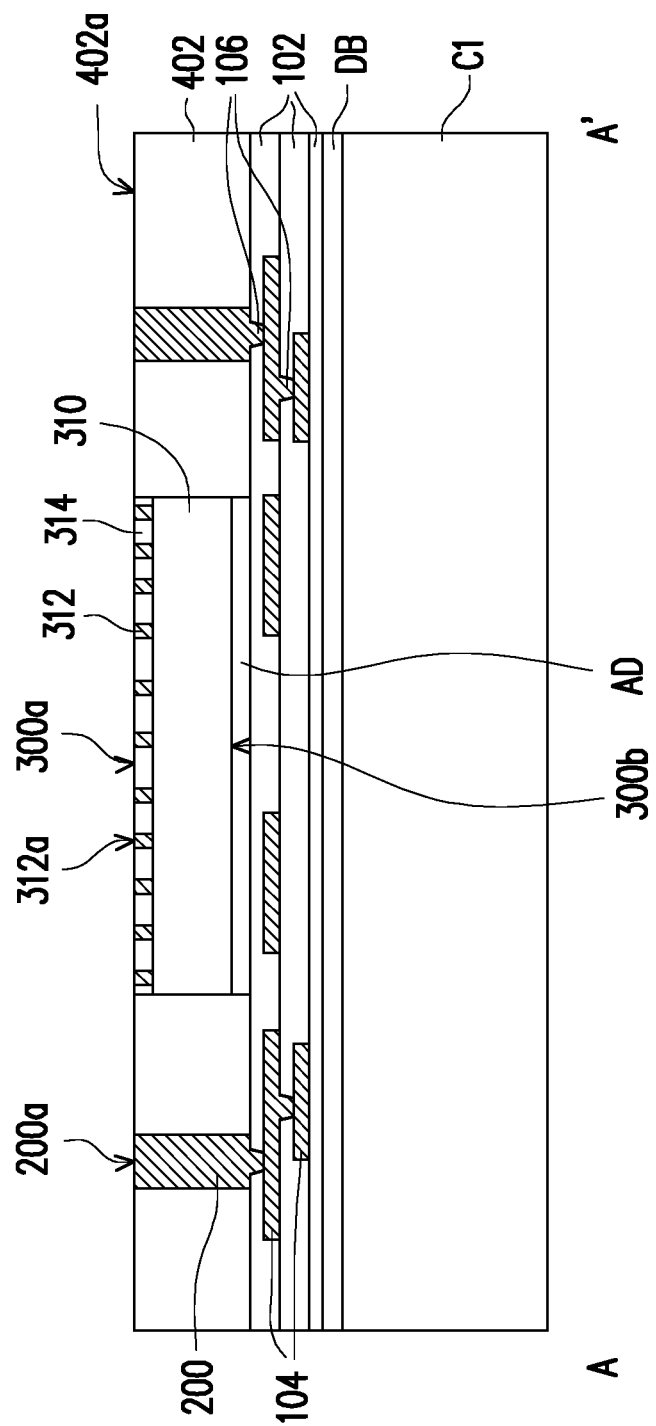
Figure 16F:
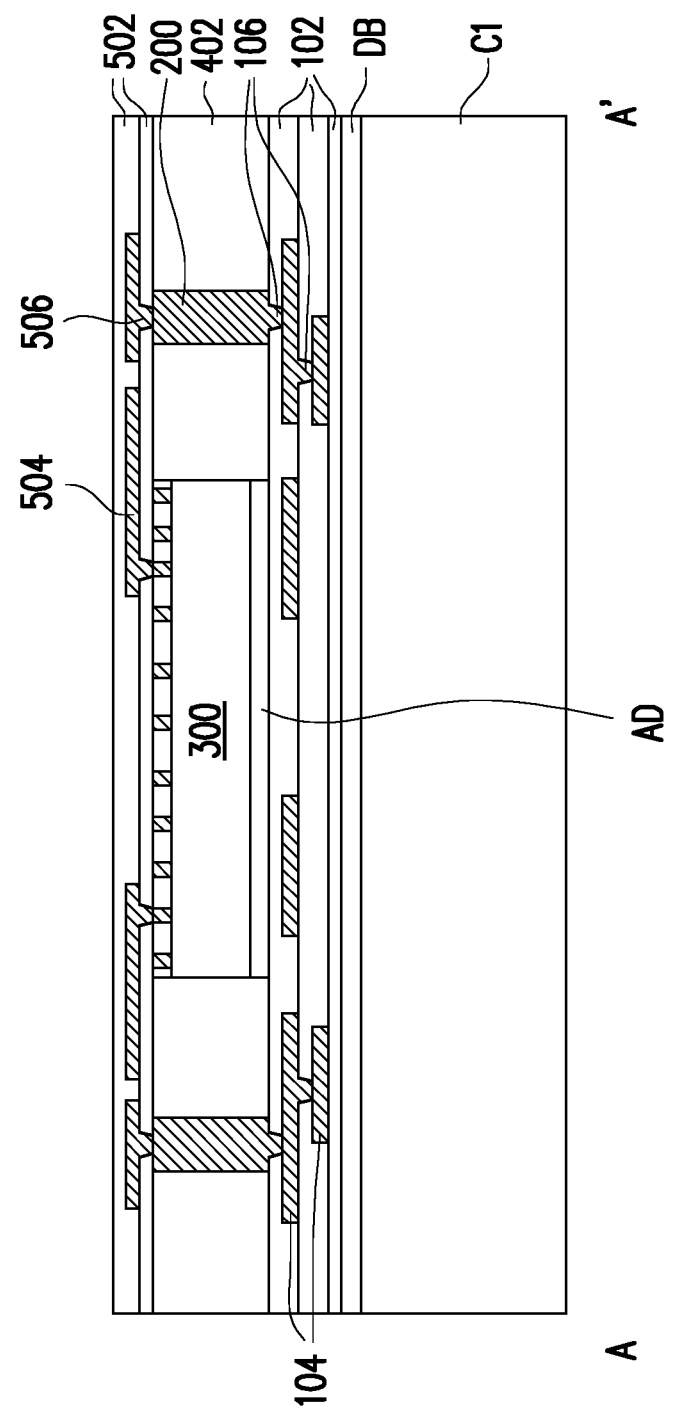

FIG. 16A to FIG. 16I are schematic cross-sectional views illustrating a manufacturing process of the InFO package in FIG. 15 along line A-A'. Referring to FIG. 16A to FIG. 16E, the steps illustrated in FIG. 16A to FIG. 16E are similar to the steps shown in FIG. 3A to FIG. 3E, so similar elements are denoted by the same reference numeral and the detailed descriptions thereof are omitted herein. Referring to FIG. 16F, a redistribution structure 500 is formed over the conductive structures 200, the die 300, and the encapsulant 402. The method of forming the redistribution structure 500 in FIG. 16F may be similar to that of the redistribution structure 500 in FIG. 3F, so the detailed descriptions thereof are omitted herein. In some embodiments, the redistribution structure 500 includes a plurality of dielectric layers 502, a plurality of redistribution circuit patterns 504, and a plurality of conductive vias 506. In some embodiments, the redistribution circuit patterns 504 are sandwiched between two adjacent dielectric layers 502. On the other hand, the conductive vias 506 are embedded in the dielectric layer 502. In some embodiments, the redistribution circuit patterns 504 are electrically connected to the conductive structures 200 and the die 300 through the conductive vias 506. As illustrated in FIG. 16F, the redistribution circuit patterns 504 are covered by the dielectric layer 502 and are not revealed. In some embodiments, a material of the dielectric layer 502 includes polyimide, epoxy resin, acrylic resin, phenol resin, BCB, PBO, or any other suitable polymer-based dielectric material. On the other hand, a material of the redistribution circuit patterns 504 and the conductive vias 506 includes aluminum, titanium, copper, nickel, tungsten, and/or alloys thereof.

Figure 16G:
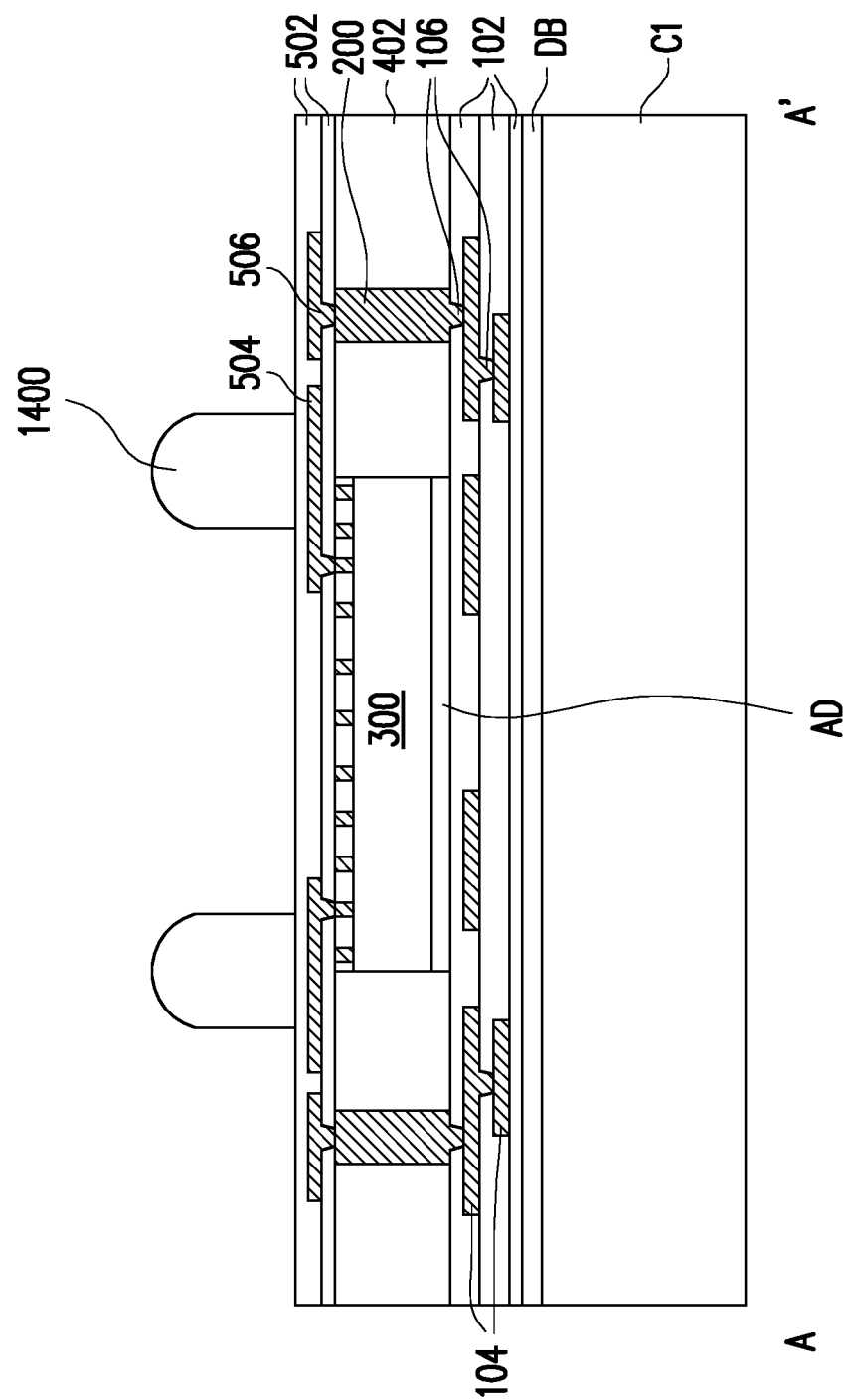

Referring to FIG. 16G, a plurality of dielectric lens 1400 are placed over the redistribution structure 500. In some embodiments, the dielectric lenses 1400 are disposed on the redistribution structure 500 through a pick-and-place process. In some embodiments, a material of the dielectric lenses 1400 has a low Df and/or a Dk. Depending on the frequency range of high-speed applications, suitable material may be selected based on the required electrical properties of the subsequently formed InFO package 30. For example, the material of the dielectric lenses 1400 may include polymer, the like, or a combination thereof. In some embodiments, a top surface of the each dielectric lens 1400 has a curvature to function as a lens. In some embodiments, the dielectric lenses 1400 are placed directly above the redistribution circuit patterns 504 that is electrically connected to the die 300.

In some embodiments, the dielectric lenses 1400 may be referred to as dielectric antennas. For example, the signal originated from the die 300 may be transmitted to the redistribution circuit patterns 504 connected to the die 300. Then, the dielectric lenses 1400 placed directly above the redistribution circuit patterns 504 may be configured to receive the signal emitted from the redistribution circuit patterns 504. Since the dielectric lenses 1400 have curved top surfaces, the signal emitted from the redistribution circuit patterns 504 may be focused by the lens nature of the dielectric lenses 1400. As such, the signal strength may be ensured, thereby enhancing the signal transmission reliability.

Figure 16H:
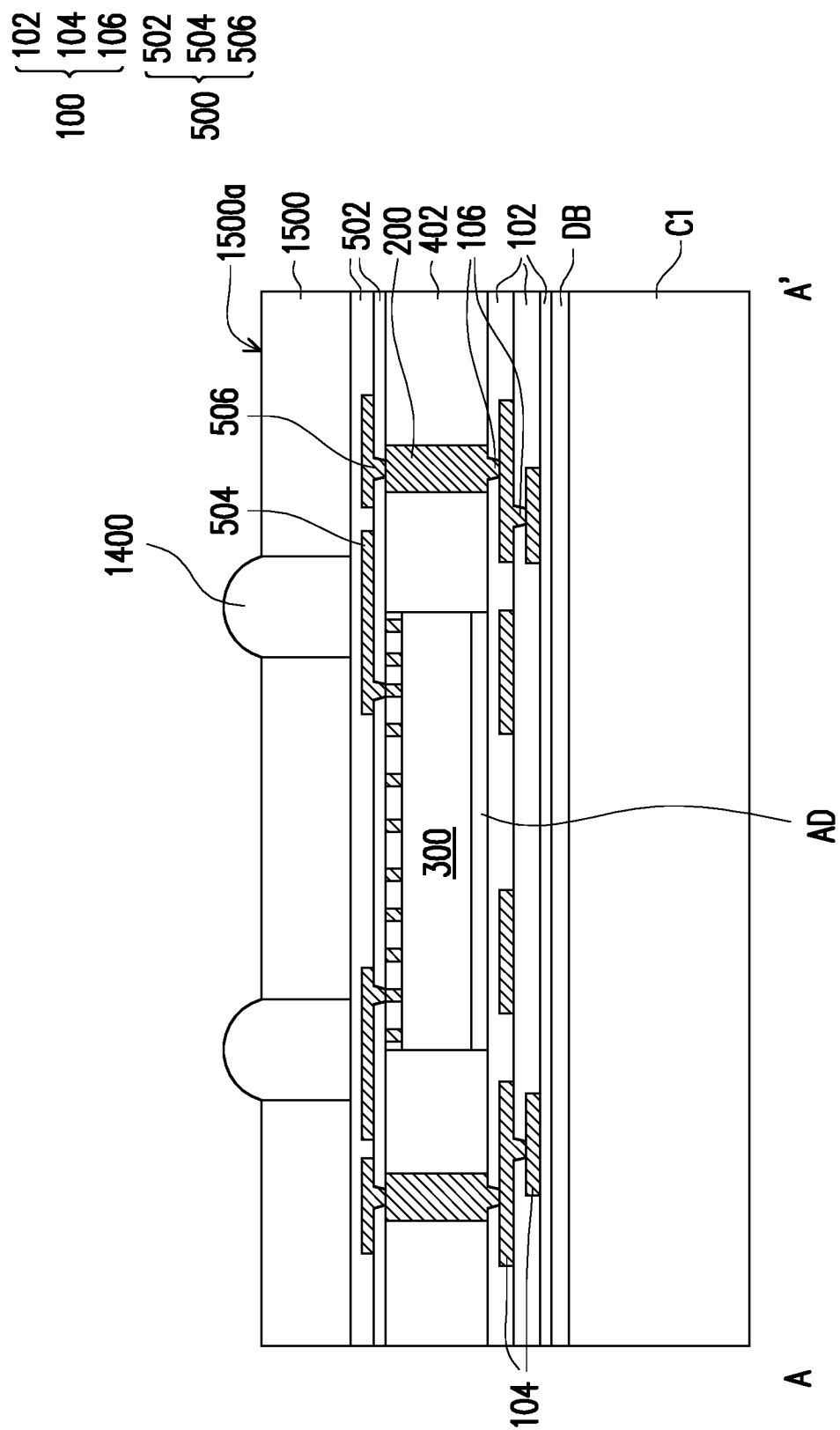

Referring to FIG. 16H, an insulating layer 1500 is formed on the redistribution structure 500. In some embodiments, a material of the insulating layer 1500 has a low Df and/or a low Dk. For example, the insulating layer 1500 may include polymer, the like, or a combination thereof. However, the disclosure is not limited thereto. In some alternative embodiments, the material of the insulating layer 1500 may not have a low Df and/or a low Dk. For example, the insulating layer 1500 may include a molding compound, a molding underfill, a resin (such as epoxy), or the like. In some embodiments, the insulating layer 1500 may be formed by a molding process. For example, the insulating layer 500 may be formed by the following steps. First, a mold chase (not shown) having a release film (not shown) attached thereon may be provided over the redistribution structure 500 and the dielectric lenses 1400. The release film may be directly in contact with the dielectric lenses 1400. Then, an insulating material (not shown) may be filled into the gap between the release film and the redistribution structure 500. Thereafter, the insulating material is cured to form the insulating layer 1500. Subsequently, the release film is detached from the insulating layer 1500 and the dielectric lenses 1400.

As illustrated in FIG. 16H, the insulating layer 1500 laterally wraps around the dielectric lenses 1400. In some embodiments, the dielectric lenses 1400 protrude from a top surface 1500*a* of the insulating layer 1500. For example, the curved top surfaces of the dielectric lenses 1400 may protrude above the top surface 1500*a* of the insulating layer 1500. In other words, the dielectric lenses 1400 are partially embedded in the insulating layer 1500.

Figure 16I:
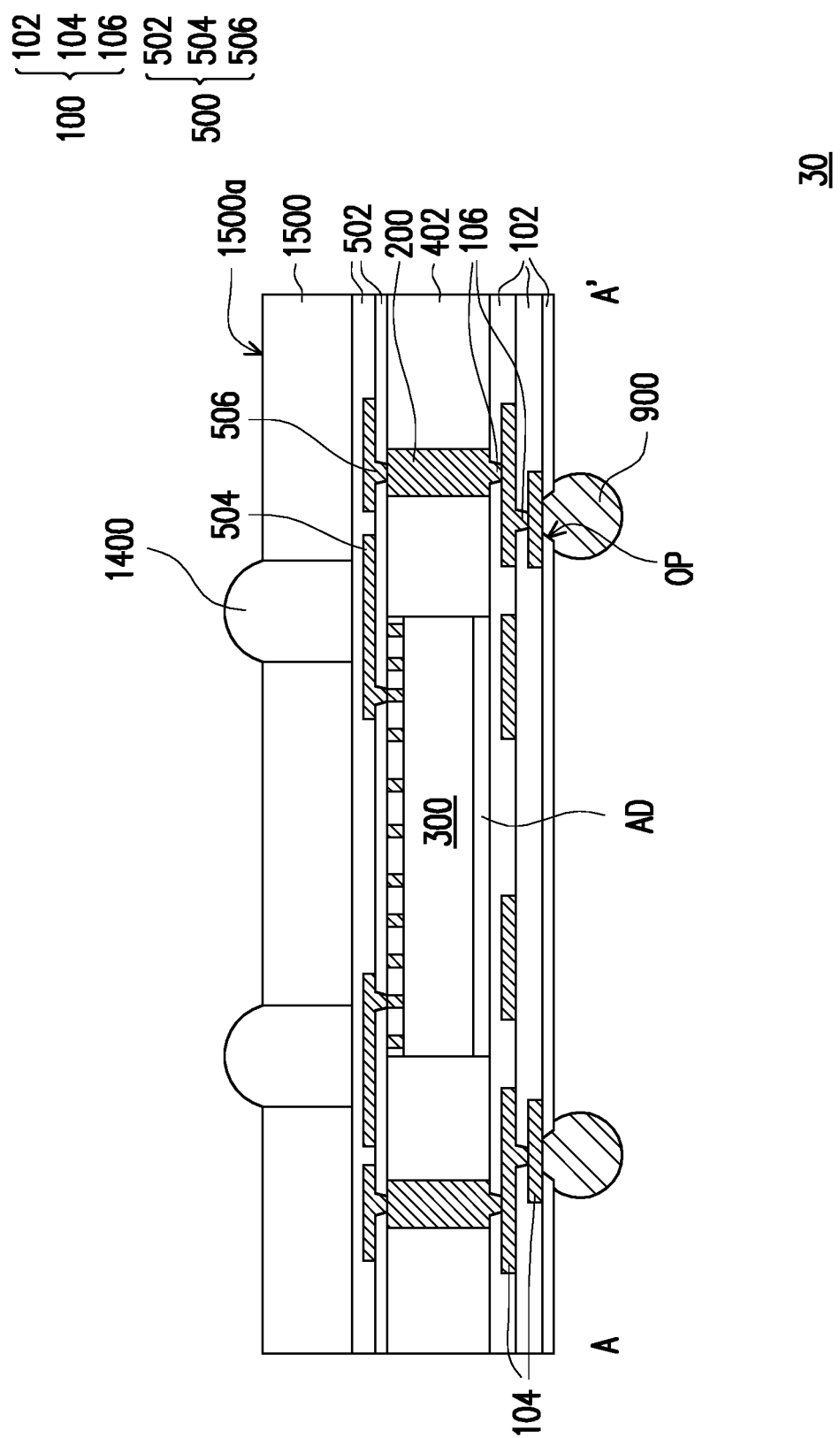

Referring to FIG. 16I, the carrier C1 and the de-bonding layer DB are removed. In some embodiments, the de-bonding layer DB (e.g., the LTHC release layer) may be irradiated by an UV laser such that the carrier C1 and the de-bonding layer DB may be peeled off from the dielectric layer 102 of the redistribution structure 100. However, the de-bonding process is not limited thereto. Other suitable de-carrier methods may be used in some alternative embodiments. Thereafter, a plurality of openings OP is formed in the outermost dielectric layer 102 of the redistribution structure 100. In some embodiments, the openings OP are formed by a laser drilling process, a mechanical drilling process, a photolithography process and an etching process, or other suitable processes. As illustrated in FIG. 16I, the openings OP expose the outermost redistribution circuit patterns 104 of the redistribution structure 100. Subsequently, a plurality of conductive terminals 900 is formed over the redistribution structure 100 opposite to the die 300 to obtain the InFO package 30. In some embodiments, the conductive terminals 900 extend into the openings OP to electrically connect with the outermost redistribution circuit pattern 104. In some embodiments, a plurality of UBM patterns (not shown) may be formed on the outermost dielectric layer 102 and in the openings OP. The conductive terminals 900 may be disposed over the UBM patterns. In some embodiments, the conductive terminals 900 are attached to the UBM patterns through a solder flux. In some embodiments, the conductive terminals 900 are, for example, solder balls. In some embodiments, the conductive terminals 900 may be disposed on the redistribution structure 100 through a ball placement process and/or a reflowing process.

In accordance with some embodiments of the disclosure, an integrated fan-out (InFO) package includes a first redistribution structure, a plurality of dies, a plurality of first conductive structures, an encapsulant, a second redistribution structure, an insulating layer, a plurality of second conductive structures, an antenna confinement structure, and a slot antenna. The dies and the first conductive structures are disposed on the first redistribution structure. The first conductive structures surround the die. The encapsulant encapsulates the dies and the first conductive structures. The second redistribution structure is disposed on the dies, the first conductive structures, and the encapsulant. The insulating layer is over the second redistribution structure. The second conductive structures and the antenna confinement structure are embedded in the insulating layer. The slot antenna is disposed on the insulating layer.

In accordance with some alternative embodiments of the disclosure, an integrated fan-out (InFO) package includes a first redistribution structure, a die, an encapsulant, a second redistribution structure, and a horn antenna. The die is disposed on the first redistribution structure. The encapsulant encapsulates the die. The second redistribution structure is disposed on the die and the encapsulant. The horn antenna is adjacent to the die. The horn antenna includes a top wall, a bottom wall opposite to the top wall, and a pair of sidewalls connecting the top wall and the bottom wall. The bottom wall is embedded in the first redistribution structure, the top wall is embedded in the second redistribution structure, and the pair of sidewalls penetrates through the encapsulant. One of the top wall and the bottom wall extends above an active surface of the die to electrically connect the horn antenna and the die.

In accordance with some alternative embodiments of the disclosure, an integrated fan-out (InFO) package includes a first redistribution structure, a die, a plurality of conductive structures, an encapsulant, a second redistribution structure, an insulating layer, and a plurality of dielectric lenses. The die is disposed on the first redistribution structure. The conductive structures are disposed on the first redistribution structure and surround the die. The encapsulant encapsulates the die and the conductive structures. The second redistribution structure is disposed on the die, the encapsulant, and the conductive structures. The insulating layer is disposed on the second redistribution structure. The dielectric lenses are embedded in the insulating layer.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. An integrated fan-out (InFO) package, comprising:
a first redistribution structure;
a plurality of dies and a plurality of first conductive structures disposed on the first redistribution structure, wherein the plurality of first conductive structures surrounds the plurality of dies;
an encapsulant encapsulating the plurality of dies and the plurality of first conductive structures;
a second redistribution structure disposed on the plurality of dies, the plurality of first conductive structures, and the encapsulant;
an insulating layer over the second redistribution structure;
a plurality of second conductive structures and an antenna confinement structure embedded in the insulating layer; and
a slot antenna disposed on the insulating layer.

2. The InFO package according to claim 1, wherein the antenna confinement structure comprises a ring structure surrounding the plurality of second conductive structures.

3. The InFO package according to claim 1, wherein the antenna confinement structure comprises a plurality of antenna confinement patterns separated from each other, wherein the plurality of antenna confinement patterns surrounds the plurality of second conductive structures.

4. The InFO package according to claim 1, wherein the antenna confinement structure is electrically grounded.

5. The InFO package according to claim 1, further comprising a protection layer disposed on the insulating layer, wherein the slot antenna is embedded in the protection layer.

6. The InFO package according to claim 1, wherein the second redistribution structure comprises at least one dielectric layer, and a material of the at least one dielectric layer is different from a material of the insulating layer.

7. The InFO package according to claim 1, wherein the second redistribution structure comprises at least one dielectric layer, and a material of the at least one dielectric layer is the same as a material of the insulating layer.

8. The InFO package according to claim 1, further comprising:
a first auxiliary insulating layer disposed over the slot antenna;
a plurality of first conductive patterns embedded in the first auxiliary insulating layer;
a second auxiliary insulating layer disposed on the first auxiliary insulating layer; and
a plurality of second conductive patterns disposed on the second auxiliary insulating layer, wherein the plurality of first conductive patterns and the plurality of second conductive patterns are arranged periodically to form metamaterial lenses.

9. The InFO package according to claim 1, further comprising a plurality of conductive terminals disposed on the first redistribution structure opposite to the plurality of dies.

10. The InFO package according to claim 1, wherein a height of the plurality of second conductive structures ranges between 30 µm and 50 µm.

11. An integrated fan-out (InFO) package, comprising:
a first redistribution structure;
a die disposed on the first redistribution structure;
an encapsulant encapsulating the die;
a second redistribution structure disposed on the die and the encapsulant; and
a horn antenna adjacent to the die, wherein the horn antenna comprises a top wall, a bottom wall opposite to the top wall, and a pair of sidewalls connecting the top wall and the bottom wall, the bottom wall is embedded in the first redistribution structure, the top wall is embedded in the second redistribution structure, the pair of sidewalls penetrates through the encapsulant, and one of the top wall and the bottom wall extends above an active surface of the die to electrically connect the horn antenna and the die.

12. The InFO package according to claim 11, further comprising a plurality of conductive terminals disposed on the second redistribution structure opposite to the die.

13. The InFO package according to claim 11, wherein the top wall and the bottom wall are parallel to each other.

14. The InFO package according to claim 11, wherein the sidewalls are not parallel to each other.

15. The InFO package according to claim 11, wherein a shape of the top wall is identical to a shape of the bottom wall.

16. The InFO package according to claim 11, wherein each of the top wall comprises a first portion and a second portion, the first portion is closer to the die than the second portion, and a width of the first portion is smaller than a width of the second portion.

17. An integrated fan-out (InFO) package, comprising:
a first redistribution structure;

a die disposed on the first redistribution structure;

a plurality of conductive structures disposed on the first redistribution structure, wherein the plurality of conducive structures surround the die;

an encapsulant encapsulating the die and the plurality of conductive structures;

a second redistribution structure disposed on the die, the encapsulant, and the plurality of conductive structures;

an insulating layer disposed on the second redistribution structure; and a plurality of dielectric lenses embedded in the insulating layer.

18. The InFO package according to claim 17, further comprising a plurality of conductive terminals disposed on the first redistribution structure opposite to the die.

19. The InFO package according to claim 17, wherein the plurality of dielectric lenses protrudes from a top surface of the insulating layer.

20. The InFO package according to claim 17, wherein the second redistribution structure comprises a plurality of redistribution circuit patterns electrically connected to the die, and the plurality of dielectric lenses is placed directly above the plurality of redistribution circuit patterns.

* * * * *